(12) United States Patent
Jiang

(10) Patent No.: US 10,672,763 B2
(45) Date of Patent: Jun. 2, 2020

(54) EPITAXIAL STRUCTURE OF GA-FACE GROUP III NITRIDE, ACTIVE DEVICE, AND METHOD FOR FABRICATING THE SAME

(71) Applicant: Chih-Shu Huang, Taipei (TW)

(72) Inventor: Wen-Jang Jiang, Hsinchu (TW)

(73) Assignee: Chih-Shu Huang, Taipei (TW)

( * ) Notice: Subject to any disclaimer, the term of this patent is extended or adjusted under 35 U.S.C. 154(b) by 0 days.

(21) Appl. No.: 15/622,286

(22) Filed: Jun. 14, 2017

(65) Prior Publication Data
US 2017/0358495 A1 Dec. 14, 2017

(30) Foreign Application Priority Data

Jun. 14, 2016 (TW) .............................. 105118481 A

(51) Int. Cl.
*H01L 29/778* (2006.01)
*H01L 27/085* (2006.01)
(Continued)

(52) U.S. Cl.
CPC ........ *H01L 27/085* (2013.01); *H01L 21/8252* (2013.01); *H01L 27/0605* (2013.01);
(Continued)

(58) Field of Classification Search
CPC ............. H01L 21/0254; H01L 21/8252; H01L 29/083; H01L 29/402; H01L 29/66212; H01L 29/7787; H01L 29/872; H01L 27/085; H01L 29/1066; H01L 29/42316; H01L 29/861; H01L 29/0684; H01L 29/7783; H01L 27/0605; H01L 27/0629; H01L 29/66462; H01L 29/205;
(Continued)

(56) References Cited

U.S. PATENT DOCUMENTS 9,954,087 B2 * 4/2018 Inoue .................... H01L 29/155
9,954,090 B1 * 4/2018 Brown ................ H01L 21/8252
(Continued)

FOREIGN PATENT DOCUMENTS

CN 1937246 A 3/2007
CN 1957474 A 5/2007
(Continued)

*Primary Examiner* — Benjamin Tzu-Hung Liu
(74) *Attorney, Agent, or Firm* — Rosenberg, Klein & Lee

(57) ABSTRACT

The present invention provides an epitaxial structure of Ga-face group III nitride, its active device, and the method for fabricating the same. The epitaxial structure of Ga-face AlGaN/GaN comprises a substrate, a Buffer layer (C-doped) on the substrate, an i-GaN (C-doped) layer on the Buffer layer (C-doped), an i-Al(y)GaN buffer layer on the i-GaN (C-doped) layer, an i-GaN channel layer on the i-Al(y)GaN buffer layer, and an i-Al(x)GaN layer on the i-GaN channel layer, where x=0.1~0.3 and y=0.05~0.75. By using the p-GaN inverted trapezoidal gate or anode structure in device design, the 2DEG in the epitaxial structure of Ga-face group III nitride below the p-GaN inverted trapezoidal structure will be depleted, and thus fabricating p-GaN gate enhancement-mode (E-mode) AlGaN/GaN high electron mobility transistors (HEMTs), p-GaN anode AlGaN/GaN Schottky barrier diodes (SBDs), or hybrid devices.

12 Claims, 72 Drawing Sheets

(51) Int. Cl.
    *H01L 29/10* (2006.01)
    *H01L 29/423* (2006.01)
    *H01L 29/861* (2006.01)
    *H01L 29/06* (2006.01)
    *H01L 21/8252* (2006.01)
    *H01L 29/205* (2006.01)
    *H01L 29/66* (2006.01)
    *H01L 29/872* (2006.01)
    *H01L 27/06* (2006.01)
    *H01L 29/40* (2006.01)
    *H01L 29/20* (2006.01)
    *H01L 27/088* (2006.01)
    *H01L 29/207* (2006.01)
    *H01L 29/417* (2006.01)

(52) U.S. Cl.
    CPC ...... H01L 27/0629 (2013.01); H01L 29/0684 (2013.01); H01L 29/1066 (2013.01); H01L 29/205 (2013.01); H01L 29/402 (2013.01); H01L 29/42316 (2013.01); H01L 29/66212 (2013.01); H01L 29/66462 (2013.01); H01L 29/7783 (2013.01); H01L 29/861 (2013.01); H01L 29/872 (2013.01); *H01L 27/0883* (2013.01); *H01L 29/2003* (2013.01); *H01L 29/207* (2013.01); *H01L 29/41766* (2013.01)

(58) Field of Classification Search
    CPC ............ H01L 29/41766; H01L 29/207; H01L 27/0883; H01L 29/2003; H01L 29/0603
    See application file for complete search history.

(56) References Cited

U.S. PATENT DOCUMENTS

| | | | |
|---|---|---|---|
| 9,960,262 B2* | 5/2018 | Schultz | H01L 29/7783 |
| 9,978,844 B2* | 5/2018 | Wong | H01L 29/66462 |
| 2006/0081897 A1* | 4/2006 | Yoshida | H01L 21/8252 257/289 |
| 2007/0228416 A1 | 10/2007 | Chen et al. | |
| 2010/0019279 A1 | 1/2010 | Chen et al. | |
| 2010/0330754 A1 | 12/2010 | Hebert | |
| 2011/0147726 A1 | 6/2011 | Yahagi | |
| 2014/0239346 A1 | 8/2014 | Green et al. | |
| 2015/0129894 A1* | 5/2015 | Kinoshita | H01L 29/6606 257/77 |
| 2016/0043178 A1* | 2/2016 | Liu | C30B 25/183 257/76 |
| 2016/0218204 A1* | 7/2016 | Pei | H01L 29/7786 |

FOREIGN PATENT DOCUMENTS

| | | | |
|---|---|---|---|
| CN | 102222690 A | | 10/2011 |
| CN | 102569390 A | | 7/2012 |
| CN | 102903738 A | | 1/2013 |
| CN | 103066103 A | | 4/2013 |
| CN | 103578986 A | | 2/2014 |
| CN | 103594509 A | | 2/2014 |
| CN | 105336769 | * | 2/2016 |
| TW | I277212 B | | 3/2007 |
| TW | I309088 B | | 4/2009 |
| TW | I523220 B | | 2/2016 |
| TW | I554530 B | | 10/2016 |

\* cited by examiner

Ga-Face P-GaN Gate AlGaN/GaN HEMT Structure

Ga-Face P-GaN Gate AlGaN/GaN HEMT Structure

EPITAXIAL STRUCTURE OF GA-FACE GROUP III NITRIDE, ACTIVE DEVICE, AND METHOD FOR FABRICATING THE SAME

FIELD OF THE INVENTION

The present invention relates generally to an epitaxial structure, and particularly to a novel epitaxial structure of Ga-face group III nitride series capable of blocking the electrons of buffer traps from entering the channel layer, and to the active device formed by using the epitaxial structure and the method for fabricating the same.

BACKGROUND OF THE INVENTION

According to the prior art, the most common structures to achieve an enhancement-mode AlGaN/GaN high electron mobility transistor (E-mode AlGaN/GaN HEMT) include: 1. Ga-face p-GaN gate E-mode HEMT structure, and 2. N-face Al(x)GaN gate E-mode HEMT structure. Nonetheless, as implied by their names, only the gate region will be p-GaN or Al(x)GaN.

The most common fabrication method is to use an AlGaN/GaN HEMT epitaxial structure capped with a p-GaN layer. The process starts by etching away p-GaN outside the p-GaN gate region using dry etching while maintaining the completeness of the thickness of the underlying AlGaN epitaxial layer. Because if the underlying AlGaN epitaxial layer is etched too much, two-dimensional electron gas (2DEG) will not be formed at the interface AlGaN/GaN of a Ga-face p-GaN gate E-mode HEMT structure. Thereby, the using dry etching is challenging because the etching depth is hard to control, plus nonuniformity in AlGaN thickness is also an uncontrollable variable.

Accordingly, to improve the above drawbacks, the present invention provides a novel epitaxial structure of Ga-face group III nitride, an active device formed by using the epitaxial structure, and the fabrication method for integration.

SUMMARY

An objective of the present invention is to provide a novel epitaxial structure of Ga-face group III nitride, an active device formed by using the epitaxial structure, and the fabrication method for integration for solving the process bottleneck encountered in the epitaxial structure of HEMTs. In addition, multiple types of high-voltage and high-speed active devices can be formed on the epitaxial structure on the same wafer of Ga-face group III nitride at the same time.

Another objective of the present invention is make the 2DEG in an epitaxial structure of Ga-face group III nitride under the p-GaN inverted trapezoidal structure become depleted by using a p-GaN inverted trapezoidal gate or anode structure. Thereby, p-GaN gate E-mode AlGaN/GaN HEMTs, p-GaN anode AlGaN/GaN Schottky barrier diodes (SBDs), or hybrid devices can be fabricated.

In order to achieve the above objectives, the present invention provides an epitaxial structure of Ga-face AlGaN/GaN, which comprises a substrate, a Buffer layer (C-doped) on the substrate, an i-GaN (C-doped) layer on the Buffer layer (C-doped), an i-Al(y)GaN buffer layer on the i-GaN (C-doped) layer, an i-GaN channel layer on the i-Al(y)GaN buffer layer, and an i-Al(x)GaN layer on the i-GaN channel layer, where x=0.1~0.3 and y=0.05~0.75.

By using the epitaxial structure of Ga-face AlGaN/GaN, the present invention further provides multiple types of transistors having a p-GaN inverted trapezoidal structure or SBD devices as well as the method for fabricating the same.

BRIEF DESCRIPTION OF THE DRAWINGS

FIG. 6A-1 and FIG. 6A-2 show cross-sectional views of the SEG p-GaN gate E-mode AlGaN/GaN HEMT according to the present invention;

FIG. 7D-1 and FIG. 7D-2 show schematic diagrams of forming device isolation in the SEG p-GaN gate E-mode AlGaN/GaN HEMT according to the present invention;

FIG. 7E-1 and FIG. 7E-2 show schematic diagrams of forming the metal gate electrode and the bonding pads and interconnection metals for drain and source in the SEG p-GaN gate E-mode AlGaN/GaN HEMT according to the present invention;

FIG. 8A-1 and FIG. 8A-2 show cross-sectional views of the SEG p-GaN anode AlGaN/GaN SBD according to the present invention;

FIG. 11A-1 and FIG. 11A-2 show cross-sectional views of the structure of the hybrid E-mode AlGaN/GaN HEMT according to the present invention;

FIGS. 12A to 12F-2 show schematic diagrams of the process steps for fabricating the structures in FIGS. 11A-1 and 11A-2 according to the present invention;

FIG. 13A-1 and FIG. 13A-2 show cross-sectional views of the structure of another hybrid E-mode AlGaN/GaN HEMT according to the present invention;

FIGS. 14A-1 to 14A-4 show schematic diagrams of the process steps for fabricating the structures in FIGS. 13A-1 and 13A-2 according to the present invention;

FIG. 16A-1 and FIG. 16A-2 is a cross-sectional view of the hybrid SBD according to the present invention;

FIG. 17A-1 and FIG. 17A-2 show another hybrid SBD according to the present invention;

FIG. 18A-1 and FIG. 18A-2 show cross-sectional views of the SEG p-GaN gate and self-aligned gate metal E-mode AlGaN/GaN HEMT according to the present invention;

FIGS. 19A to 19F-2 show cross-sectional views of the process steps for FIGS. 18A-1 and 18A-2;

FIG. 20A-1 and FIG. 20A-2 show cross-sectional views of the SEG p-GaN anode and self-aligned anode metal AlGaN/GaN SBD according to the present invention;

FIG. 21A-1 and FIG. 21A-2 show cross-sectional views of the hybrid E-mode AlGaN/GaN HEMT (SEG p-GaN gate and self-aligned gate metal AlGaN/GaN E-mode HEMT connected in series with an AlGaN/GaN D-mode HEMT without gate oxide) according to the present invention;

FIGS. 22A to 22G-2 show cross-sectional views of the process steps for FIGS. 21A-1 and 21A-2;

FIG. 23A-1 and FIG. 23A-2 show cross-sectional views of the hybrid E-mode AlGaN/GaN HEMT (SEG p-GaN gate and self-aligned gate metal AlGaN/GaN E-mode HEMT connected in series with an AlGaN/GaN D-mode HEMT with gate oxide) according to the present invention;

FIGS. 24A-1 to 24B-2 show cross-sectional views of the process steps for FIGS. 23A-1 and 23A-2;

FIG. 25A-1 and FIG. 25A-2 show cross-sectional views of the hybrid SBD (SEG p-GaN anode and self-aligned anode metal AlGaN/GaN SBD in series with the SEG p-GaN gate E-mode AlGaN/GaN HEMT) according to the present invention;

FIG. 26A-1 and FIG. 26A-2 show cross-sectional views of the hybrid SBD (Field plate structure AlGaN/GaN SBD in series with the SEG p-GaN gate E-mode AlGaN/GaN HEMT) according to the present invention.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
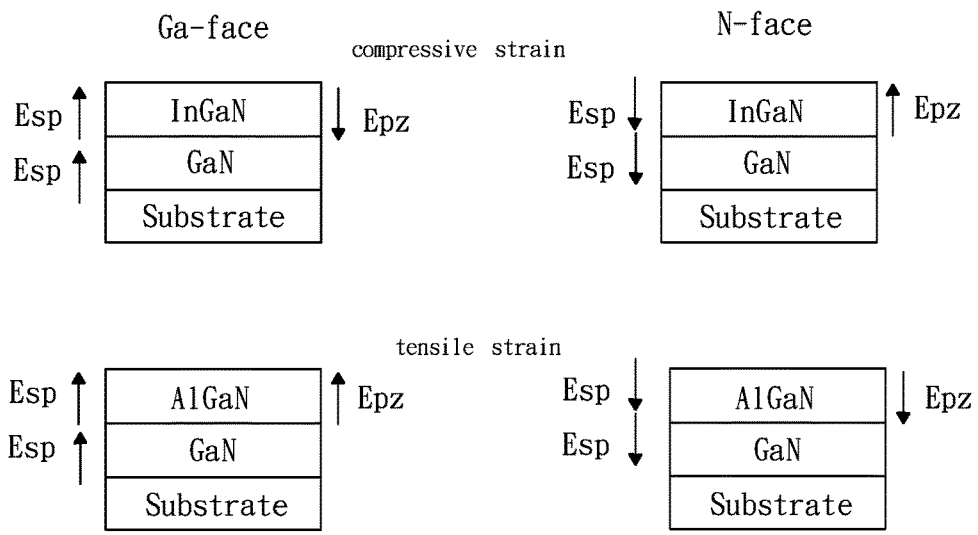
FIG. 1 shows distributions of $E_{PS}$ and $E_{PZ}$ in Ga-face and N-face AlGaN/GaN and GaN/InGaN systems in different strains.

FIG. 1 shows distributions of $E_{PS}$ and $E_{PZ}$ in Ga-face and N-face AlGaN/GaN and GaN/InGaN systems in different stains according to the present invention, where $E_{PS}$ is the spontaneous polarization (the polarization of the material) while $E_{PZ}$ is the piezoelectric polarization (the polarization formed by the piezoelectric effect of strain). Thereby, $E_{PS}$ is determined by the epitaxial layers while $E_{PZ}$ is determined by the piezoelectric effect of strain.

In the AlGaN/GaN system, the value of $E_{PZ}$ is negative when AlGaN is under tensile strain and is positive when AlGaN is under compressive strain. Contrarily, in the GaN/InGaN system, the signs for the values of $E_{PZ}$ are opposite. In addition, according to Reference [2], it is known that, firstly, in the AlGaN/GaN system, the polarization is determined by $E_{PS}$, and secondly, in the GaN/InGaN system, the polarization is determined by $E_{PZ}$.

Figure 2:
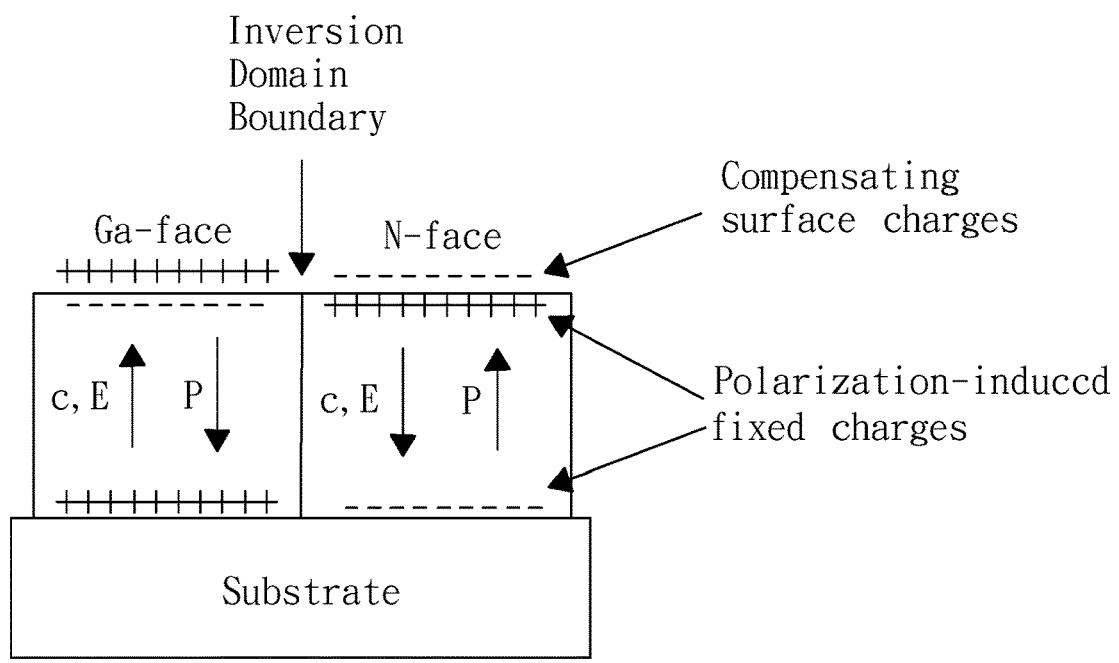
FIG. 2 shows a schematic diagram of Ga-face and N-face GaN grown on a substrate.

As shown in FIG. 2, P is spontaneous polarization and E is the corresponding electric field. In GaN, the Ga-face (N-face) polarization is determined when the Ga atom (N atom) layer of the Ga-N dual-layer faces the surface of epitaxy. As shown in the figure, a schematic diagram of Ga-face and N-face GaN grown on a substrate is illustrated. If it is Ga-face polarization, the internal electric field is away from the substrate and pointing to the surface. Thereby, the polarization is opposite to the direction of the internal electric field. Consequently, the polarization will cause negative charges to accumulate on the surface-and positive charges to accumulate at the junction with the substrate. On the contrary, if it is N-face polarization, the locations of charge accumulation are swapped and the direction of internal electric field is opposite.

Figure 3:
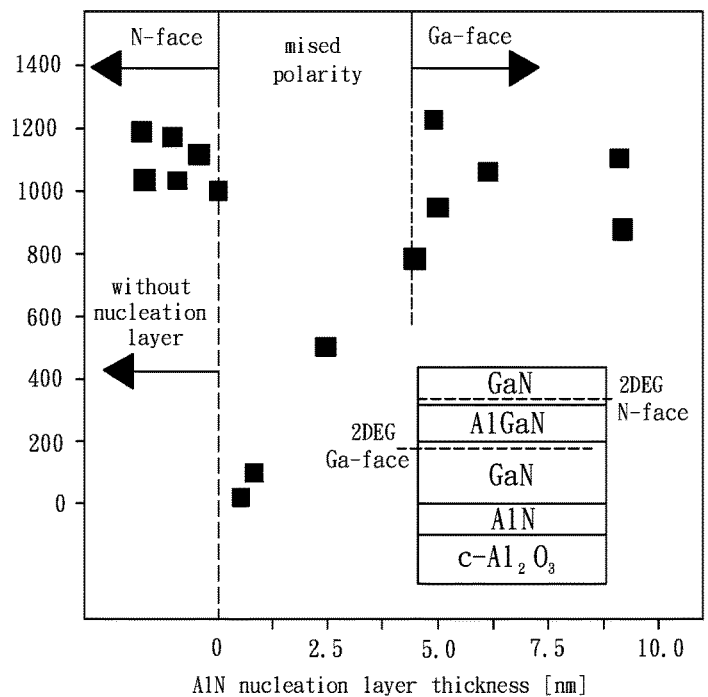
FIG. 3 shows a schematic diagram of the different locations of 2DEG generated at the junctions between AlGaN and GaN due to different polarization.

For an AlGaN/GaN HEMT, the most important thing is how the Ga- and N-face polarization influence the device characteristics. FIG. 3 shows a schematic diagram of the different locations of 2DEG generated at the junctions between AlGaN and GaN due to different polarization. In the Ga-face structure, 2DEG exists at the AlGaN/GaN interface while in the N-face structure, 2DEG exists at the GaN/AlGaN interface. The existence of 2DEG indicates accumulation of positive polarization charges at the interface and the 2DEG itself is just the accumulation of free electrons for compensating the polarization charges.

Figure 4A:
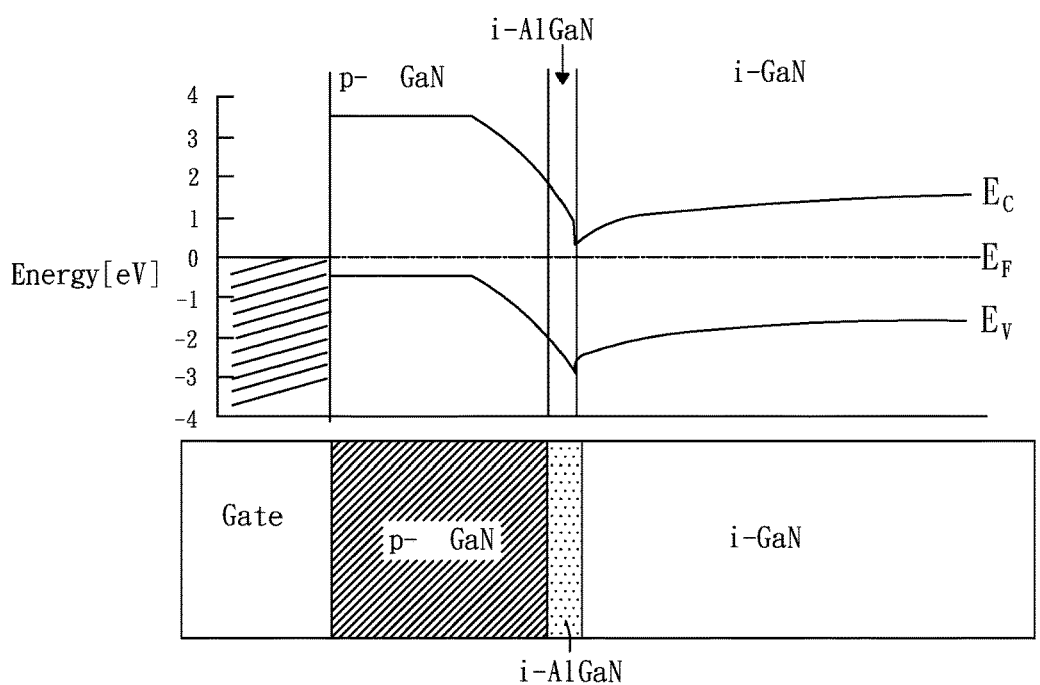
FIG. 4A shows a band diagram of a p-GaN layer grown on the epitaxial structure of AlGaN/GaN HEMT.
Figure 4B:
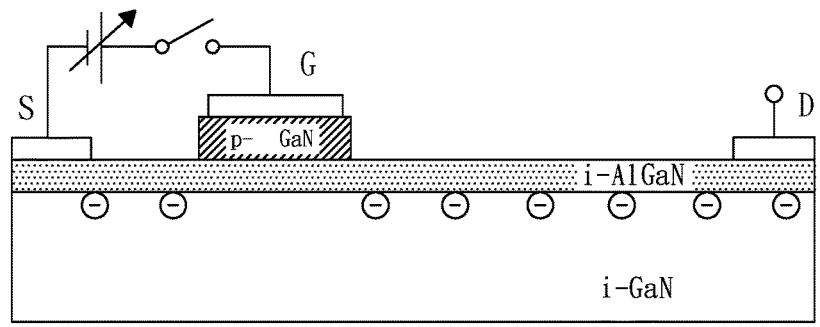
FIG. 4B-4D show the operations of the p-GaN gate E-mode AlGaN/GaN HEMT at a fixed Vd and varying gate voltages Vg according to the conventional prior art invention.
Figure 4C:
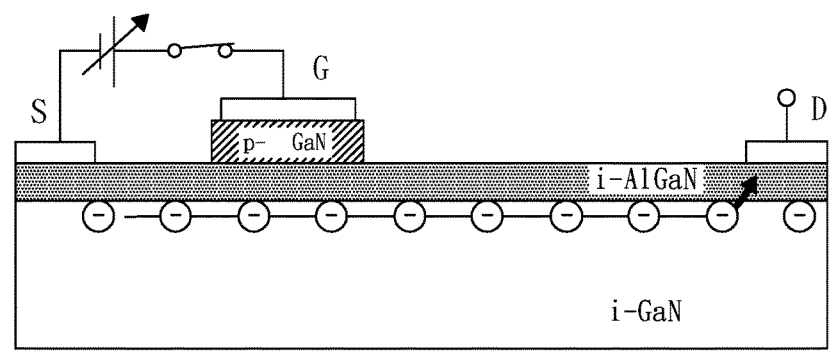
Figure 4D:
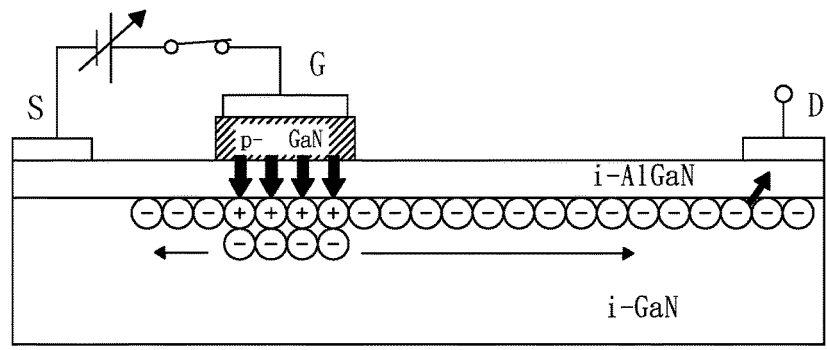

As shown in FIGS. 4A to 4D, the principle of p-GaN gate E-mode AlGaN/GaN HEMT can be viewed from two perspectives. First, by viewing from the polarization electric field, after a p-GaN layer is grown on the epitaxial structure of AlGaN/GaN HEMT, this p-GaN layer will generate a polarization electric field to deplete the 2DEG in the i-GaN channel layer. Secondly, by viewing from the energy band, as shown in FIG. 4A, after a p-GaN layer is grown on the epitaxial structure of AlGaN/GaN HEMT, this p-GaN layer will raise the energy band of the barrier layer i-AlGaN. Thereby, the original potential well at the i-AlGaN/i-GaN junction will be raised above the Fermi energy level, and hence disabling 2DEG from forming. As shown in FIG. 4B, as the voltage of the p-type gate G is less than or equal to 0, the 2DEG below is completely depleted. Thereby, the current from the drain D cannot pass the channel to reach the source S. As shown in FIG. 4C, as the voltage of the p-type gate G is greater than 0, the potential well at the i-AlGaN/i-GaN junction is suppressed below the Fermi energy level. Thereby, electrons will refill the potential well below and forming 2DEG. When the 2DEG is recovered completely, this positive voltage is defined as the threshold voltage Vth. At this moment, the channel is turned on again and the current from the drain D can pass the channel to reach the source S. In addition, as shown in the equivalent circuit diagram of FIG. 4D, the gate G of the p-GaN gate E-mode AlGaN/GaN HEMT versus the drain D and the gate G versus the source S can be viewed as two SBDs connected back-to-back. Thereby, when Vgs is greater than VF, the SBD between the gate G and the drain D will be turned on. At this time, the holes (positive charges) from the p-GaN gate will be injected into the 2DEG. Consequently, to maintain electrical neutrality of the channel layer, the number of electrons in the channel will be increased, leading to an increase of the concentration of the 2DEG. At this moment, to enable electrons to compensate the injected holes rapidly for maintaining electrical neutrality of the channel layer, the electron mobility will be increased. Once the electron mobility is increased, the drain current will be increased accordingly, resulting in an increase in the operating current of the whole device. Besides, because the hole mobility is lower than at least a half of the electron mobility, holes will be confined and accumulated in the channel below the gate G. Thereby, the leakage current of the gate G can be reduced effectively. The gate G electrode, which is an electrode formed by Ni/Au, Pt/Au, Mo, TiN for forming Schottky contacts on p-GaN gate. Unfortunately, when Vgs is much greater than VF, the conduction current of the SBD between the gate G and the drain D is so large that holes cannot be confined and accumulated in the channel below the gate G. Massive holes will be injected into the channel layer and making the gate leakage current increase rapidly. Hence, the transistor can no longer operate in the desired condition. Accordingly, the limited value of Vgs is always the shortcoming of a p-GaN gate E-mode AlGaN/GaN HEMT. In general, due to different epitaxy and process conditions, Vgs(max) is around 5~7V.

Figure 5A:
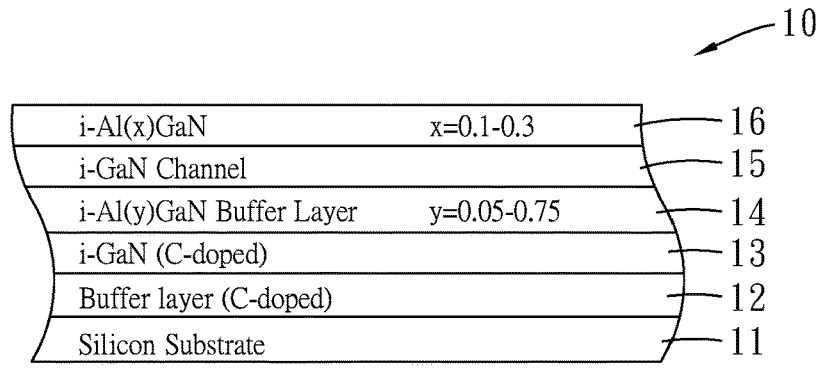
FIG. 5A shows an epitaxial structure diagram of the Ga-face AlGaN/GaN HEMT according to the present invention.
Figure 5B:
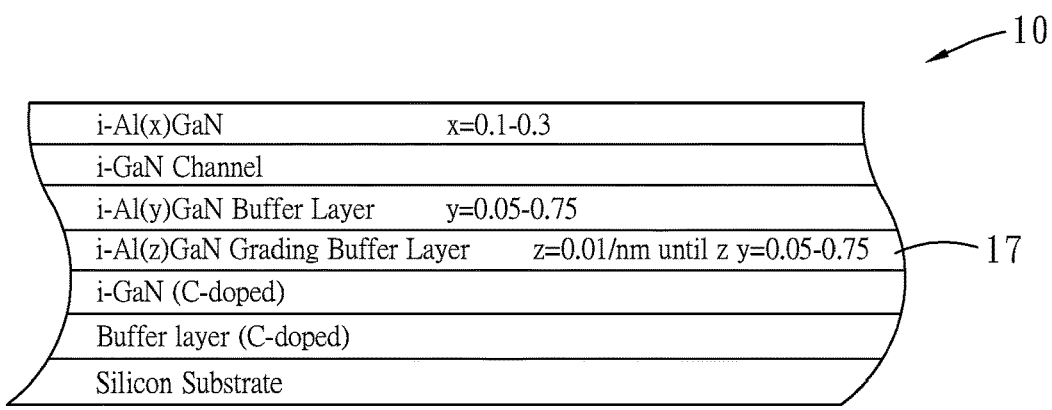
FIG. 5B shows an epitaxial structure diagram of the improved Ga-face AlGaN/GaN HEMT according to the present invention.

FIG. 5A shows an epitaxial structure diagram of the Ga-face AlGaN/GaN HEMT according to the present invention. This epitaxial structure comprises, in order, a silicon substrate 11, a buffer layer (C-doped) 12, an i-GaN layer (C-doped) 13, an i-Al(y)GaN buffer layer 14, an i-GaN channel layer 15, and an i-Al(x)GaN layer 16. This epitaxial structure includes the i-Al(y)GaN buffer layer 14, which is mainly used for blocking the electrons of the buffer traps from entering the channel layer and thus avoiding current collapse of the device. FIG. 5B shows another epitaxial structure diagram of the Ga-face AlGaN/GaN HEMT according to the present invention. To avoid the lattice mismatch problem if the i-Al(y)GaN buffer layer 14 is grown directly on the i-GaN layer (C-doped) 13 as shown in FIG. 5A, an i-Al(z)GaN grading buffer layer 17 is added.

Figures 1, 6A:
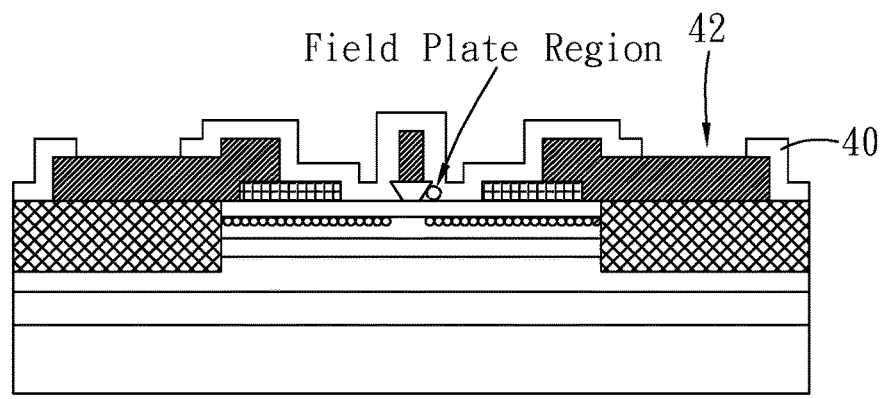
Figures 2, 6A:
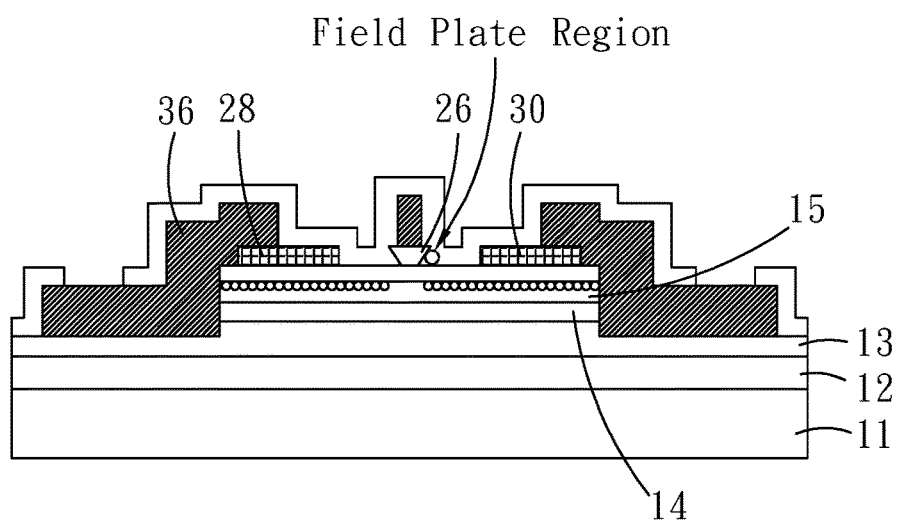

The present invention adopts an inverted trapezoidal structure 26 (as shown in FIG. 6A-1) and uses selective epitaxial growth (SEG) for growing p-type GaN for the gate of an AlGaN/GaN D-Mode HEMT and the anode of an AlGaN/GaN SBD. Thanks to the region of p-type GaN (the inverted trapezoidal structure 26), the 2DEG below the region will be depleted. Thereby, a p-GaN gate E-mode AlGaN/GaN HEMT and a p-GaN anode AlGaN/GaN SBD can be fabricated. Besides, the p-type GaN inverted trapezoidal structure 26 is a gate structure.

Embodiment 1: A SEG p-GaN gate E-mode AlGaN/GaN HEMT.

Figure 6B:
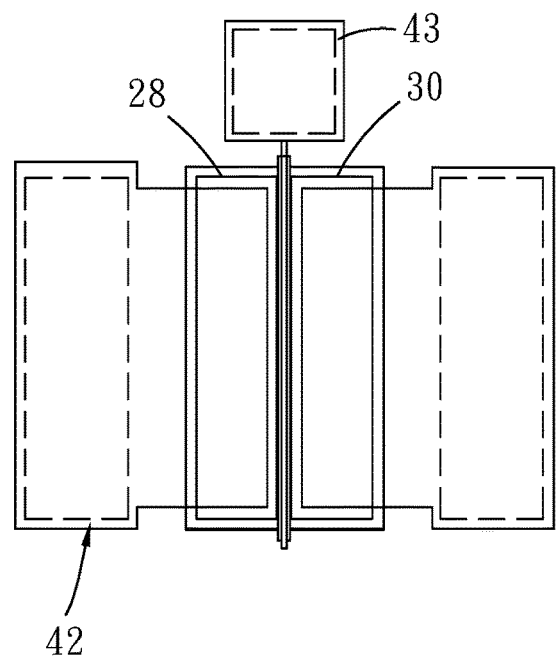
FIG. 6B shows a top view of the SEG p-GaN gate E-mode AlGaN/GaN HEMT according to the present invention.

As shown in FIGS. 6A-1 to 6B, the characteristics of the E-mode AlGaN/GaN HEMT according to the present invention include the epitaxial structure of AlGaN/GaN designed according to the present invention and a p-GaN inverted trapezoidal structure 26 located on a first i-Al(x)GaN layer. Although the 2DEG is formed at the junction i-Al(x)GaN/ i-GaN of the i-GaN channel layer 15, due to the existence of the p-GaN inverted trapezoidal structure 26, the 2DEG below the p-GaN inverted trapezoidal structure 26 in the i-GaN channel layer 15 will be depleted.

In the SEG p-GaN gate E-mode AlGaN/GaN HEMT structure according to the present invention, a source ohmic contact 28 and a drain ohmic contact 30 are formed on the epitaxial structure. They are disposed on the sides of the p-GaN inverted trapezoidal structure 26, respectively including the interconnection metal and passivation layer. The interconnection metal layer 36 connected with the source ohmic contact 28 and the drain ohmic contact 30 and also act as the gate metal of the p-GaN inverted trapezoidal structure 26.

In the following, the fabrication method for the present embodiment will be described. Nonetheless, a person having ordinary skill in the art should know that the present embodiment and its metal layout is not limited to the fabrication method.

Figure 7A:
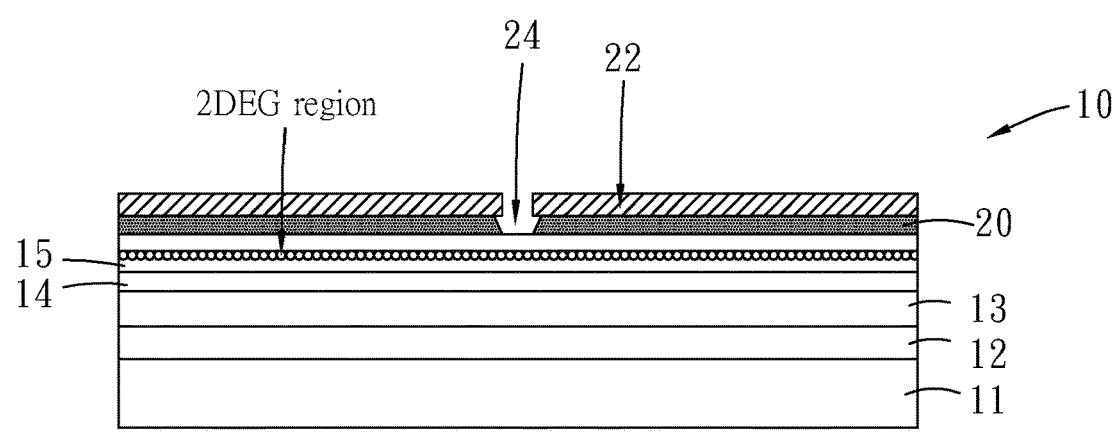
FIG. 7A and FIG. 7B show schematic diagrams of forming the p-GaN gate in the SEG p-GaN gate E-mode AlGaN/GaN HEMT according to the present invention.

Step S11: Pattern the silicon dioxide mask layer 20. First, as shown in FIG. 7A, deposit a silicon dioxide mask layer 20 on the epitaxial structure of Ga-face AlGaN/GaN according to the present invention using PECVD with a thickness of around 100~200 nm. Next, define the gate SEG region 24 by using photoresist and photolithography method. Finally, the silicon dioxide mask layer 20 in the region 24 is etched by a wet etching method using buffered oxide etchant (BOE) to expose the surface of the epitaxy. Then, the photoresist 22 is stripped using stripper. Because the wet etching is isotropic, in addition to etching downward, lateral etching will occur concurrently. Thereby, the opening of the silicon dioxide mask layer 20 in the region 24 will form an inverted trapezoidal structure.

Figure 7B:
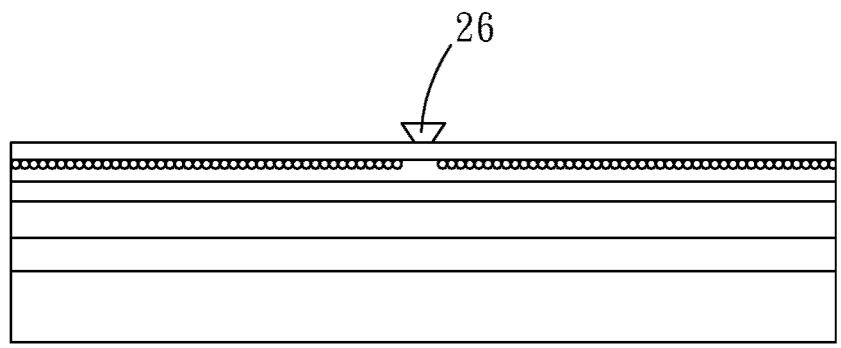

Step S12: Form the p-GaN inverted trapezoidal structure 26 using SEG. First, p-GaN SEG is performed using MOCVD and only the exposed surface of the epitaxy can grow p-GaN. Because the growth of p-GaN in MOCVD is also isotropic, in addition to growing upward, lateral growth will occur concurrently and thus forming an inverted trapezoidal structure of p-GaN, which is just the p-GaN inverted trapezoidal structure 26. Finally, the silicon dioxide mask layer 20 is etched by a wet etching method using BOE and forming the structure shown in FIG. 7B.

Then, because the p-GaN SEG region 24 occupies only a small portion of the whole epitaxy wafer, the loading effect will occur easily. Namely, the growth rate on the defined region for p-GaN is three to four times the growth rate on the general surface. Thereby, the p-type doping concentration in p-GaN will be equal to 1/3 to 1/4 of the expected.

Figure 7C:
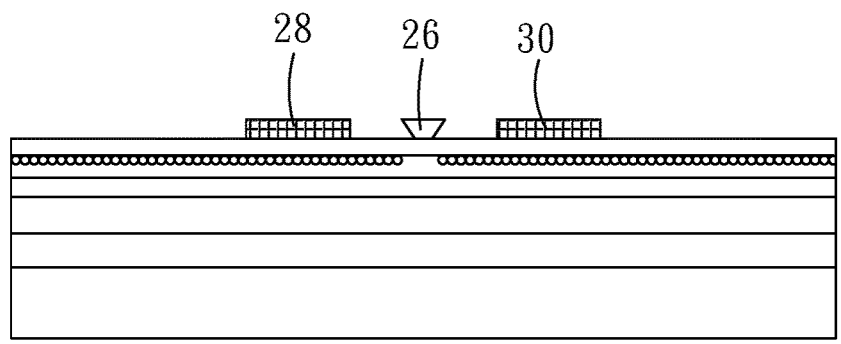
FIG. 7C shows a schematic diagram of forming the drain and source metal electrodes in the SEG p-GaN gate E-mode AlGaN/GaN HEMT according to the present invention.

Step S13: Form the drain ohmic contact 30 and the source ohmic contact 28. A metal layer, for example, a general Ti/Al/Ti/Au or Ti/Al/Ni/Au metal layer, is deposited on the epitaxy wafer using metal vapor deposition. Then a metal lift-off method is adopted to pattern the deposited metal layer for forming the drain and source electrodes on the epitaxy wafer. Afterwards, a thermal treatment is performed at 700~900° C. for 30 seconds to make the drain and source electrodes become ohmic contacts 30, 28, as shown in FIG. 7C.

Figures 1, 7D:
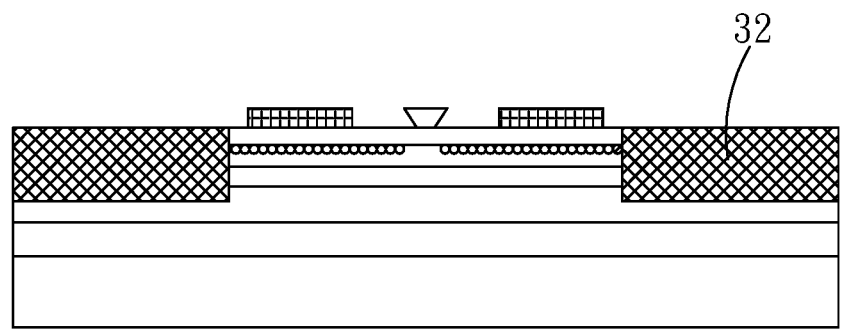
Figures 2, 7D:
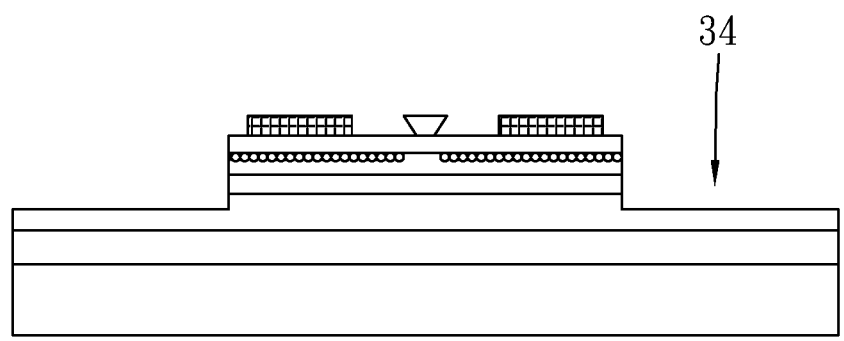

Step S14: Perform device isolation process. In this step, the multiple-energy destructive ion implantation is adopted. In general, heavy atoms such as boron or oxygen atoms are used for isolating devices, as shown in FIG. 7D-1. Alternatively, dry etching to the highly resistive i-GaN buffer layer (C-doped) can also be adopted for isolating devices, as shown in FIG. 7D-2.

Figures 1, 7E:
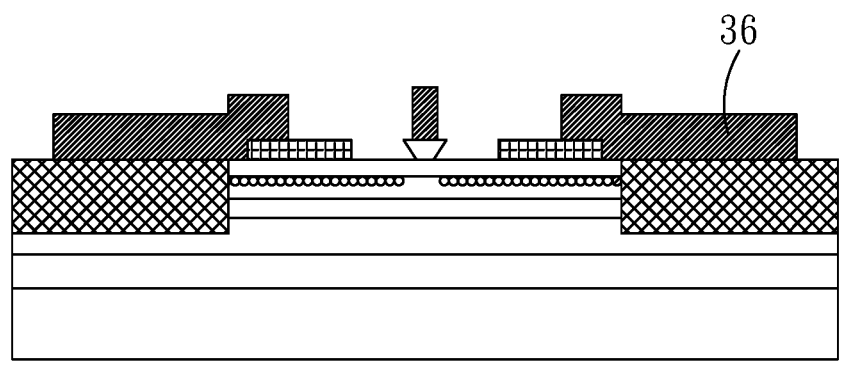
Figures 2, 7E:
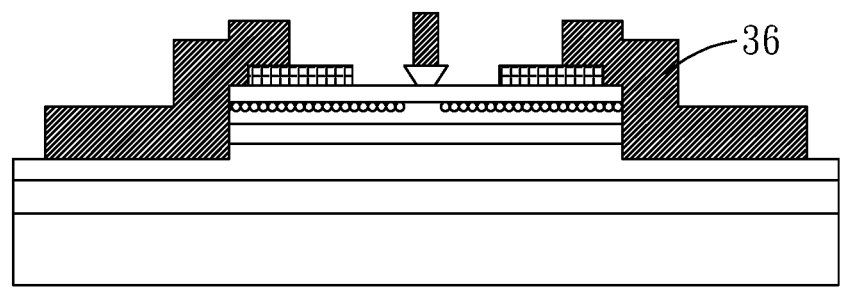

Step S15: Perform the metal wiring process. In this step, metal deposition is performed. Metal vapor deposition and lift-off methods are used for patterning the Ni/Au metal layer 36 and forming bonding pads for the gate, drain, and source electrodes as well as the metal interconnection, as shown in FIGS. 7E-1 and 7E-2. It is note that the gate metal on the p-gate inverted trapezoidal structure 26 and the bonding pads for the gate electrode should be formed and connected by metal layer 36.

Step S16: Deposit and pattern passivation layer. A passivation layer 40 is grown by PECVD. The material is selected from the group consisting of SiOx, SiOxNy, or SiNx; the thickness is 1000 A~2000 A. This passivation layer 40 should not be too thick, or stress will be applied to devices and changing the original polarization. Finally, the passivation layer 40 is patterned for exposing the bonding pad region. For example, wet etching using BOE is adopted for exposing the bonding pad region for subsequent wire bonding.

Because p-GaN is an inverted trapezoidal structure, a sloped capacitor will be formed at the dashed circle in FIG. 6A-1. This capacitor will induce the field plate effect having the main function of dispersing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Embodiment 2: A SEG p-GaN anode AlGaN/GaN SBD.

Figures 1, 8A:
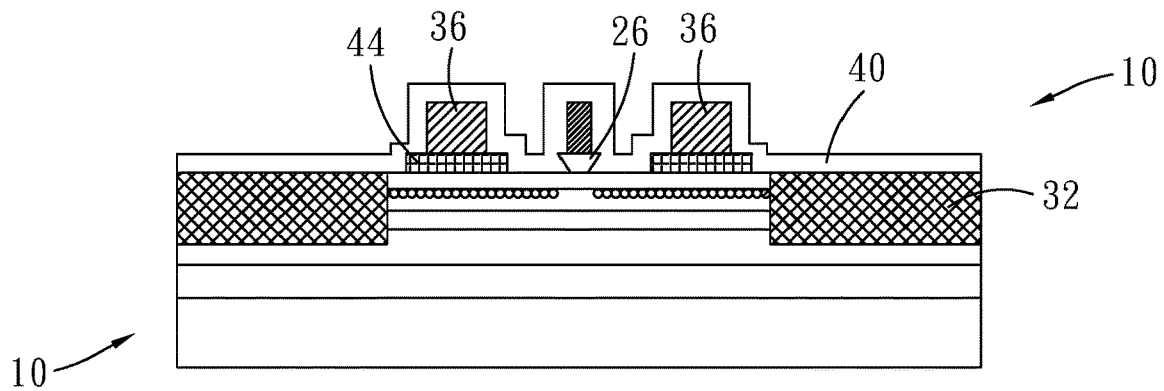
Figures 2, 8A:
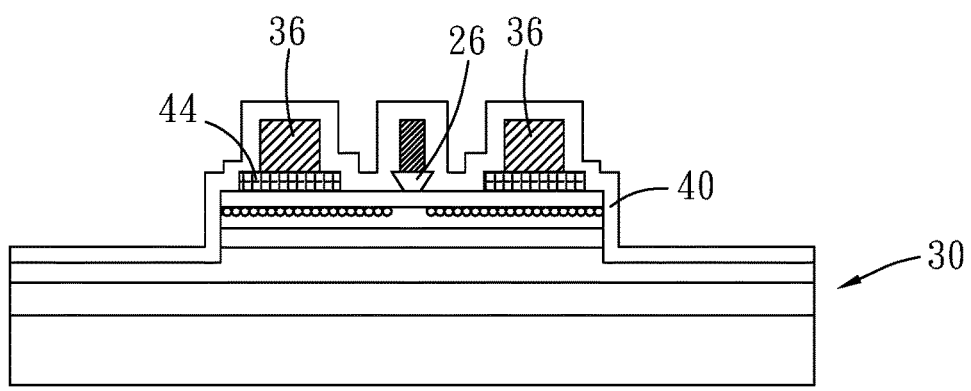

As shown in FIGS. 8A-1 to 8A-2, the characteristics of the SEG p-GaN anode AlGaN/GaN SBD according to the present invention include the epitaxial structure of AlGaN/GaN designed according to the present invention and a p-GaN inverted trapezoidal structure 26 located on a first i-Al(x)GaN layer according to Embodiment 2. Although the 2DEG is formed at the junction i-Al(x)GaN/i-GaN of the i-GaN channel layer, due to the existence of the p-GaN inverted trapezoidal structure 26, the 2DEG below the p-GaN inverted trapezoidal structure 26 in the i-GaN channel layer 15 will be depleted.

Because the steps for Embodiment 2 are identical to those for Embodiment 1, the details will not be described again. In the process, first, as described above, a patterned silicon dioxide mask layer having an inverted trapezoidal structure is formed on the epitaxial structure for defining the SEG region for the anode structure. Next, SEG of p-GaN is performed on the epitaxy wafer using MOCVD for forming a p-GaN inverted trapezoidal anode structure. Afterwards, the patterned silicon dioxide mask layer is removed.

Then, as described above, because the p-GaN SEG region occupies only a small portion of the whole epitaxy wafer, the loading effect will occur easily. Namely, the growth rate on the defined region for p-GaN is three to four times the growth rate on the general surface. Thereby, the p-type doping concentration in p-GaN will be equal to 1/3 o 1/4 of the expected.

Then, cathode metals are formed on both sides of the p-GaN inverted trapezoidal anode structure on the epitaxy wafer, respectively, and a thermal treatment of 700~900° C. is performed for 30 seconds for forming cathode ohmic contacts 44. Next, as described above, multiple-energy destructive ion implantation or dry etching are used for forming the device isolation structure 32.

Figure 8B:
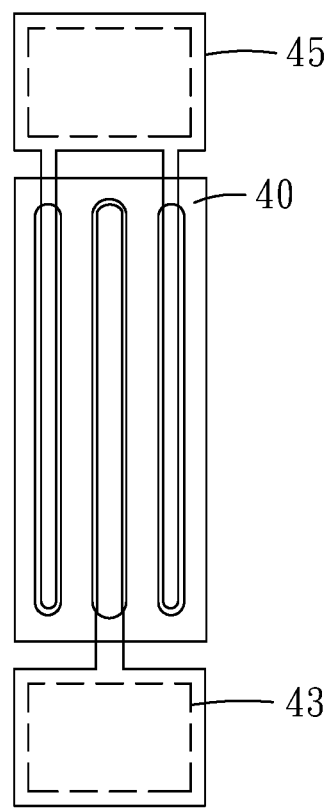
FIG. 8B shows a top view of the SEG p-GaN anode AlGaN/GaN SBD according to the present invention.

As shown in FIG. 8B, the metal wiring process is performed. According to the present embodiment, an anode metal layer, an anode bonding pad region 43 connected to the anode metal layer, an interconnection metal connected to the cathode ohmic contact, and a cathode bonding pad region 45 connected to the interconnection metal are formed. Finally, form a patterned passivation layer 40 on the epitaxial layer for exposing the anode bonding pad region and the cathode bonding pad region. The epitaxial layer covered by the patterned passivation layer 40 is the device region. In other words, a patterned passivation layer 40 is formed above the device region.

Figure 9A:
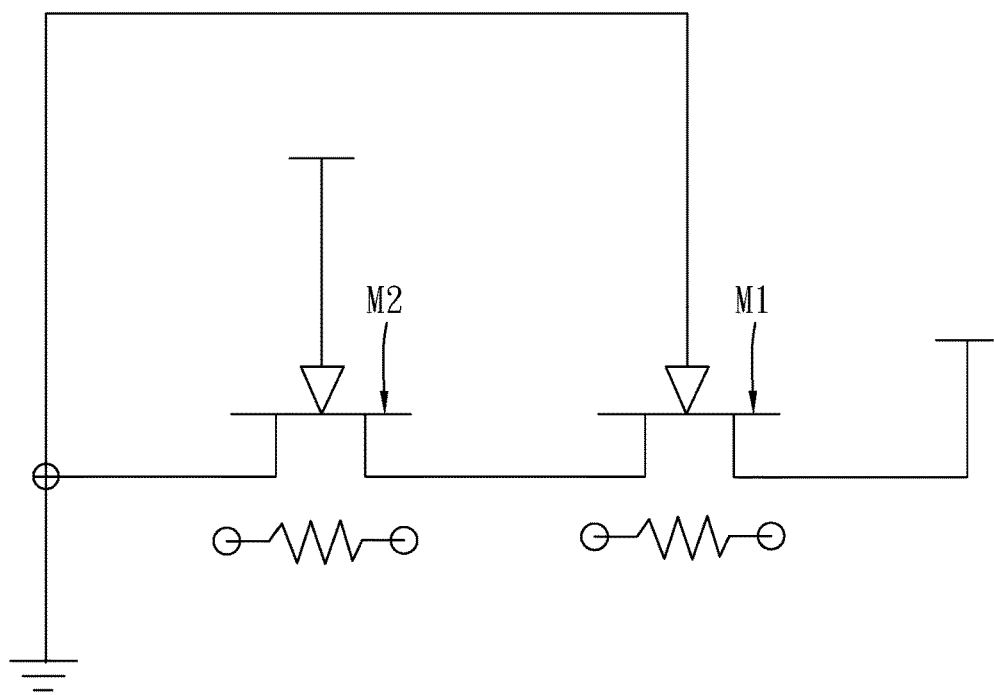
FIG. 9A shows an equivalent circuit diagram of the SEG p-GaN gate AlGaN/GaN E-mode HEMT connected in series with an AlGaN/GaN D-mode HEMT without gate oxide according to the present invention.

Moreover, the above SEG p-GaN gate E-mode HEMT structure can be further connected in series with a depletion-mode (D-mode) transistor with gate oxide to form a hybrid E-mode AlGaN/GaN HEMT, which can reduce the Early effect of a transistor. FIG. 9A shows an equivalent circuit diagram of the SEG p-GaN gate AlGaN/GaN E-mode HEMT connected in series with an AlGaN/GaN D-mode HEMT without gate oxide according to the present invention. As shown in the figure, an SEG p-GaN gate AlGaN/GaN E-mode HEMT is connected in series with an AlGaN/GaN D-mode HEMT. In addition, the gate of the D-mode HEMT is connected directly to the source of the E-mode HEMT and to the ground. Overall, it can be regarded as a normally-off E-mode HEMT. Thereby, when a high voltage is applied to the drain of the D-mode HEMT, Vgd of the D-mode HEMT is negative. Hence, the GaN D-mode HEMT remains in off-mode. Accordingly, the whole hybrid E-mode HEMT will not breakdown when a high voltage is applied to the drain of the D-mode HEMT.

Figure 9B:
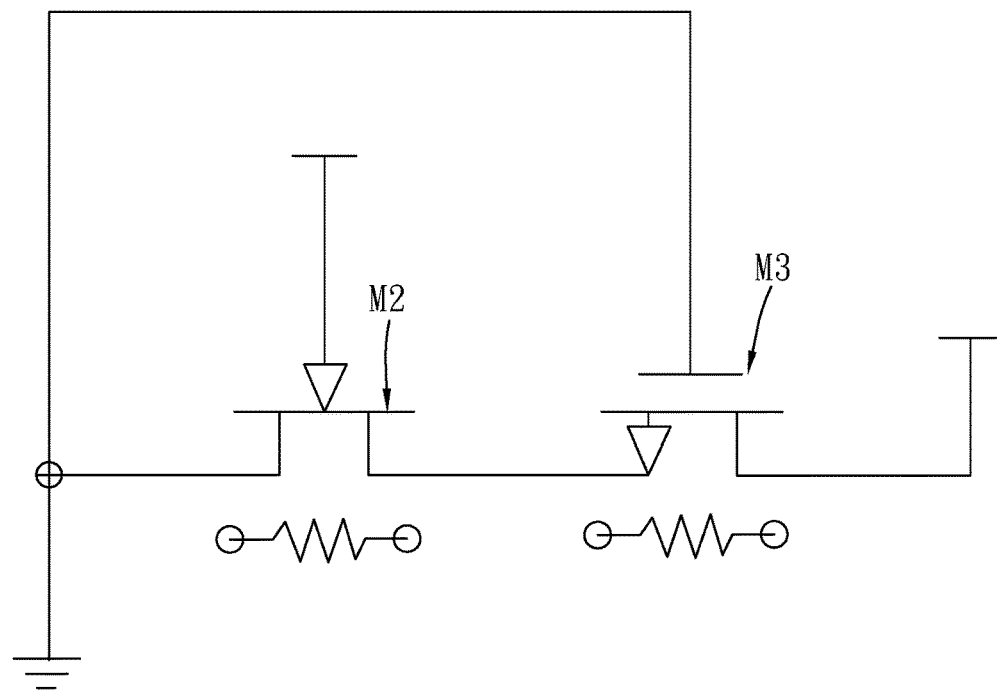
FIG. 9B shows an equivalent circuit diagram of the SEG p-GaN gate AlGaN/GaN E-mode HEMT connected in series with an AlGaN/GaN D-mode HEMT with gate oxide according to the present invention.

Besides, in addition to connecting to a D-mode HEMT without gate oxide, the SEG p-GaN gate AlGaN/GaN E-mode HEMT can be connected in series with another structure of D-mode HEMT. FIG. 9B shows an equivalent circuit diagram of the SEG p-GaN gate AlGaN/GaN E-mode HEMT connected in series with an AlGaN/GaN D-mode HEMT with gate oxide according to the present invention. The difference between a D-mode HEMT without and with gate oxide is that the pinch-off voltage Vp of a D-mode HEMT without gate oxide will be smaller than that of one with gate oxide.

Figure 10A:
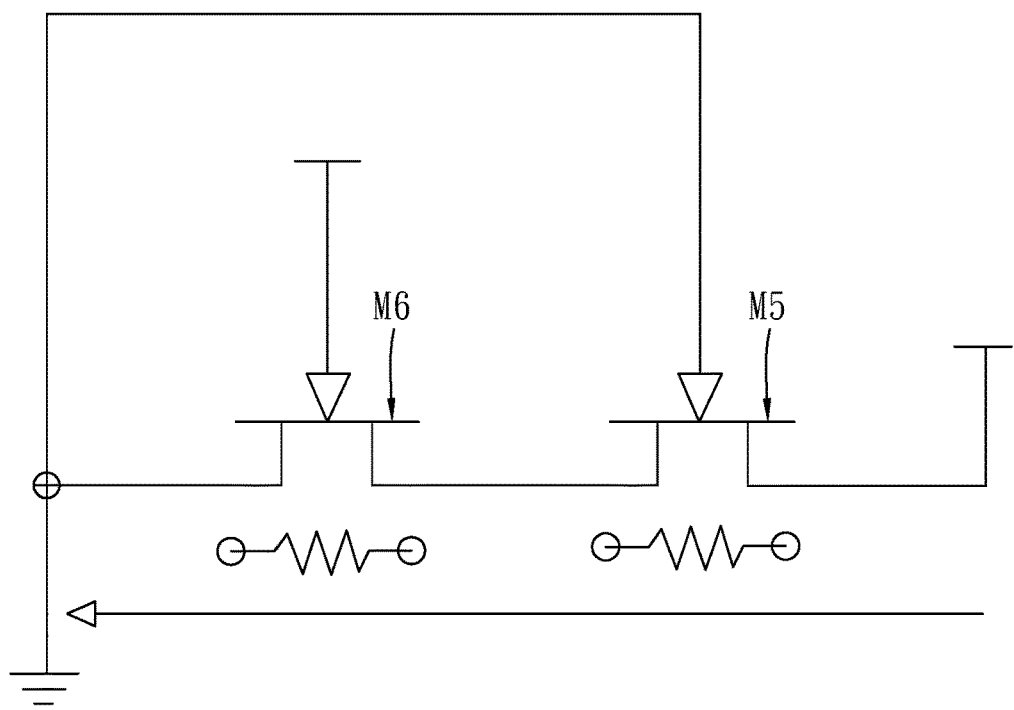
FIG. 10A shows a schematic diagram of the equivalent circuit in FIG. 9A after being turned on according to the present invention.
Figure 10B:
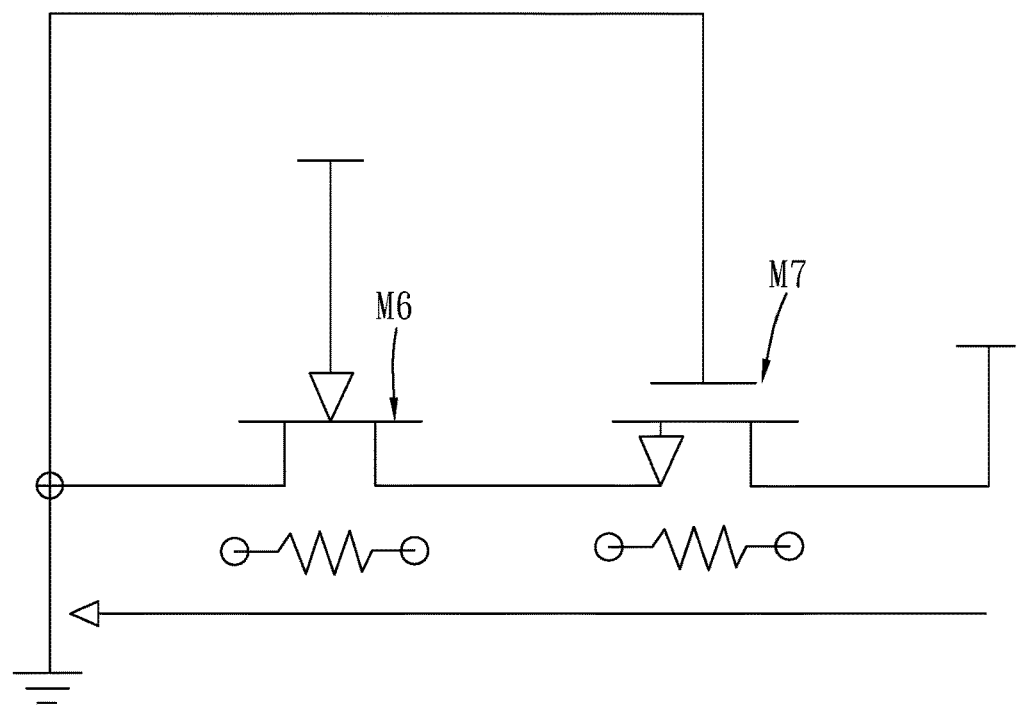
FIG. 10B shows a schematic diagram of the equivalent circuit in FIG. 9B after being turned on according to the present invention.
Figures 1, 11A:
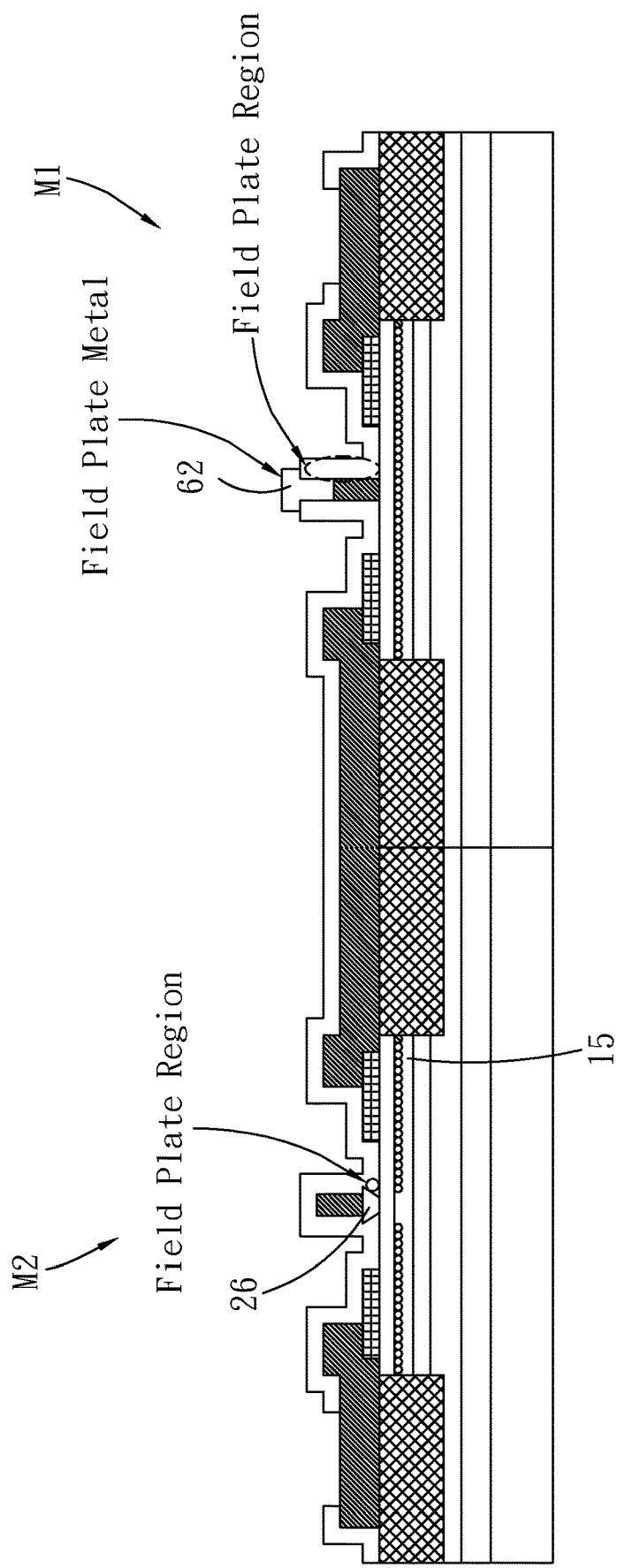
Figures 2, 11A:
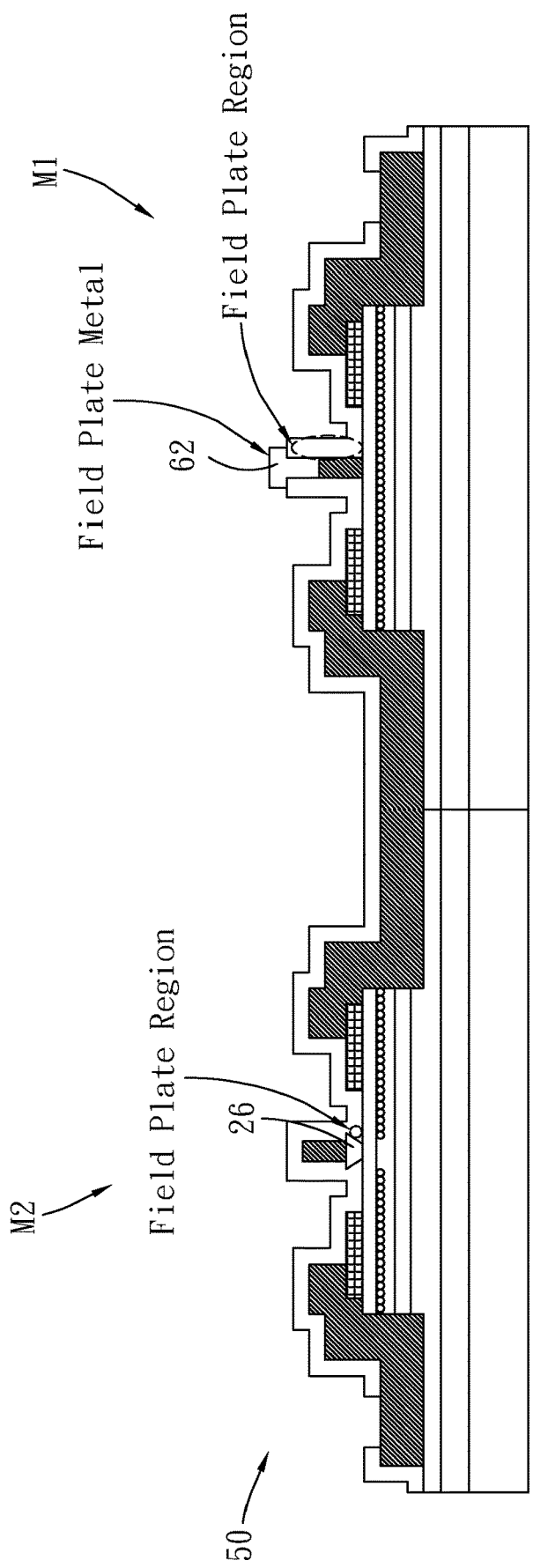
Figure 11B:
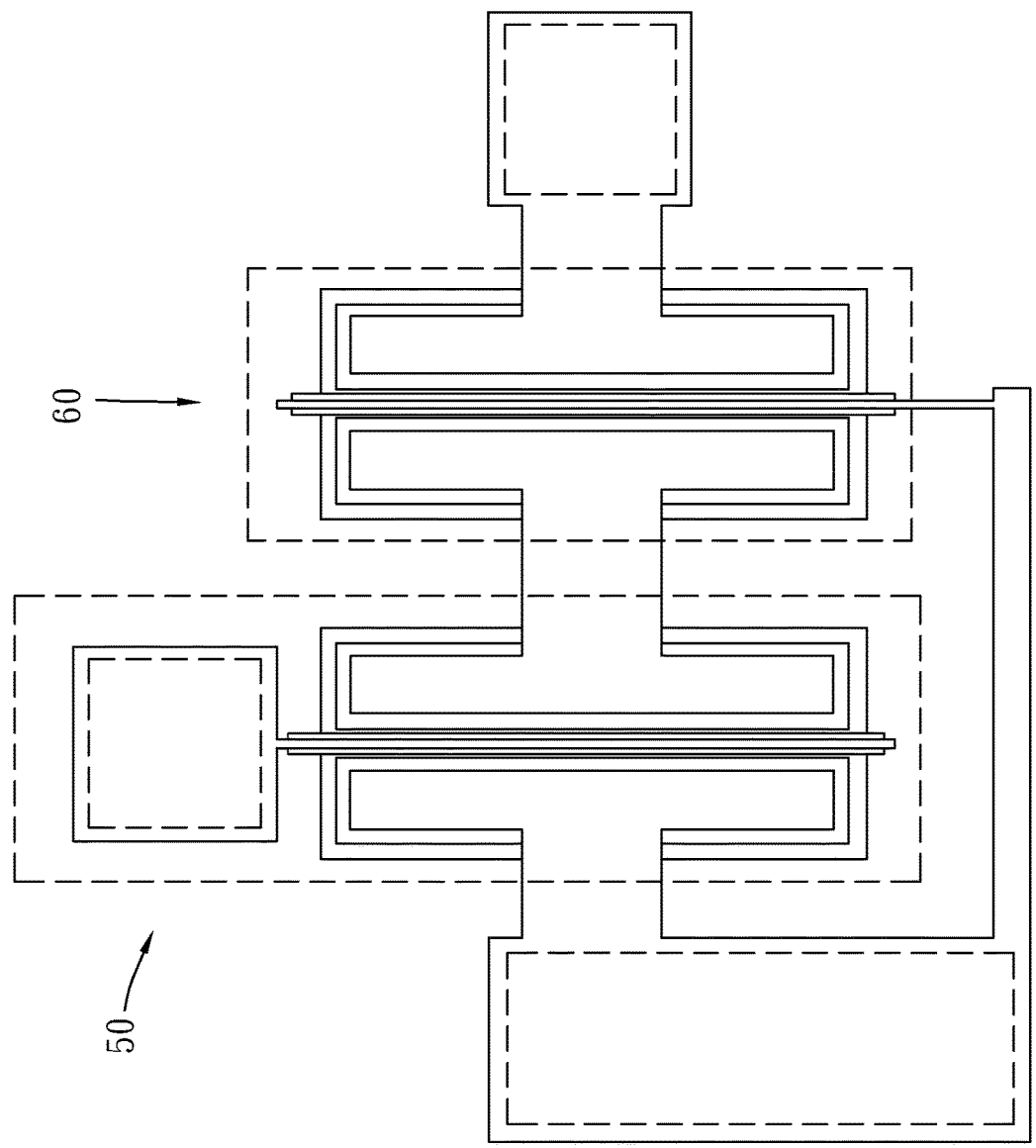
FIG. 11B shows a top view of the transistors in FIGS. 11A-1 and 11A-2.

FIGS. 10A and 10B show schematic diagrams of the equivalent circuits in FIGS. 9A and 9B after being turned on according to the present invention. As shown in the figures, given the gate voltage Vg fixed, as we apply a Vds (voltage VD2S1), a current Id will flow from the D-mode HEMT to the E-mode HEMT and reaching the source of the E-mode HEMT. When the current Id passes the E-mode HEMT:

$$VD1 = Rds(E\text{-Mode}, M6) \times Id = -VG2S2$$

Two points should be noted. First, the voltage VD1 is positive, and hence the voltage VGS2S2 is negative. Secondly, when the voltage VD2S1 is small, the initial current Id is proportional to the width Wg2 of the D-mode HEMT. In addition, the hybrid E-mode transistor in FIGS. 10A and 10B acts as a normally-off transistor. The design guidelines can be summarized as follows. First, a short LD1S1 and a wide Wg (D-Mode) minimize Rds (E-Mode)+Rds (D-Mode). Secondly, by increasing the distance LG2D2 between the gate and drain of the D-mode HEMT as well as a long LG2 and a wide Wg (D-Mode), the breakdown voltage of VD2S1 is increased while maintaining Rds (E-Mode)+Rds (D-Mode) minimized and slowing the dropping rate of the current Id. Thereby, the design predictivity of the device is better. Thirdly, by increasing the distance LG2D2 between the gate and drain of the D-mode HEMT as well as a wide Wg (D-Mode), the breakdown voltage of VD2S1 is increased while maintaining Rds (E-Mode)+Rds (D-Mode) minimized. Although the dropping rate of the current Id will be faster, given a proper Wg (D-Mode), the chip area will be smaller than the area according to the second design guideline.

Embodiment 3: As shown in FIGS. 11A-1, 11A-2, and 11B, CONNECT a SEG p-GaN GATE E-mode AlGaN/GaN HEMT in series with a D-mode AlGaN/GaN HEMT without gate oxide to form a hybrid E-mode AlGaN/GaN HEMT.

A SEG p-GaN gate E-mode HEMT usually exhibits slight Early effect, which means that the channel cannot be shut off completely and thus leading to increases of the current Ids as Vds increases when the device is operated in the saturation region with the gate voltage Vg fixed. The cascode D-mode HEMT according to the present invention just can solve this problem.

As shown in FIGS. 11A-1, 11A-2, and 11B, the hybrid E-mode AlGaN/GaN HEMT according to Embodiment 3 comprises the epitaxial structure of AlGaN/GaN designed according to the present invention and is divided into a left region and a right region. In the left region, a SEG p-GaN gate E-mode AlGaN/GaN HEMT M2 is formed. This SEG p-GaN gate E-mode AlGaN/GaN HEMT includes a p-GaN inverted trapezoidal gate structure 26. In addition, although the 2DEG is formed at the junction i-Al(x)GaN/i-GaN of the i-GaN channel layer, due to the existence of the p-GaN inverted trapezoidal structure 26, the 2DEG below the p-GaN inverted trapezoidal structure 26 in the i-GaN channel layer 15 will be depleted. In the right region, a D-mode AlGaN/GaN HEMT without gate oxide is formed.

Figure 12A:
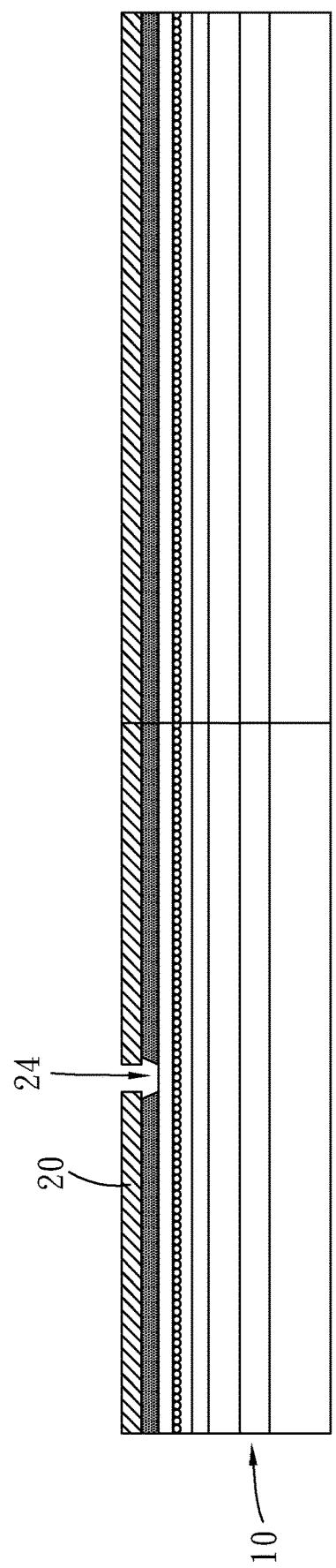
Figure 12B:
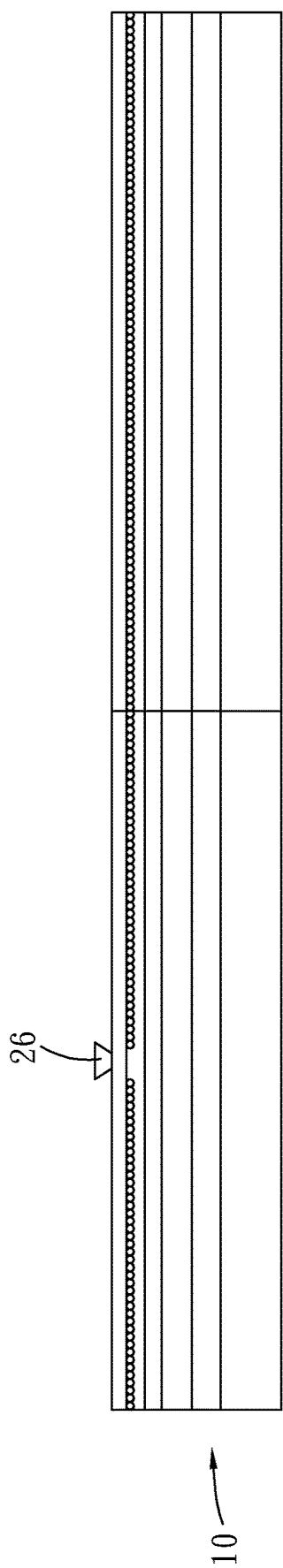

The process for fabricating the present embodiment will be described as follows. First, as shown in FIGS. 12A to 12B, an epitaxial structure of Ga-face AlGaN/GaN according to the present invention is provided. The left region is set to fabricate the SEG p-GaN E-mode AlGaN/GaN HEMT while the right region is set to fabricate the D-mode AlGaN/GaN HEMT. Alternatively, the setting for the left and right regions can be undoubtedly altered according to requirements. Next, as described in the previous fabrication method, form a patterned silicon dioxide mask layer 20 having an inverted-trapezoidal-structure opening 24 on the epitaxial structure of Ga-face AlGaN/GaN for defining the region for the SEG gate. The thickness of this silicon dioxide mask layer 20 is around 100 to 200 nm. Then, p-GaN is grown in the inverted-trapezoidal-structure opening 24 and forming a p-GaN inverted trapezoidal structure 26. Afterwards, the patterned silicon dioxide mask layer 20 is removed. At this moment, as described above, because the p-GaN SEG region occupies only a small portion of the whole epitaxy wafer, there will be a loading effect causing the p-GaN growth rate increase by 3~4 times compared to a full wafer p-GaN growth rate therefore the p-type doping concentration in p-GaN will be equal to 1/3 to 1/4 compared to a full wafer p-GaN growth.

Figure 12C:
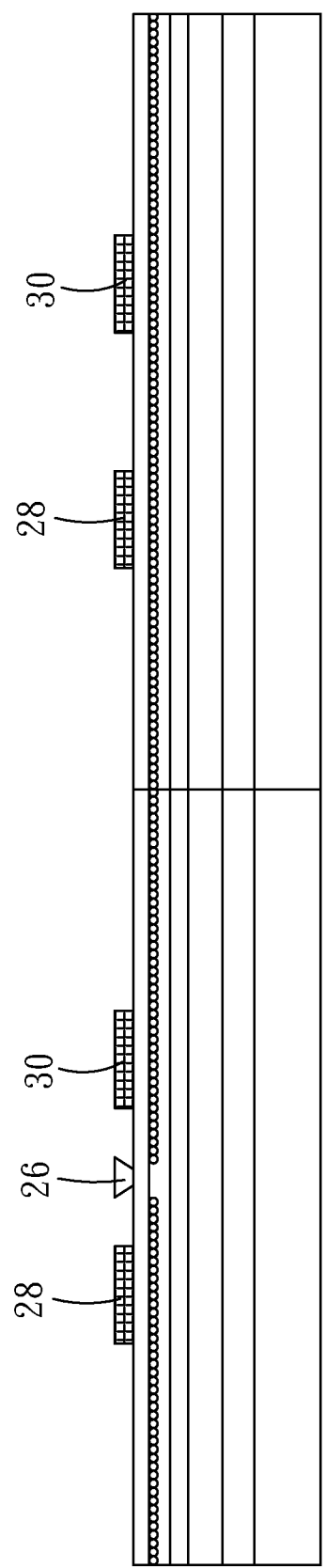

Then, use metal vapor deposition and metal lift-off methods to form the drain and source electrodes. Afterwards, a thermal treatment is performed at 700~900° C. for 30 seconds to make the drain and source electrodes become ohmic contacts 30, 28, as shown in FIG. 12C.

Figures 1, 12D:
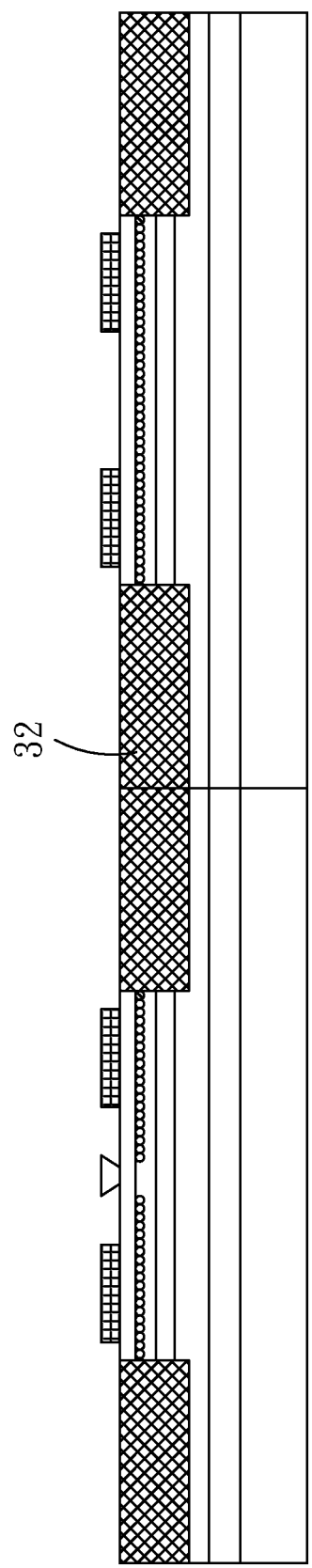
Figures 2, 12D:
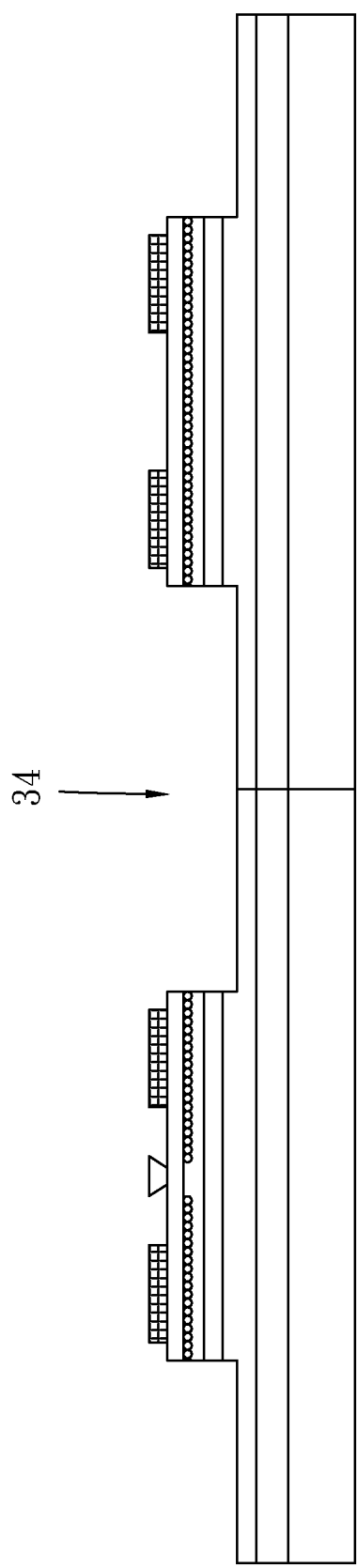

Next, use destructive ion implantation as shown in FIG. 12D-1 or the dry etching to the highly resistive i-GaN buffer layer (C-doped) as shown in FIG. 12D-2 to isolate devices.

Figures 1, 12E:
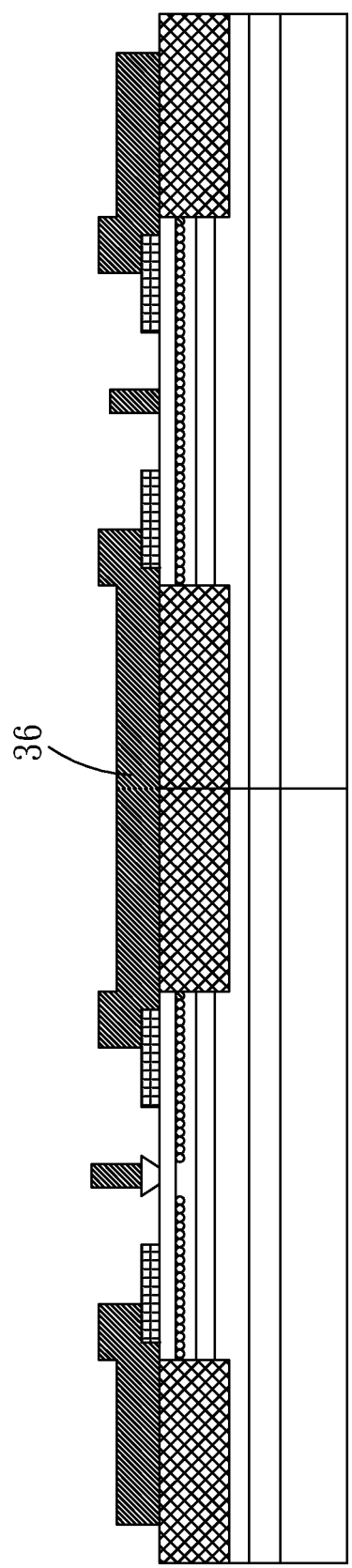
Figures 2, 12E:
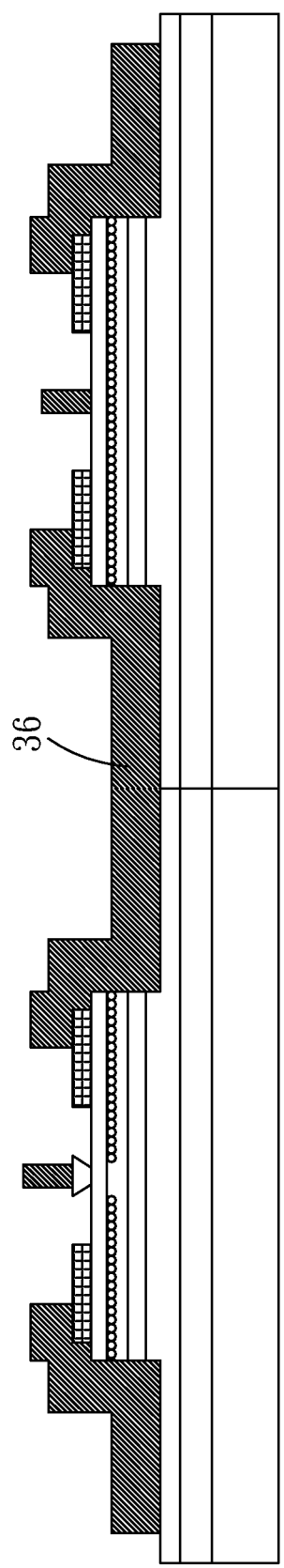

Afterwards, use metal vapor deposition and metal lift-off methods to form the gate electrode, the bonding pad regions for the drain and source electrodes, and the interconnection metal layer 36. Alternatively, in this step, the gate bonding pad region connected electrically with the gate electrode can be formed concurrently, as the structures shown in FIGS. 12E-1 and 12E-2.

Then, a passivation layer 40 is grown by PECVD. The material is selected form the group consisting of SiOx, SiOxNy, or SiNx; the thickness is 1000A~2000A. This passivation layer 40 should not be too thick, or stress will be applied to devices and changing the original polarization. Finally, the passivation layer 40 is patterned for exposing the bonding pad region and the region above the D-mode HEMT gate metal, and thus forming the structures shown in FIG. 12F-1 or FIG. 12F-2.

Likewise, because p-GaN gate is an inverted trapezoidal structure, a sloped capacitor will be formed at the dashed circle in the figures. This capacitor will induce the field plate effect having the main function of dispersing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Finally, the metal vapor deposition and metal left-off methods are adopted to form D-mode HEMT field plate metal 62, as shown in the final structures in FIGS. 11A-1, 11A-2, and 11B.

Embodiment 4: A SEG p-GaN gate E-mode AlGaN/GaN HEMT is connected in series with a D-mode AlGaN/GaN HEMT with gate oxide M3 to form a hybrid E-mode AlGaN/GaN HEMT.

As shown in FIGS. 13A-1, 13A-2, and 13B, the hybrid E-mode AlGaN/GaN HEMT according to Embodiment 4 comprises the epitaxial structure of AlGaN/GaN designed according to the present invention and is divided into a left region and a right region. In the left region, a SEG p-GaN gate E-mode AlGaN/GaN HEMT is formed. This SEG p-GaN gate E-mode AlGaN/GaN HEMT includes a p-GaN inverted trapezoidal gate structure 26. In addition, although the 2DEG is formed at the junction i-Al(x)GaN/i-GaN of the i-GaN channel layer, due to the existence of the p-GaN inverted trapezoidal structure 26, the 2DEG below the p-GaN inverted trapezoidal structure 26 in the i-GaN channel layer will be depleted. In the right region, a D-mode AlGaN/GaN HEMT with gate oxide M3 is formed.

The process for fabricating the present embodiment will be described as follows.

First, as the step for Embodiment 3, an epitaxial structure of Ga-face AlGaN/GaN according to the present invention is provided. The left region is set to fabricate the SEG p-GaN E-mode AlGaN/GaN HEMT while the right region is set to fabricate the D-mode AlGaN/GaN HEMT. Next, as described in the previous fabrication method, form a patterned silicon dioxide mask layer having an inverted-trapezoidal-structure opening on the epitaxial structure of Ga-face AlGaN/GaN for defining the region for the SEG gate. Then, p-GaN is grown in the inverted-trapezoidal-structure opening 24 and forming a p-GaN inverted trapezoidal structure 26. Afterwards, the patterned silicon dioxide mask layer 20 is removed; the drain and source electrodes 28, 30 are formed; and device isolation 34 is fabricated.

Next, the gate oxide layer for the D-mode HEMT is fabricated. An insulating dielectric layer is deposited by PECVD. The material is selected form the group consisting of SiOx, SiOxNy, or SiNx; the thickness is 10 to 100 nm. Then, define the gate oxide region of the D-mode HEMT by using photoresist and exposure method. Finally, the insulating dielectric layer outside the region is etched by a wet etching method using BOE; the insulating dielectric layer in the gate oxide layer 72 region is reserved. Afterwards, the photoresist is stripped using stripper and forming the structures shown in FIGS. 14A-1 and 14A-2.

Figures 1, 14A:
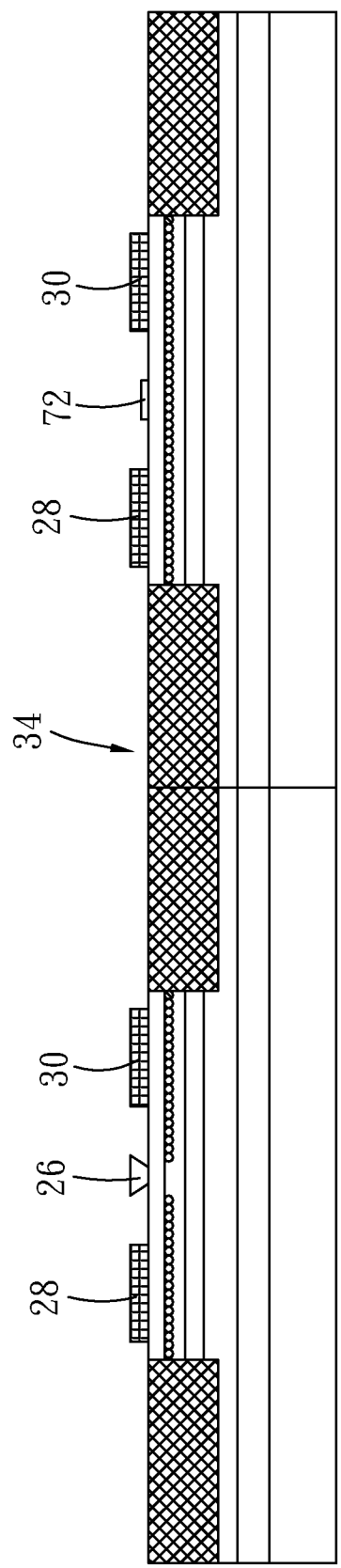
Figures 2, 14A:
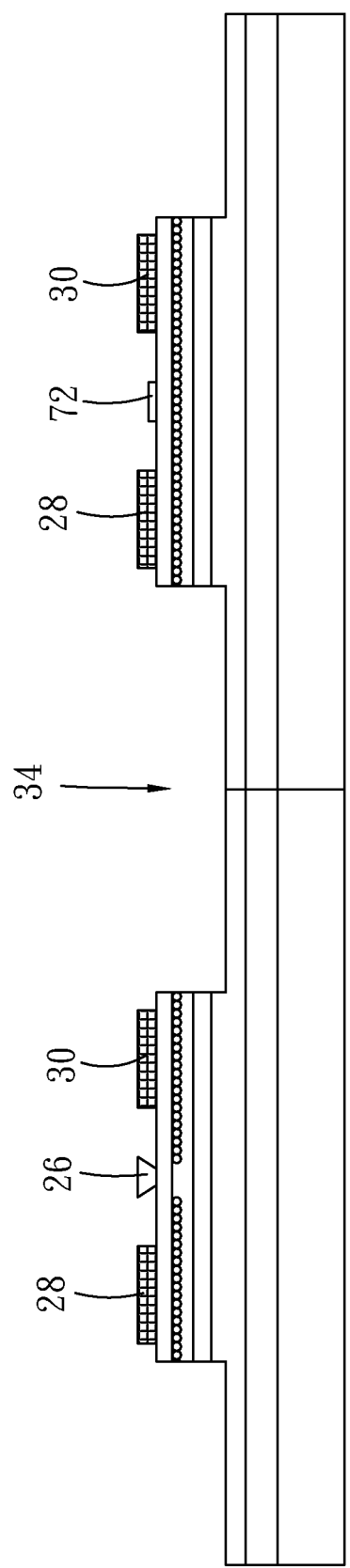
Figures 3, 14A:
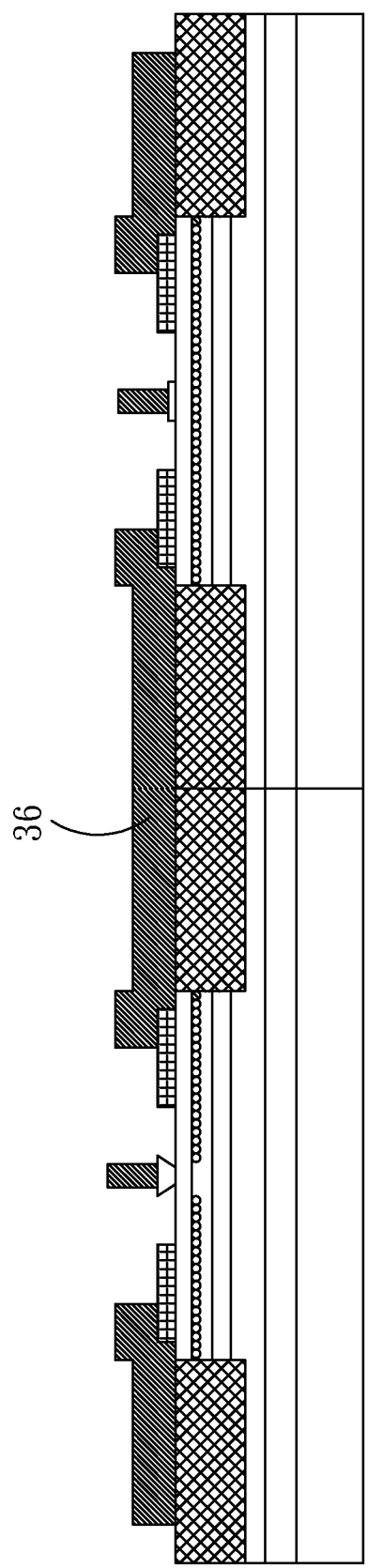
Figures 4, 14A:
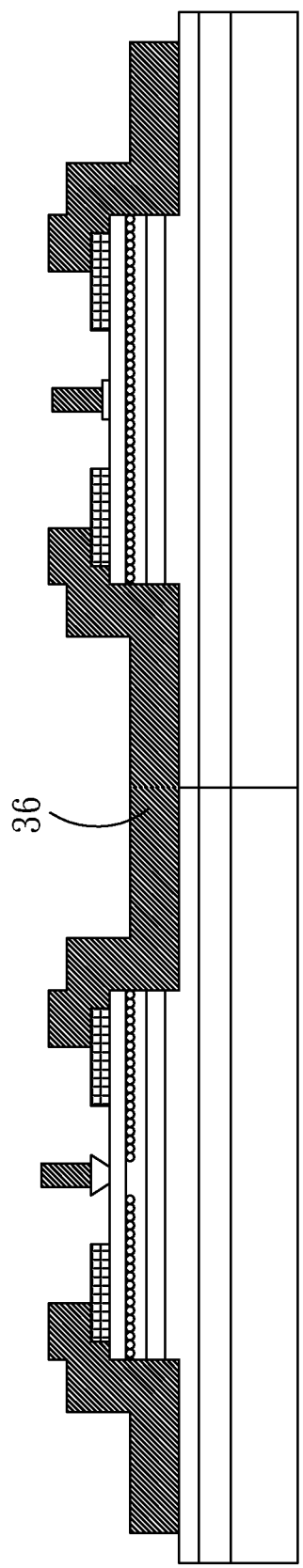

Afterwards, use metal vapor deposition (normally Ni/Au) and metal lift-off methods to form the gate electrode, the bonding pad regions for the drain and source electrodes, and the interconnection metal layer 36, as the structures shown in FIG. 14A-3 or FIG. 14A-4. In addition, in this step, the metal wiring required for device operations can be formed concurrently. For example, the gate bonding pad region connected electrically with the gate electrode can be formed concurrently. Nonetheless, the present invention is not limited to the top views of the present invention.

Then, a passivation layer 40 is grown by PECVD. The material is selected form the group consisting of SiOx, SiOxNy, or SiNx; the thickness is 1000A~2000A. This passivation layer 40 should not be too thick, or stress will be applied to devices and changing the original polarization. Finally, the passivation layer 40 is patterned for exposing the bonding pad region and the region above the D-mode HEMT gate metal, and thus forming the structures shown in FIGS. 13A-1, 13A-2, and 13B.

Figures 1, 12F:
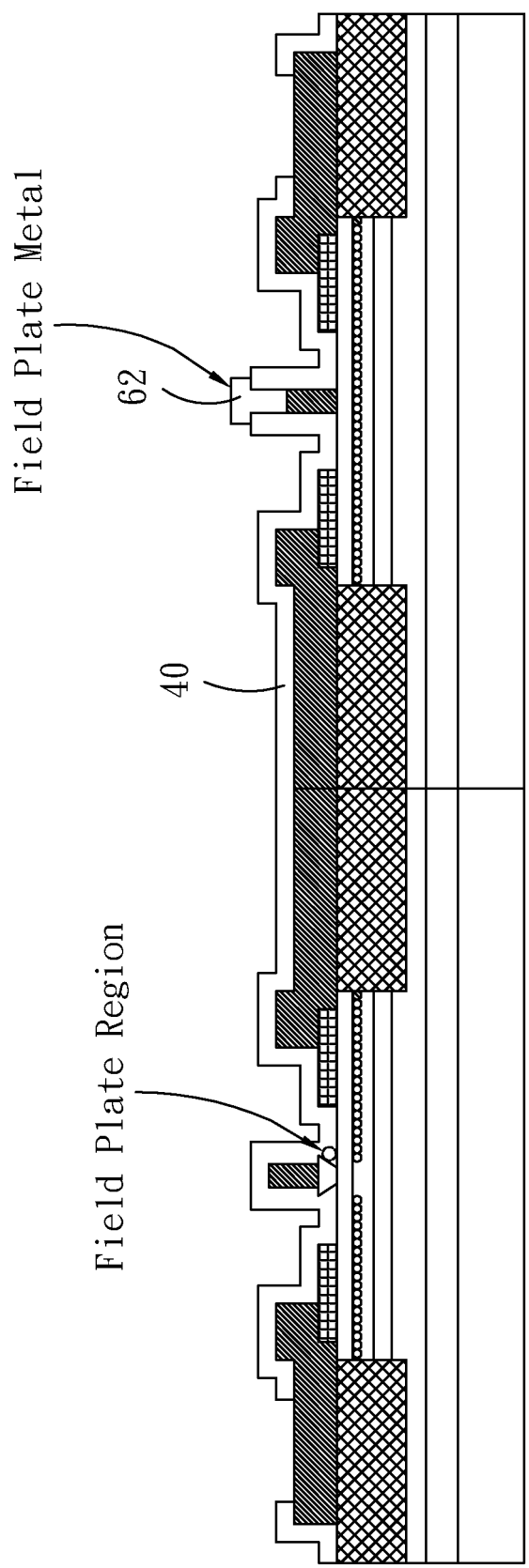
Figures 2, 12F:
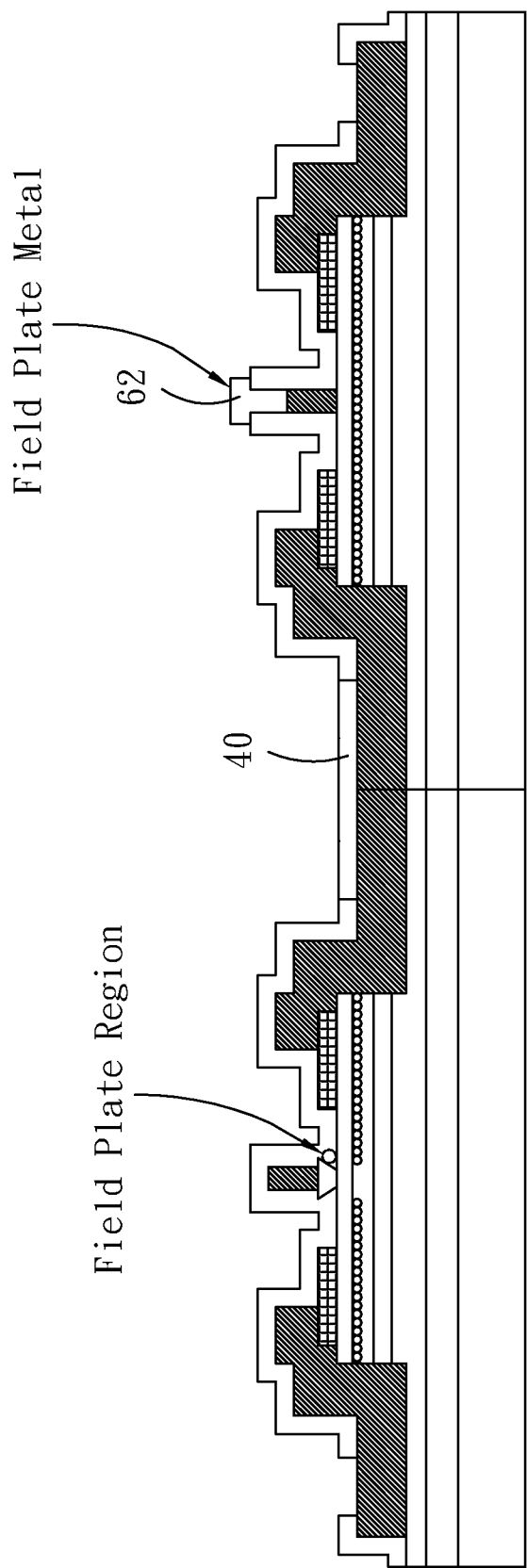
Figures 1, 13A:
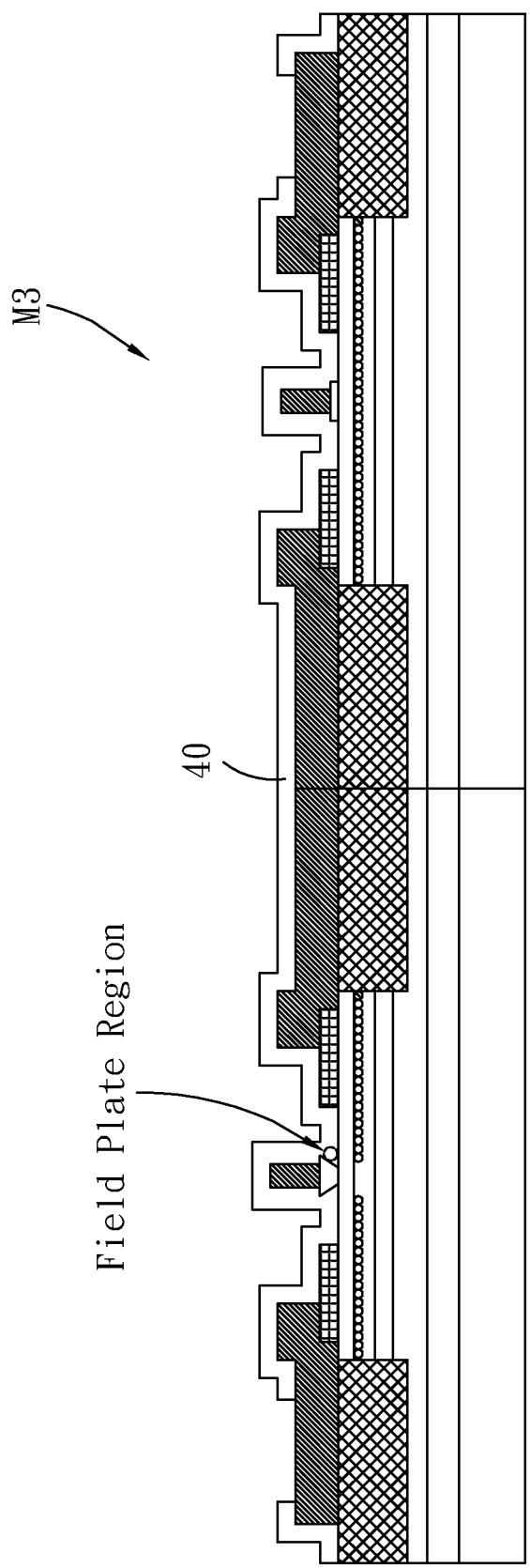
Figures 2, 13A:
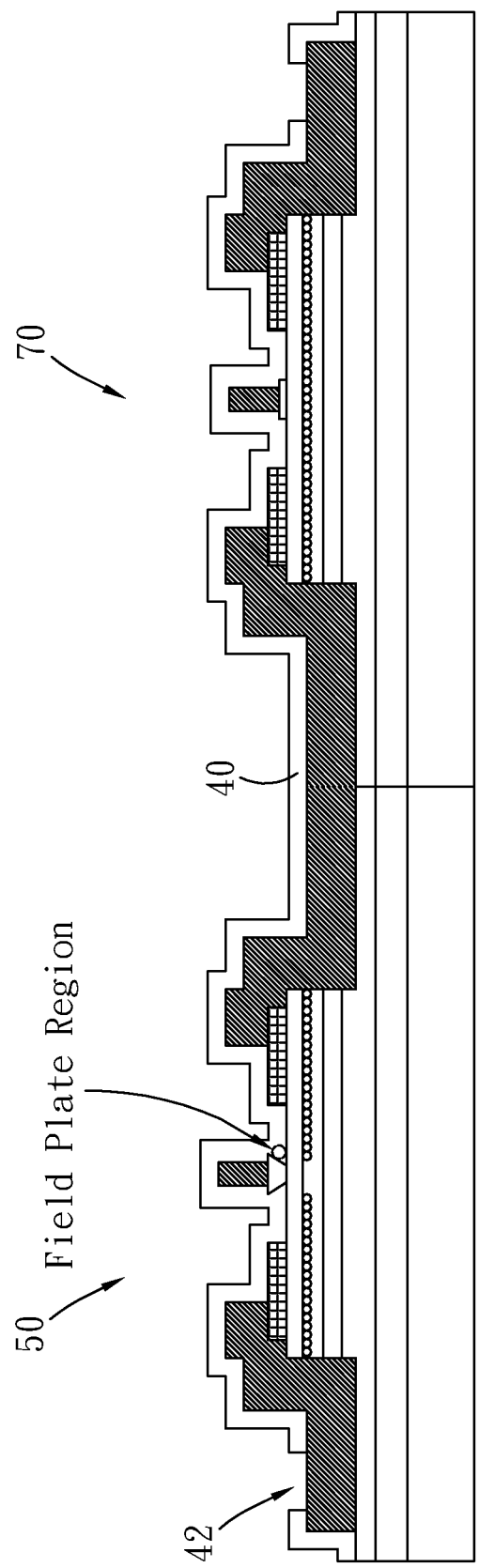
Figure 13B:
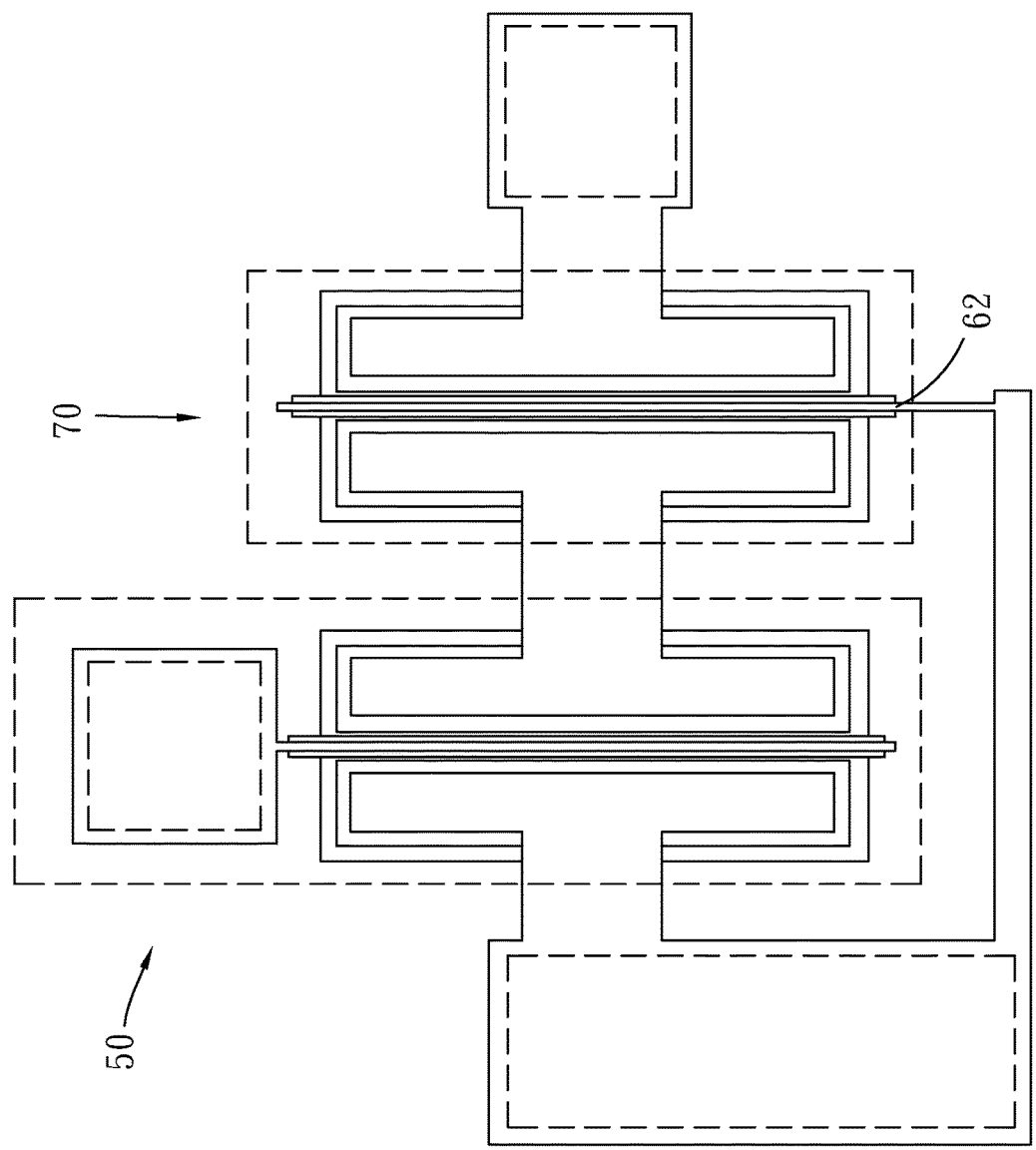
FIG. 13B shows a top view of the transistors in FIGS. 13A-1 and 13A-2.

Likewise, because p-GaN gate is an inverted trapezoidal structure, as shown in FIG. 12B, a sloped capacitor will be formed. This capacitor will induce the field plate effect having the main function of dispersing the high-density electric field below the gate electrode, as shown in FIG. 12F-1. In addition to increasing the breakdown voltage Vds between the drain and the source of the HEMT, it also suppresses the electron trapping effect below the gate electrode and hence reducing current collapse during the operation of the HEMT.

Figure 15:
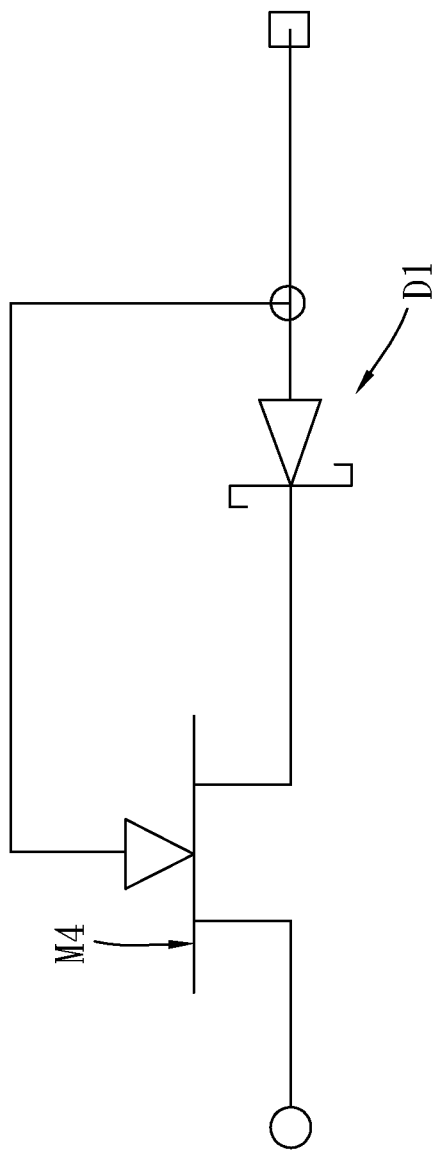
FIG. 15 shows an equivalent circuit diagram of a hybrid SBD formed by connecting the AlGaN/GaN SBD in series with the SEG p-GaN gate E-mode AlGaN/GaN HEMT.

Embodiment 5: As shown in FIGS. 16A-1, 16A-2, and 16B, a SEG p-GaN gate E-mode AlGaN/GaN HEMT M4 is connected in series with a SEG p-GaN anode AlGaN/GaN SBD D1 to form a hybrid SBD. FIG. 15 shows the equivalent circuit diagram of the above architecture. A SEG p-GaN anode AlGaN/GaN SBD is connected in series with an SEG p-GaN gate AlGaN/GaN E-mode HEMT. When a positive voltage is applied to the anode, the SBD will be turned on. In addition, because the anode also applies the positive voltage to the gate, the E-mode HEMT is completely turned on as well. Thereby, current can flow to the cathode smoothly. When a positive voltage is applied to the cathode, the voltage Vgs of the AlGaN/GaN E-Mode HEMT is negative. Hence, the GaN E-mode HEMT is shut off, and thus protecting the SEG p-GaN anode AlGaN/GaN SBD from breakdown under reverse bias. Besides, because the SEG p-GaN gate AlGaN/GaN E-mode HEMT is a current negative temperature coefficient device while the SEG p-GaN anode AlGaN/GaN SBD is a current positive temperature coefficient device, they are complementary to each other once connected in series. Accordingly, while this hybrid device is operating at a fixed voltage, its current won't be influenced Easily by temperature changes.

The feature of this hybrid SBD is that, as described above, 2DEG cannot exist below the SEG p-GaN anode and the SEG p-GaN gate unless a positive voltage is applied. Thereby, when a reverse bias is applied to the cathode, the reverse breakdown voltage can be increased and the reverse leakage current can be suppressed effectively.

Figures 1, 16A:
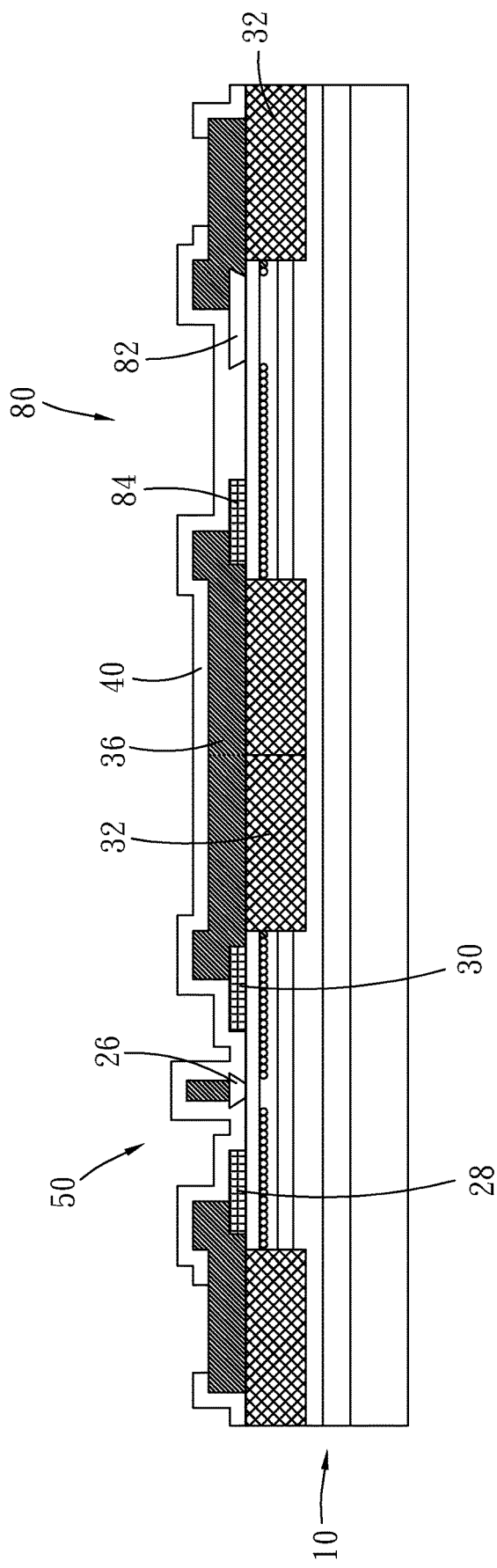
Figures 2, 16A:
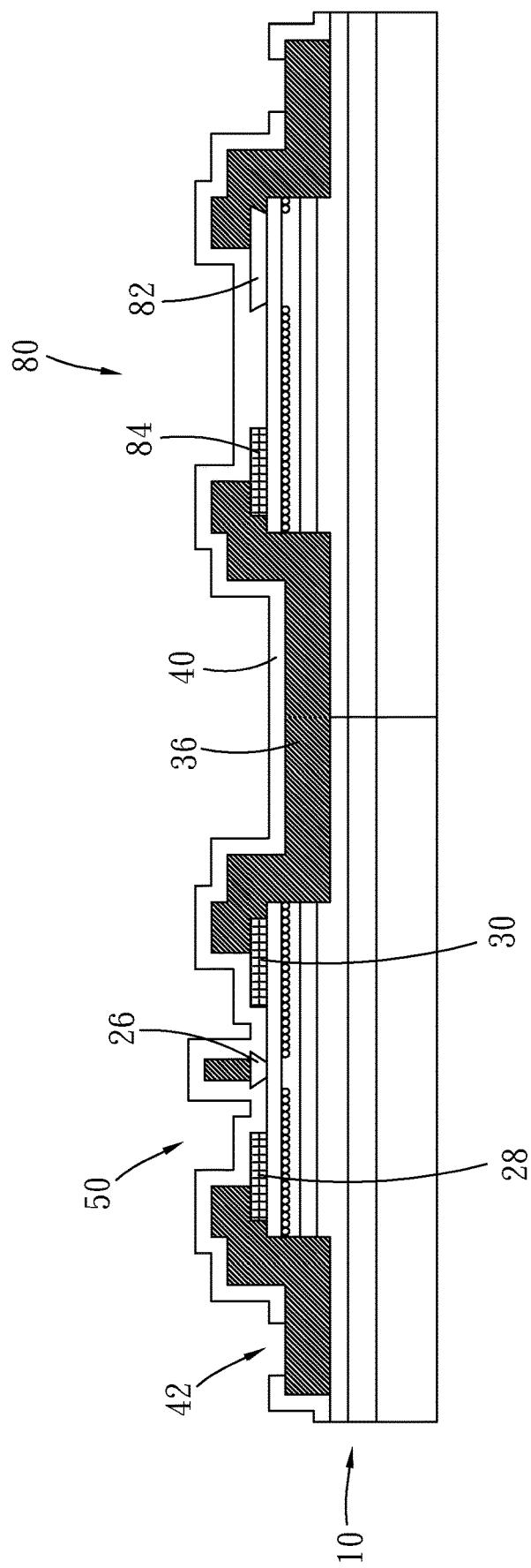
Figure 16B:
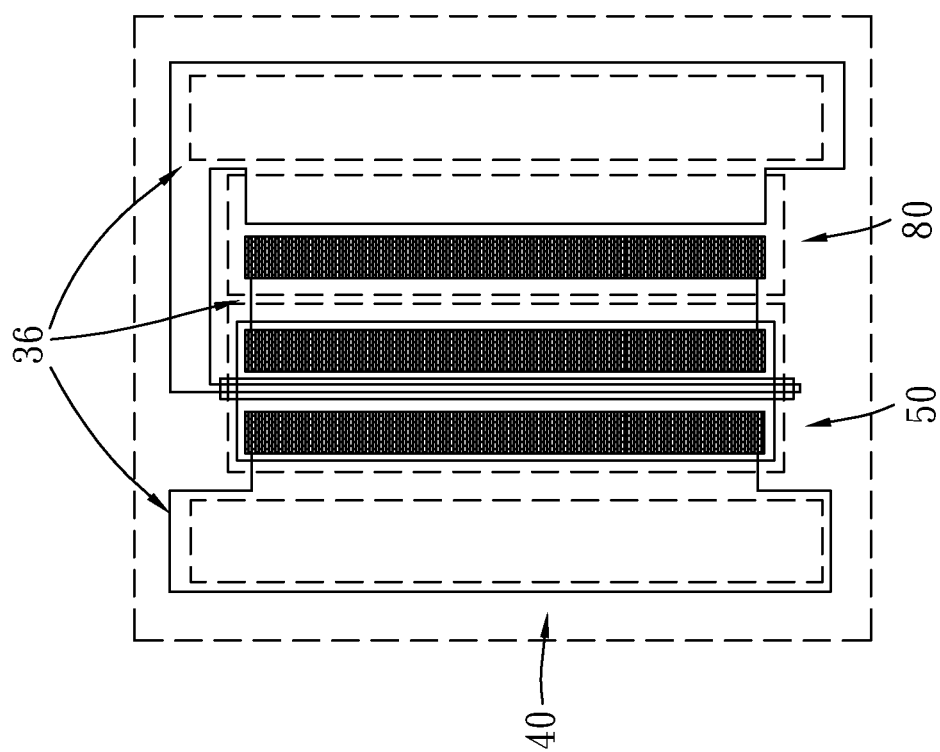
FIG. 16B shows a top view of FIGS. 16A-1 and 16A-2.

As shown in FIGS. 16A-1 to 16B, the hybrid SBD according to Embodiment 5 comprises the epitaxial structure of AlGaN/GaN designed according to the present invention and is divided into a left region and a right region. In the left region, a SEG p-GaN gate E-mode AlGaN/GaN HEMT 50 is formed. This SEG p-GaN gate E-mode AlGaN/GaN HEMT includes a p-GaN inverted trapezoidal gate structure 26. In addition, although the 2DEG is formed at the junction i-Al(x)GaN/i-GaN of the i-GaN channel layer, due to the existence of the p-GaN inverted trapezoidal structure 26, the 2DEG below the p-GaN inverted trapezoidal structure 26 in the i-GaN channel layer will be depleted. In the right region, a SEG p-GaN anode AlGaN/GaN SBD 80 is formed, which includes a p-GaN inverted anode structure 82. Thereby, the 2DEG below the p-GaN inverted anode structure 82 in the i-GaN channel layer will be depleted.

The process for fabricating the present embodiment will be the same as the one for fabricating the previous embodiment. Hence, the details will not be repeated. The main difference is described as follow. A patterned silicon dioxide mask layer is formed on the epitaxial structure of Ga-face AlGaN/GaN. The left region includes an inverted trapezoidal structure opening while the right region includes an anode structure opening for defining the gate SEG region in the left region and the anode structure SEG region in the right region. Then, p-GaN is grown in the openings. Afterwards, the patterned silicon dioxide mask layer is removed for forming a p-GaN inverted trapezoidal gate structure and a p-GaN inverted trapezoidal anode structure. Next, the drain and source ohmic contacts 28, 30 are formed in the left region and the cathode ohmic contact 84 is formed in the right region concurrently. Afterwards, device isolation is fabricated.

Then, metal vapor deposition and metal lift-off methods are used to form the metal layer 36, which is used as the gate electrode and the related wiring, such as the drain and source bonding pad regions and the interconnection metal, and the anode and cathode bonding pad regions and the interconnection metal. Furthermore, the drain and anode metals are connected. In addition, in this step, the metal wiring required for device operations can be formed concurrently. For example, the gate bonding pad region connected electrically with the gate electrode can be formed concurrently. Nonetheless, the present invention is not limited to the top views of the present invention. Finally, a patterned passivation layer 40 is formed on the epitaxial layer and a portion of the metal layer 36 is exposed.

Figures 1, 17A:
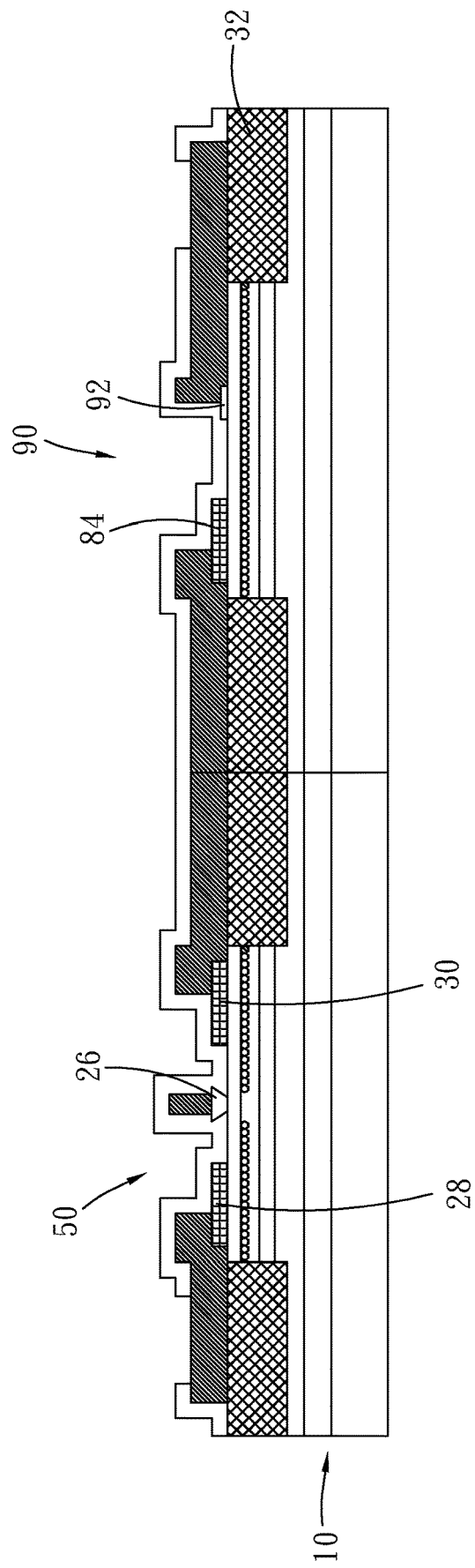
Figures 2, 17A:
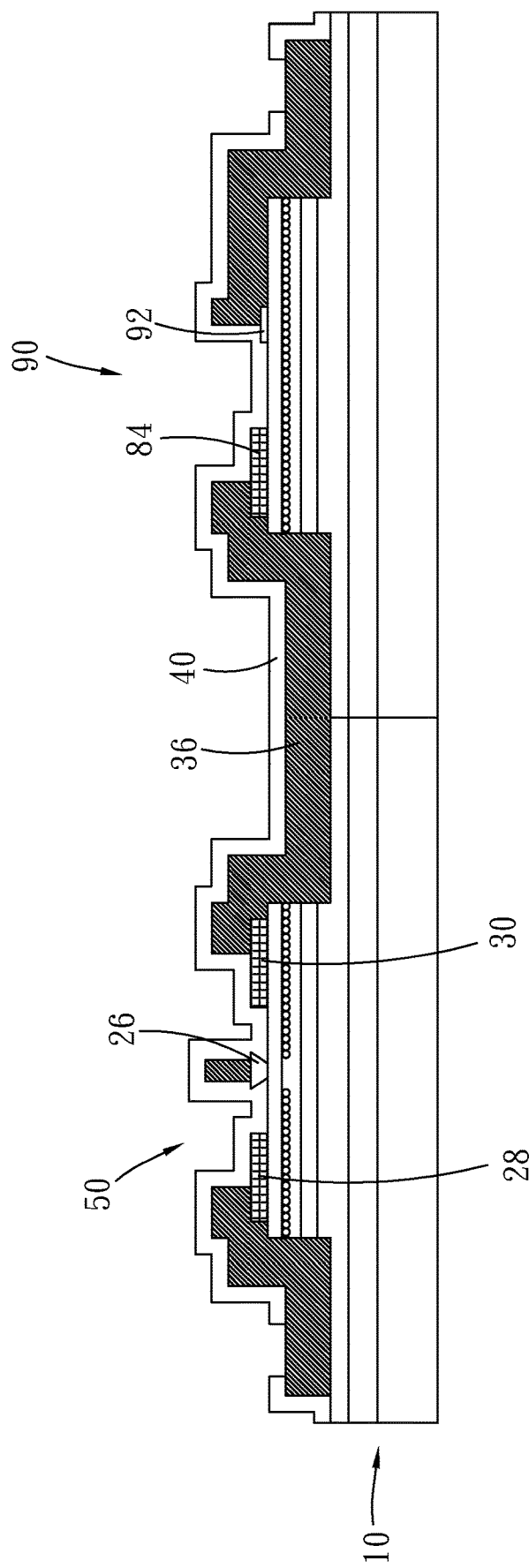
Figure 17B:
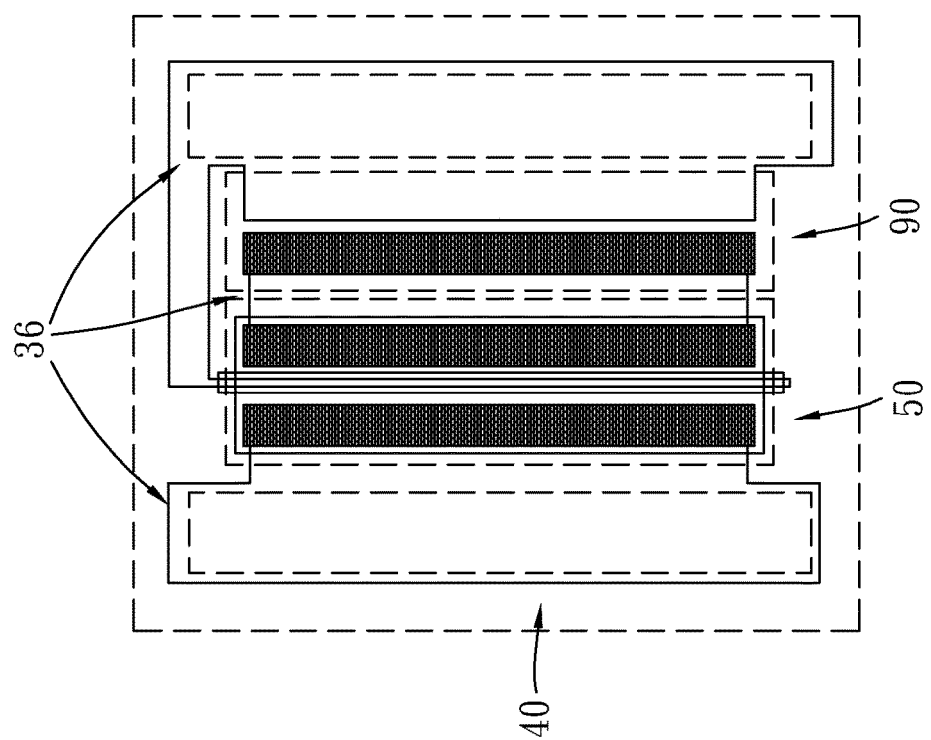
FIG. 17B shows a top view of FIGS. 17A-1 and 17A-2.

As shown in FIGS. 17A-1 to 17B, in Embodiment 6, a SEG p-GaN gate E-mode AlGaN/GaN HEMT 50 is connected in series with a field-plate anode AlGaN/GaN SBD 90 to form a hybrid SBD.

As shown in the figures, the hybrid SBD according to Embodiment 6 comprises the epitaxial structure of AlGaN/GaN designed according to the present invention and is divided into a left region and a right region. In the left region, a SEG p-GaN gate E-mode AlGaN/GaN HEMT 50 is formed. This SEG p-GaN gate E-mode AlGaN/GaN HEMT includes a p-GaN inverted trapezoidal gate structure 26. In addition, although the 2DEG is formed at the junction i-Al(x)GaN/i-GaN of the i-GaN channel layer, due to the existence of the p-GaN inverted trapezoidal structure 26, the 2DEG below the p-GaN inverted trapezoidal structure 26 in the i-GaN channel layer will be depleted. In the right region, a field-plate anode AlGaN/GaN SBD having a field-plate anode 92 is formed.

The features of this hybrid SBD are the field-plate anode and the SEG p-GaN gate. As described above, 2DEG cannot exist below the p-GaN gate unless a positive voltage is applied. Thereby, when a reverse bias is applied to the cathode, the reverse breakdown voltage can be increased and the reverse leakage current can be suppressed effectively.

Although the functions and characteristics of Embodiments 6 and 5 are similar, the reverse breakdown of Embodiment 5 is higher at the expense of a higher startup voltage Vf. On the contrary, the reverse breakdown of Embodiment 6 is lower. But it also features a lower startup voltage Vf. Hence, according to different application requirements, these two solutions can be considered.

The main difference in the processes of Embodiment 6 and Embodiment 5 is described as follow. A patterned silicon dioxide mask layer is formed on the epitaxial structure of Ga-face AlGaN/GaN. The left region includes an inverted trapezoidal structure opening for defining the gate SEG region in the left region. Then, p-GaN is grown in the openings. Afterwards, the patterned silicon dioxide mask layer is removed for forming a p-GaN inverted trapezoidal gate structure 26. Next, device isolation is fabricated. Then, a field-plate anode oxide layer 92 is formed in the right region, the drain and source ohmic contacts 28, 30 are formed in the left region, and the cathode ohmic contact 84 is formed in the right region concurrently, as the structures shown in FIG. 17A-1 or FIG. 17A-2.

Next, as described above, form the metal layer 36 for the gate electrode and the related wiring. Finally, a patterned passivation layer 40 is formed on the epitaxial layer and a portion of the metal layer 36 is exposed, as the top view shown in FIG. 17B.

Embodiment 7: SEG p-GaN gate and self-aligned gate metal E-mode AlGaN/GaN HEMT.

As shown in the FIGS. 18A-1, 18A-2, and 18B, the transistor according to the present embodiment comprises the epitaxial structure of AlGaN/GaN. A p-GaN inverted trapezoidal gate structure 26, a first source metal layer 28, and a first drain metal layer 30 are formed on the i-Al(x)GaN layer of the epitaxial structure. In addition, although the 2DEG is formed at the junction i-Al(x)GaN/i-GaN of the i-GaN channel layer, due to the existence of the p-GaN inverted trapezoidal gate structure 26, the 2DEG below the p-GaN inverted trapezoidal gate structure 26 in the i-GaN channel layer will be depleted. The i-Al(x)GaN layer of the epitaxial structure includes a first source ion implantation region 101 and a first drain ion implantation region 102. Besides, the first source ion implantation region 101 is located below the first source metal layer 28, while the first drain ion implantation region 102 is located below the first drain metal layer 30. Moreover, a first gate metal layer 103 is disposed on the p-GaN inverted trapezoidal gate structure 26.

The major difference between the SEG p-GaN gate and self-align gate metal E-mode AlGaN/GaN HEMT and the SEG p-GaN gate HEMT described in the previous embodiment is the contact area ratio of the gate metal and the SEG p-GaN gate. According to the principle of the previous embodiment, when Vgs is much greater than VF, the conduction current of the SBD between the gate G and the drain D is so large that holes cannot be confined and accumulated in the channel below the gate G. Massive holes will be injected into the channel layer and making the gate leakage current increase rapidly. Hence, the transistor can no longer operate in the desired condition. Accordingly, the limited value of Vgs is always the shortcoming of a p-GaN gate E-mode AlGaN/GaN HEMT. Fortunately, the contact area ratio of the SEG p-GaN gate and self-aligned gate metal E-mode AlGaN/GaN HEMT and the SEG p-GaN gate is much larger than the one according to the previous embodiment (completely covered p-GaN gate). Thereby, when Vgs is greater than VF, the injected holes by the gate is more uniform. The electric field distribution is more uniform as well. Accordingly, Vgs max (self-aligned gate metal) is greater than Vgs max.

A thermal treatment at 700~900° C. is required for the drain and source electrodes to form ohmic contacts with i-Al(x)GaN. In a general HEMT fabrication process, the gate metal is fabricated after the thermal treatment for the drain and source electrodes. Thereby, the Schottky contact between the gate metal and the i-Al(x)GaN will not be damaged due to this high-temperature thermal treatment. Nonetheless, for the SEG p-GaN gate and self-aligned gate metal HEMT, the gate metal is fabricated prior to the drain and source electrodes. In order to prevent damages on the characteristics of the Schottky contact formed by the gate and the i-Al(x)GaN by the thermal treatment, multiple ion implantation is adopted to implant n-type silicon dopants below the drain and source electrodes. Thereby, the drain and source can form ohmic contacts with the i-Al(x)GaN without the 700~900° C. thermal treatment.

Figure 19A:
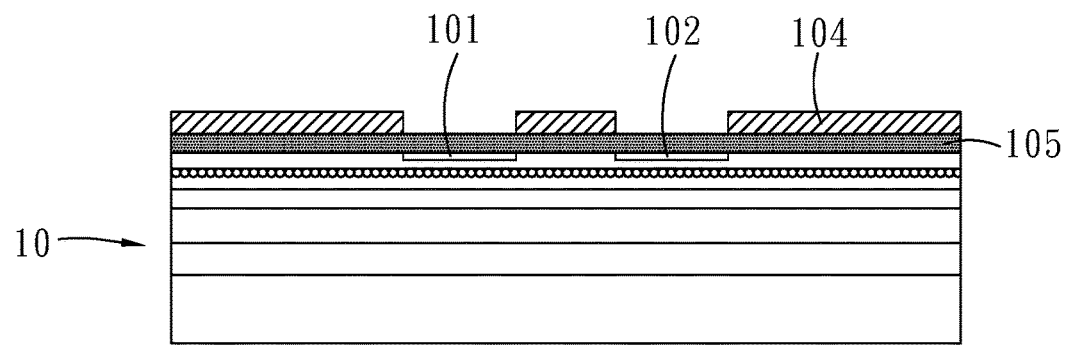

Step 71: Use the multiple ion implantation to implant n-type silicon dopants below the drain and source electrodes and activate by thermal treatment to form a first source ion implantation region 101 and a first drain ion implantation region 102. The ion implantation is shallow and concentration distribution of ions implanted into the i-Al(x)GaN is Gaussian. We expect the peak value of the Gaussian distribution is as close to the surface of the i-Al(x)GaN as possible, as shown in FIG. 19A. First, use PECVD to deposit a layer of SiO2 mask 105 as a buffer layer. Thereby, in ion implantation, the peak value of the Gaussian distribution is close to the surface of the i-Al(x)GaN. Next, use photolithography to form a patterned photoresist layer 104 and define the ion implantation regions below the drain and source electrodes. Then, the multiple ion implantation is adopted to implant n-type silicon dopants below the drain and source electrodes. After the ion implantation is finished, remove the patterned photoresist layer 104 and the SiO2 mask 105.

Afterwards, a thermal treatment at a temperature greater than 600□ is performed for activating the n-type silicon dopants and forming the first source ion implantation region 101 and the first drain ion implantation region 102. This thermal treatment can be performed after the step S71. In other words, after the steps of ion implantation and removal of the patterned photoresist layer 104 and the SiO2 mask 105, thermal treatment at a temperature greater than 600° C. is performed for activation. Alternatively, in the subsequent SEG p-GaN gate using MOCVD, the high temperature for growth can be used for activation.

Figure 19B:
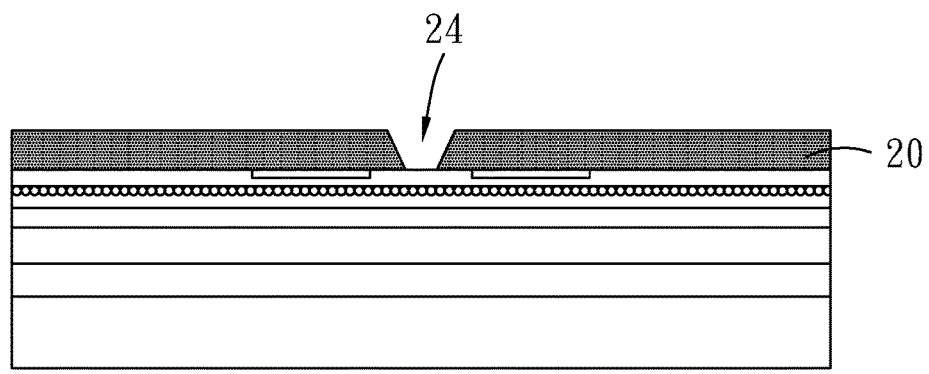

Step S72: Please refer to FIG. 19B as well. Define the SEG p-GaN gate and self-aligned gate metal region. Deposit a silicon dioxide mask layer 20 using PECVD with a thickness greater than 2500 nm. Next, define the gate SEG region by using photoresist and photolithography method. Finally, the silicon dioxide mask layer 20 in the region is etched by a wet etching method using BOE to expose the surface of the epitaxy. Then, the photoresist is stripped using stripper. Because the wet etching is isotropic, in addition to etching downward, lateral etching will occur concurrently. Thereby, the opening of the silicon dioxide mask layer 20 will form an inverted-trapezoidal-structure opening.

Figure 19C:
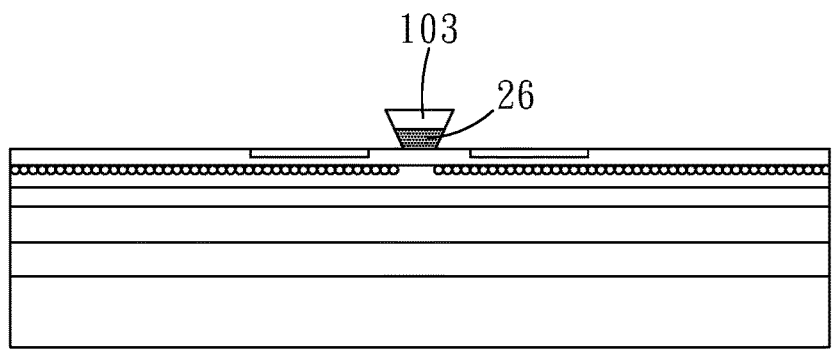

Step S73: Form the SEG p-GaN gate and self-aligned gate metal. First, p-GaN SEG is performed using MOCVD and only the exposed surface of the epitaxy can grow p-GaN. Because the growth of p-GaN in MOCVD is also isotropic, in addition to growing upward, lateral growth will occur concurrently and thus forming an inverted trapezoidal structure of p-GaN, which is just the p-GaN inverted trapezoidal structure 26. Afterwards, gate electrode is coated using metal coating. Finally, the silicon dioxide mask layer is etched by a wet etching method and the metal outside the gate electrode region is lift off, forming the self-aligned gate metal 102 on the p-GaN inverted trapezoidal structure 26, as the structure shown in FIG. 19C.

Figure 19D:
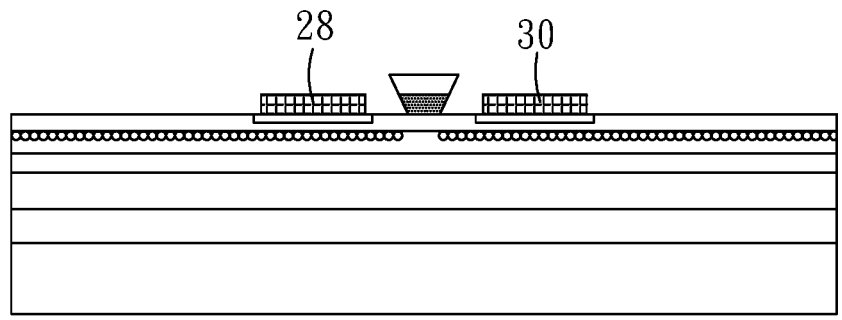

Step S74: Use metal vapor deposition and lift-off methods to form drain and source electrodes 28, 30, as shown in FIG. 19D.

Figures 1, 19E:
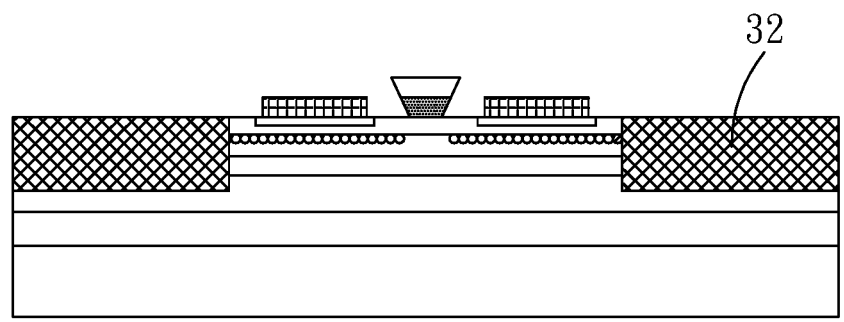
Figures 2, 19E:
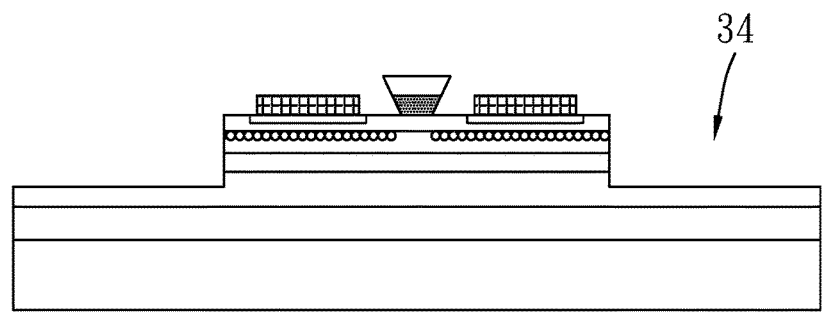

Step S75: Perform device isolation process. As shown in FIG. 19E-1, the multiple-energy destructive ion implantation is adopted. Alternatively, dry etching to the highly resistive i-GaN buffer layer (C-doped) can be adopted for isolating devices, as shown in FIG. 19E-2.

Figures 1, 19F:
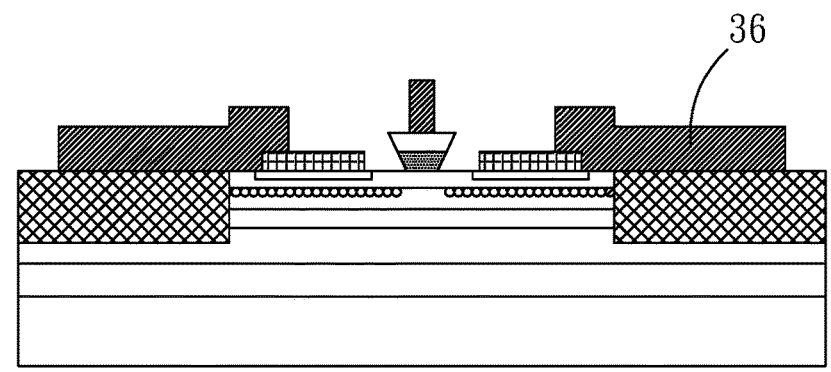
Figures 2, 19F:
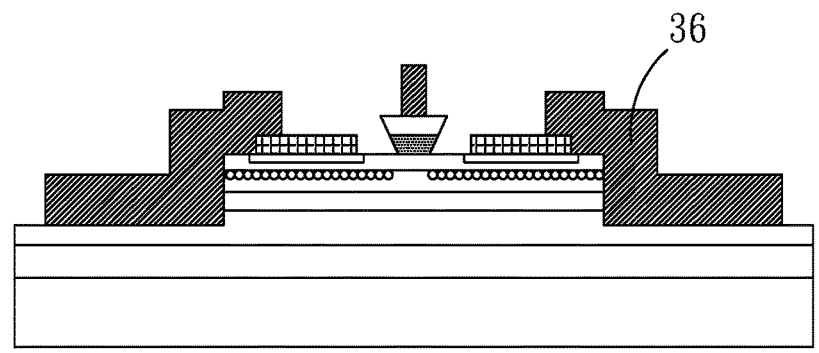

Step S76: Perform the metal wiring process. Use metal vapor deposition (normally Ni/Au) and metal lift-off methods to form the gate electrode, the bonding pad regions for the drain and source electrodes, and the interconnection metal layer 36, as shown in FIG. 19F-1 or FIG. 19F-2.

Step S77: Pattern the passivation layer. A passivation layer 40 is grown by PECVD. The thickness is 1000A~2000A. This passivation layer 40 should not be too thick, or stress will be applied to devices and changing the original polarization. Finally, the passivation layer 40 is patterned for exposing a portion of the metal layer 36, as shown in FIGS. 18A-1, 18A-2, and 18B. For example, etching is adopted for exposing the bonding pad region for subsequent wire bonding.

Figures 1, 18A:
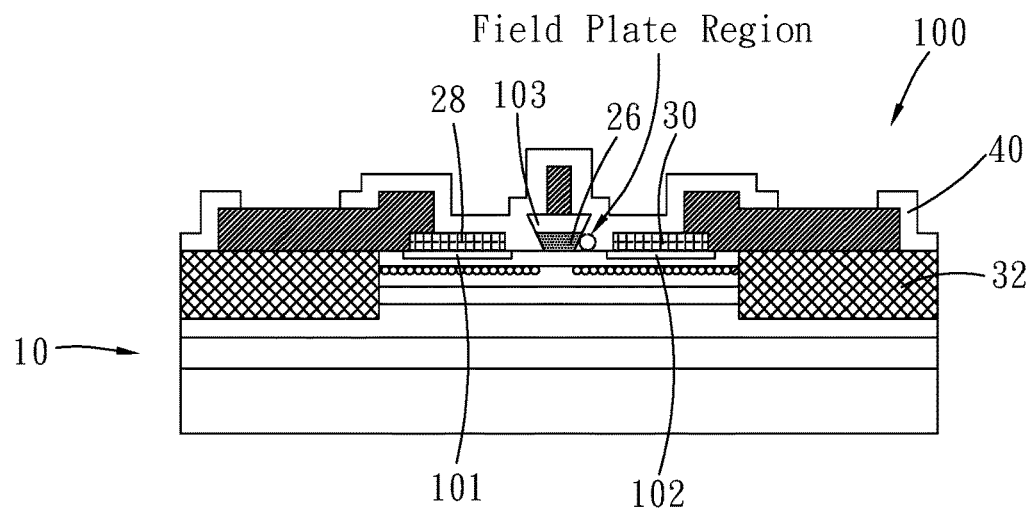
Figures 2, 18A:
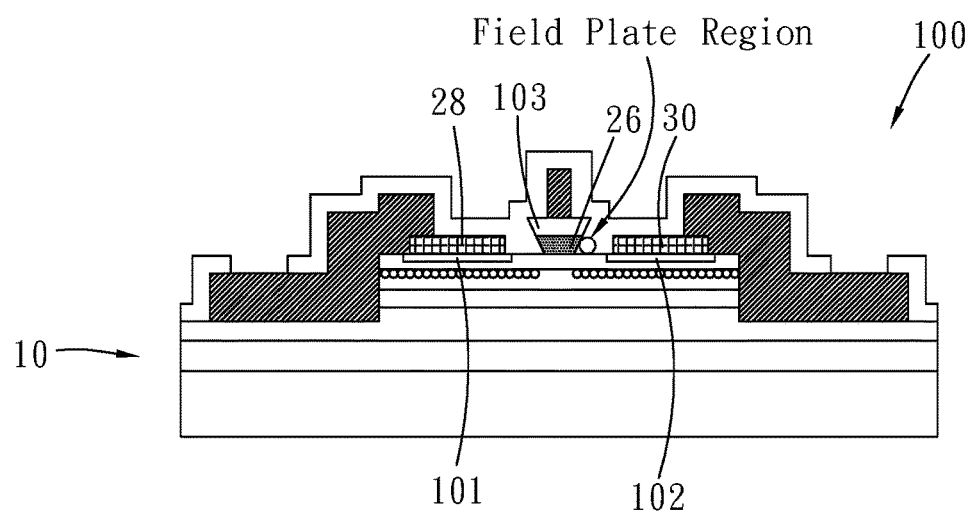
Figure 18B:
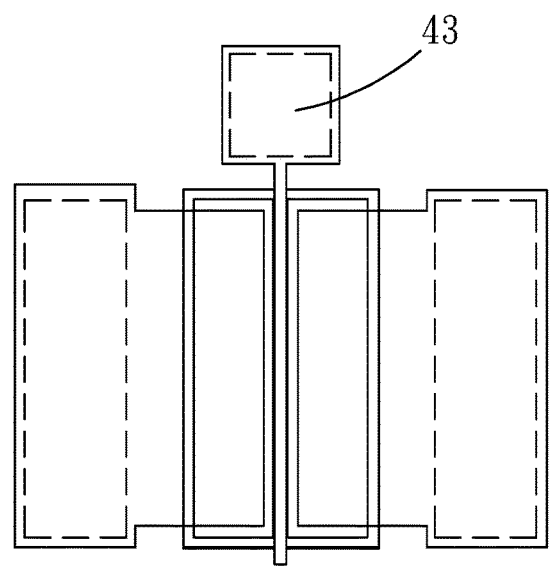
FIG. 18B shows a top view of FIGS. 18A-1 and 18A-2.

Because p-GaN is an inverted trapezoidal gate structure 26, as shown in FIGS. 18A-1 and 18A-2, a sloped capacitor will be formed at the dashed circle. This capacitor will induce the field plate effect having the main function of dispersing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Embodiment 8: SEG p-GaN anode and self-aligned anode metal E-mode AlGaN/GaN SBD.

Figures 1, 20A:
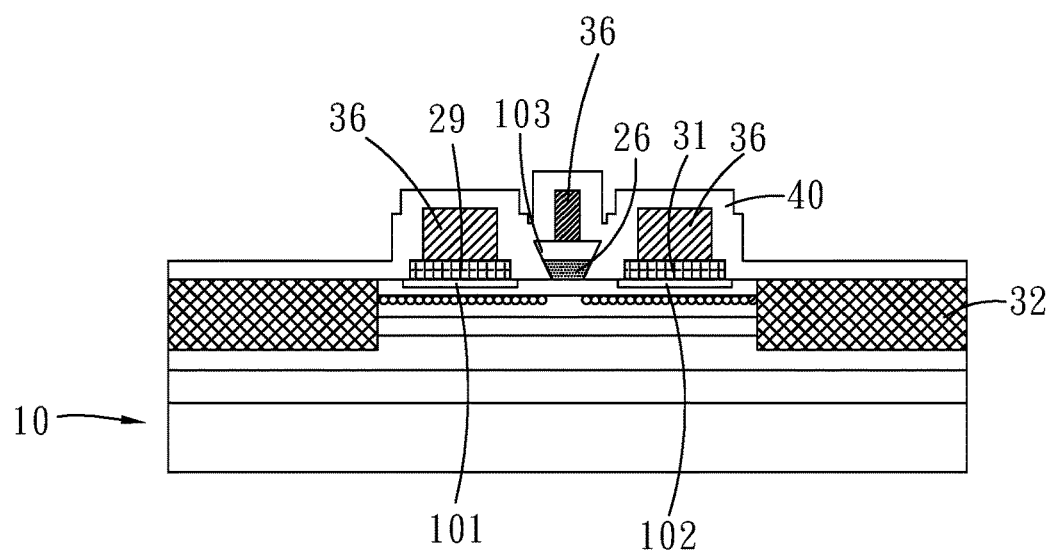
Figures 2, 20A:
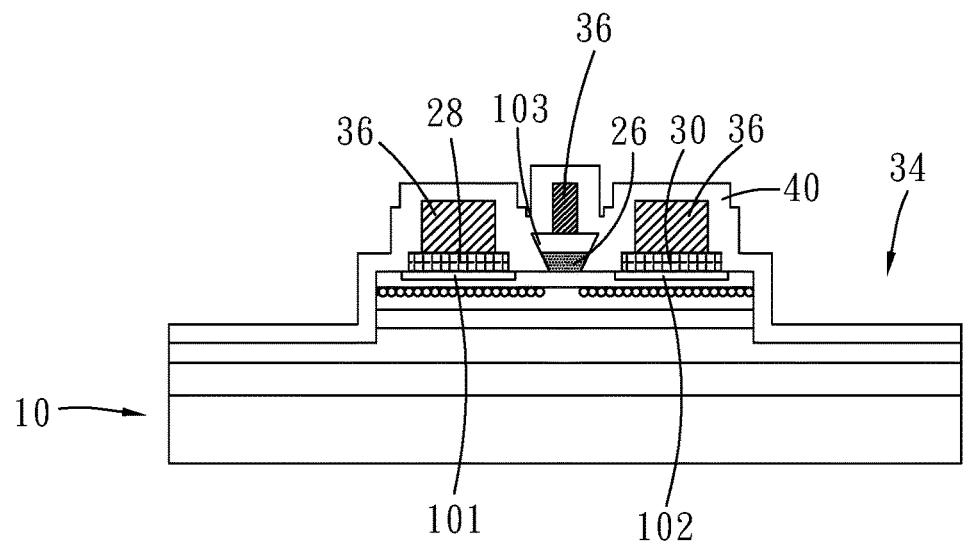
Figure 20B:
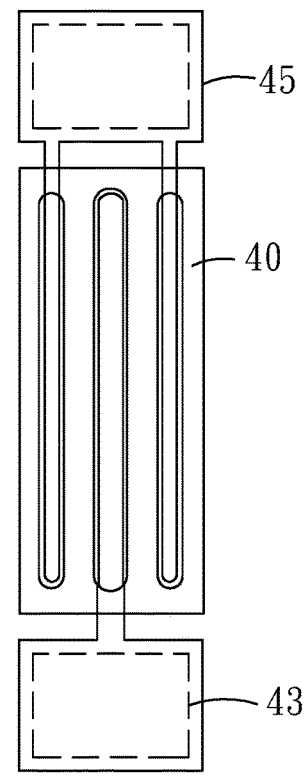
FIG. 20B shows a top view of FIGS. 20A-1 and 20A-2.
Figures 1, 21A:
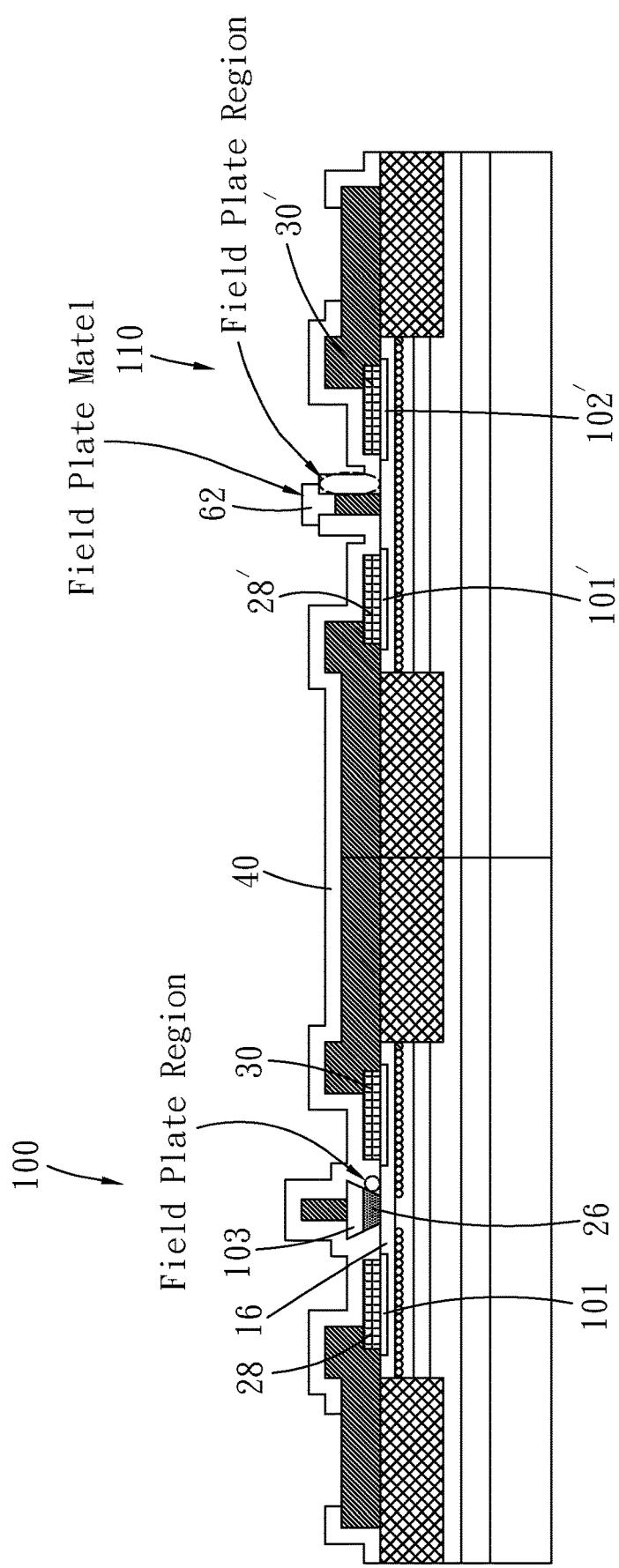
Figures 2, 21A:
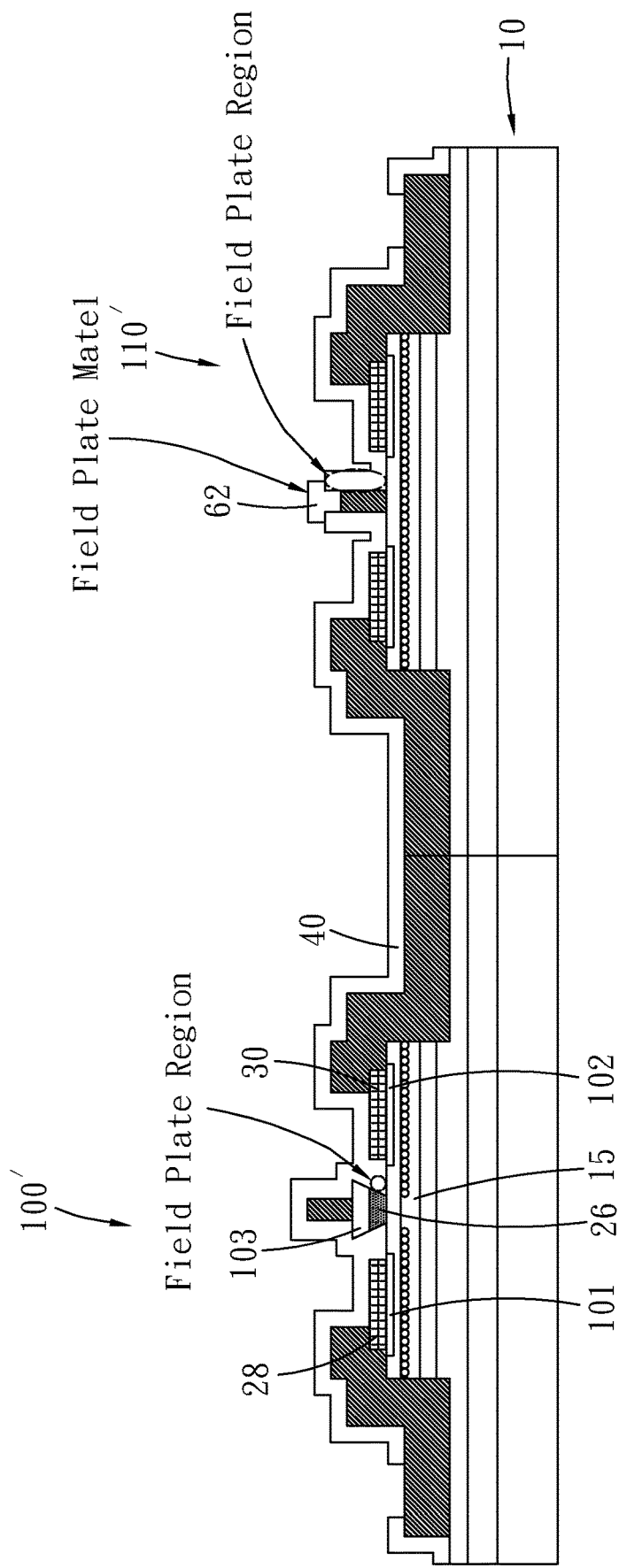
Figure 21B:
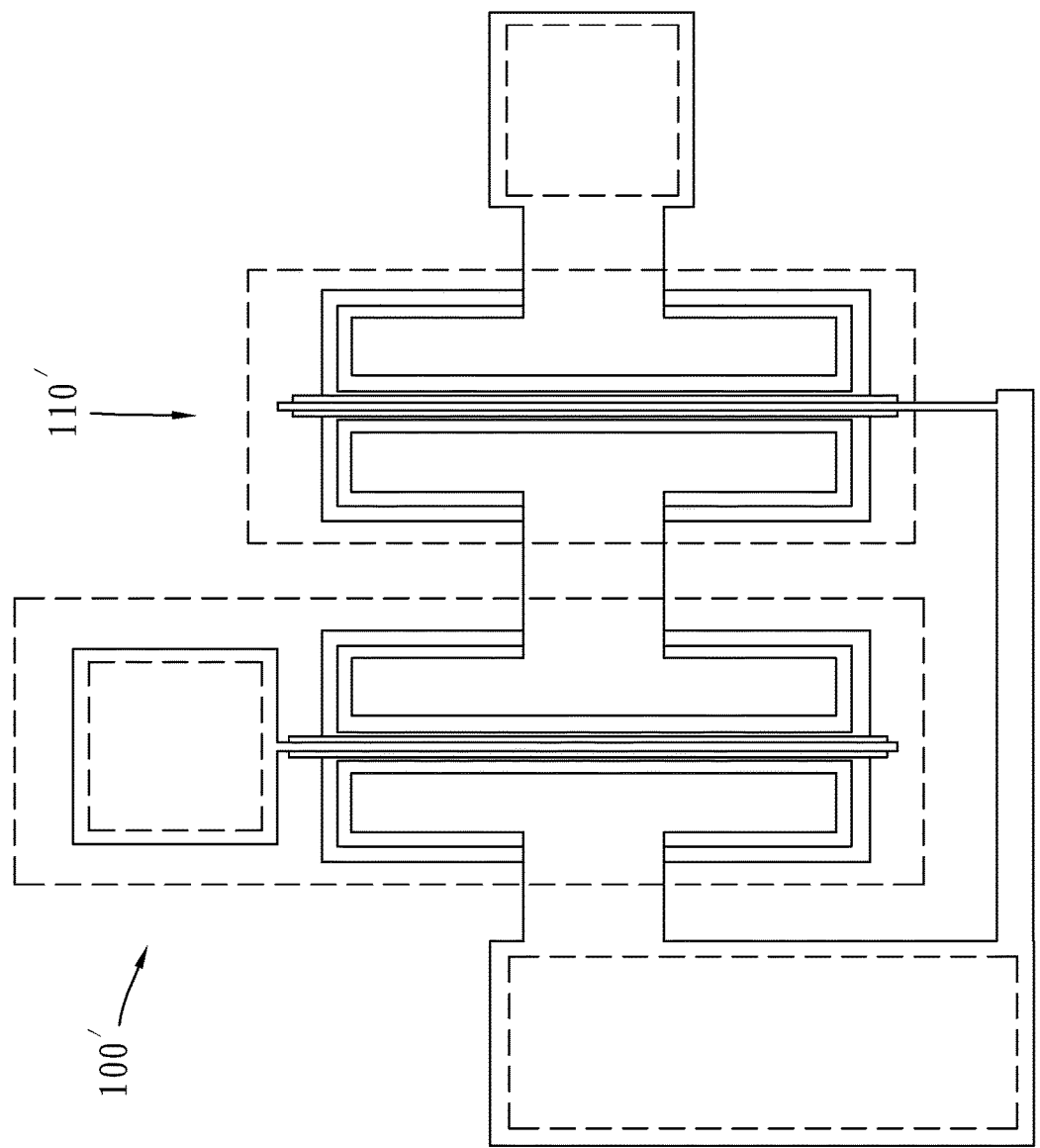
FIG. 21B shows a top view of FIGS. 21A-1 and 21A-2.

As shown in the FIGS. 20A-1, 20A-2, and 20B, the SBD according to the present embodiment comprises the epitaxial structure of AlGaN/GaN. A p-GaN inverted trapezoidal anode structure 26, a first cathode metal layer 29, and a second cathode metal layer 31 are formed on the i-Al(x)GaN layer of the epitaxial structure. In addition, although the 2DEG is formed at the junction i-Al(x)GaN/i-GaN of the i-GaN channel layer, due to the existence of the p-GaN inverted trapezoidal anode structure 26, the 2DEG below the p-GaN inverted trapezoidal structure 26 in the i-GaN channel layer will be depleted. The i-Al(x)GaN layer of the epitaxial structure includes a first cathode ion implantation region 101 and a second cathode ion implantation region 102. Besides, the first cathode ion implantation region 101 is located below the first cathode metal layer 29, while the second cathode ion implantation region 102 is located below the second cathode metal layer 31. Moreover, a self-aligned anode metal layer is disposed on the p-GaN inverted trapezoidal anode structure 26 and acting as a first gate metal layer 103. Furthermore, in addition to the above structure, a metal layer 36 enabling the operations of the SBD is also disposed, which is well known to a person having ordinary skill in the art. Hence, the details will not be described again. For example, as shown in FIG. 20B, the metal layer 36 disposed on the first gate metal layer 103 is connected to the external bonding pad region 43 for gate metal; the metal layer 36 on the first and second cathode metal layers 30 are connected to the external bonding pad region 45 for cathodes.

The fabrication steps are identical to those in Embodiment 7. Hence, the details will not be described again.

Embodiment 9: A SEG p-GaN gate and self-aligned gate metal E-mode AlGaN/GaN HEMT connected in series with a D-mode AlGaN/GaN HEMT without gate oxide to form a hybrid E-mode AlGaN/GaN HEMT.

As shown in FIGS. 21A-1, 21A-2, and 21B, the main feature of the hybrid E-mode AlGaN/GaN HEMT according to the present embodiment is the epitaxial structure of AlGaN/GaN, which is divided to a left region and a right region. A SEG p-GaN gate and self-aligned gate metal E-mode AlGaN/GaN HEMT 100 is located in the left region and includes a p-GaN inverted trapezoidal gate structure 26, a first source metal layer 28, a first drain metal layer 30, a first source ion implantation region 101 and a first drain ion implantation region 102, and a self-aligned first gate metal layer 103. The p-GaN inverted trapezoidal gate structure 26, the first source metal layer 28, and the first drain metal layer 30 are located on the i-Al(x)GaN layer 16. In addition, although the 2DEG is formed at the junction i-Al(x)GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer will be depleted. The first source ion implantation region 101 and the first drain ion implantation region 102 are located in the i-Al(x)GaN layer 16. Besides, the first source ion implantation region 101 is located below the first source metal layer 28 while the first drain ion implantation region 102 is located below the first drain metal layer 30. In addition, the self-aligned first gate metal layer 103 is located on the p-GaN inverted trapezoidal gate structure 26.

A D-mode AlGaN/GaN HEMT without gate oxide 110 is disposed in the right region. It includes a second source metal layer 28', a second drain metal layer 30', a second source ion implantation region 101', and a second drain ion implantation region 102'. The second source metal layer 28' and the second drain metal layer 30' are located on the i-Al(x)GaN layer 16. The second source ion implantation region 101' is located below the second source metal layer 28' while the second drain ion implantation region 102' is located below the second drain metal layer 30'.

The fabrication method for the present embodiment will described as follows. First, the left region of the epitaxial structure 10 is set to fabricate the SEG p-GaN gate and self-aligned gate metal E-mode AlGaN/GaN HEMT. The right region is set to fabricate the D-mode AlGaN/GaN HEMT.

Figure 22A:
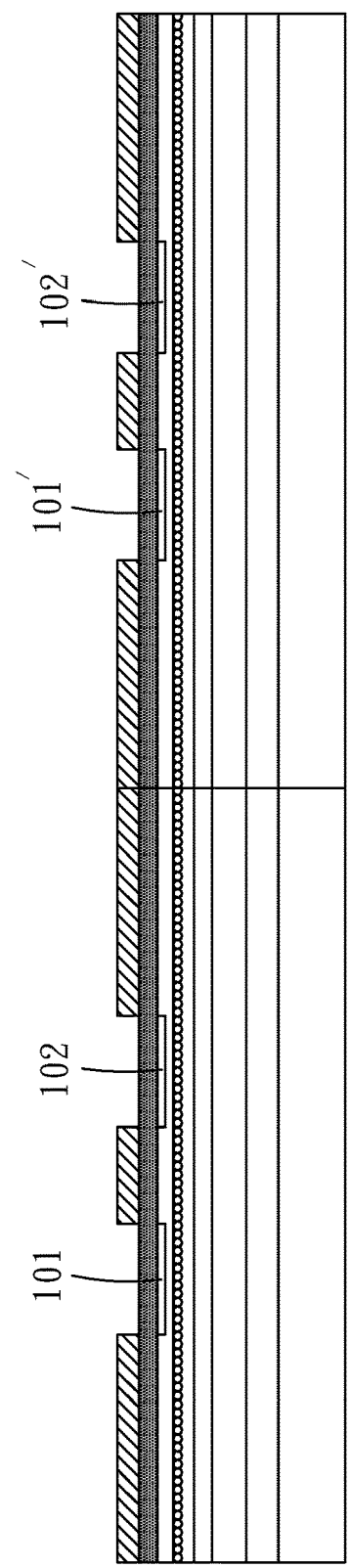

Next, as described above, use multiple ion implantation to implant n-type silicon dopants below the drain source electrodes and activate by thermal treatment to form the structure shown in FIG. 22A.

Figure 22B:
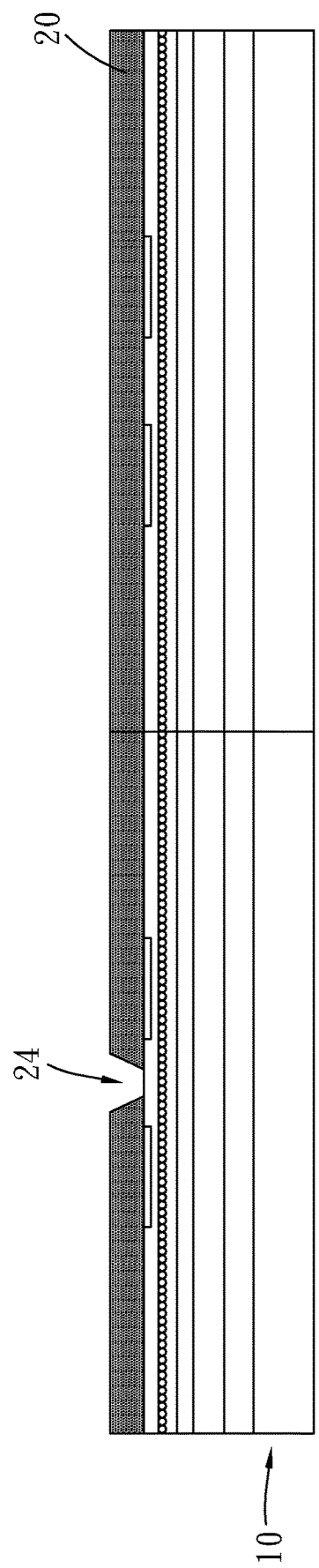
Figure 22C:
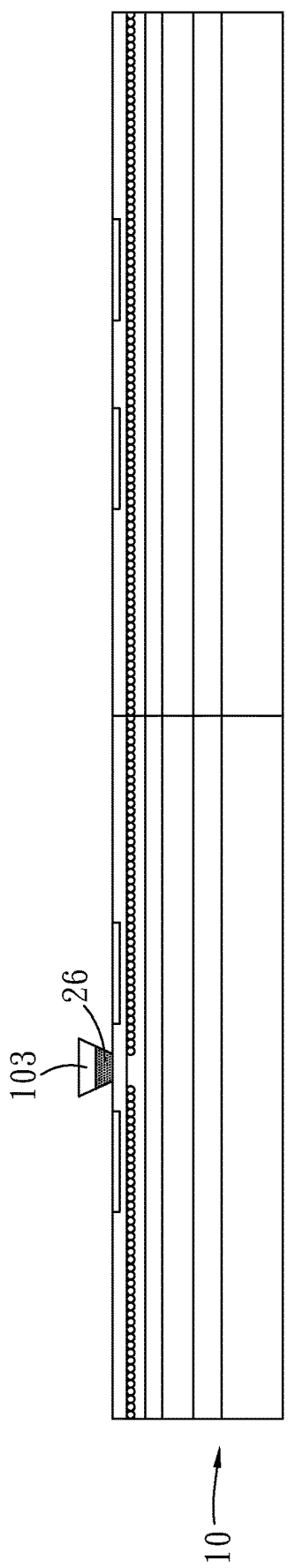
Figure 22D:
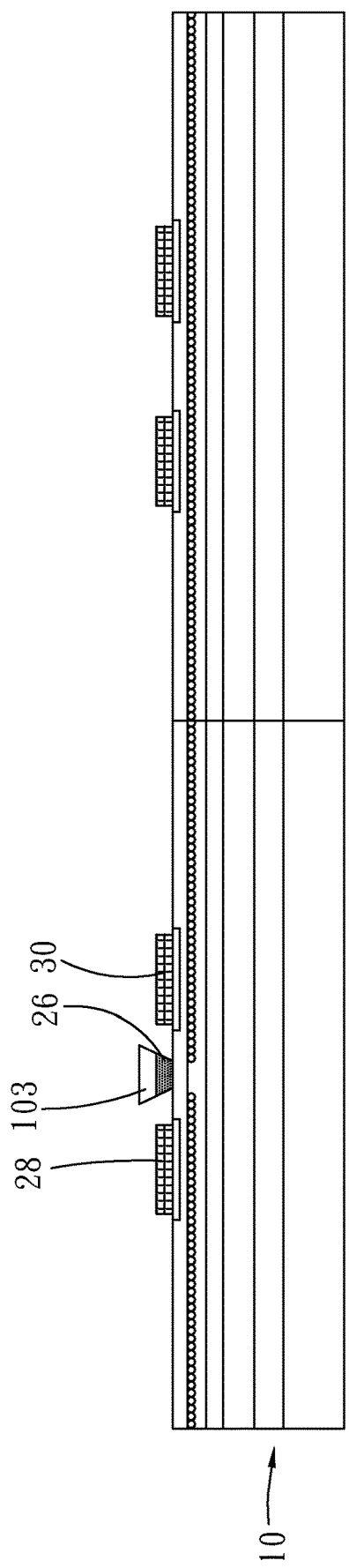
Figures 1, 22E:
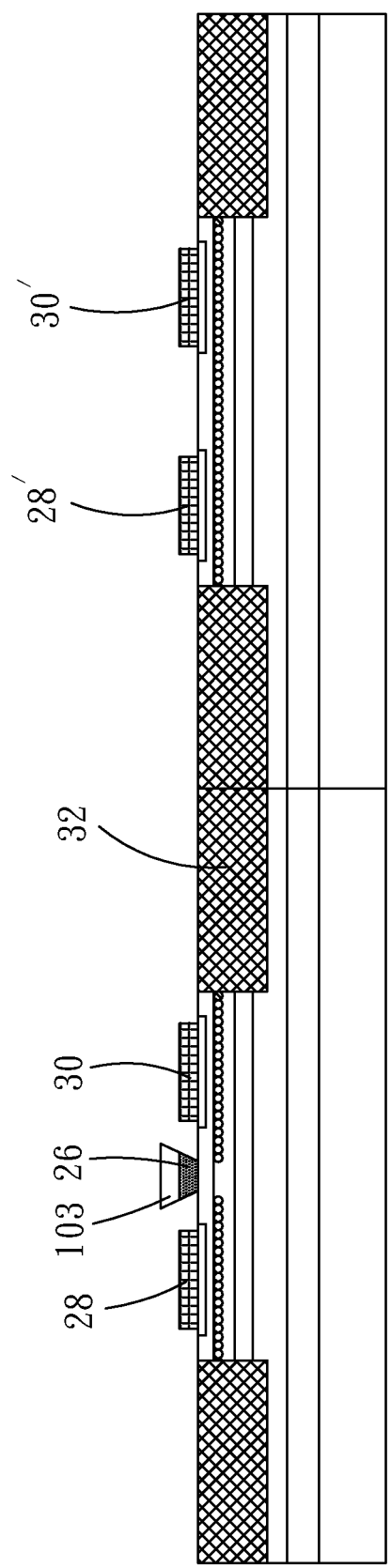
Figures 2, 22E:
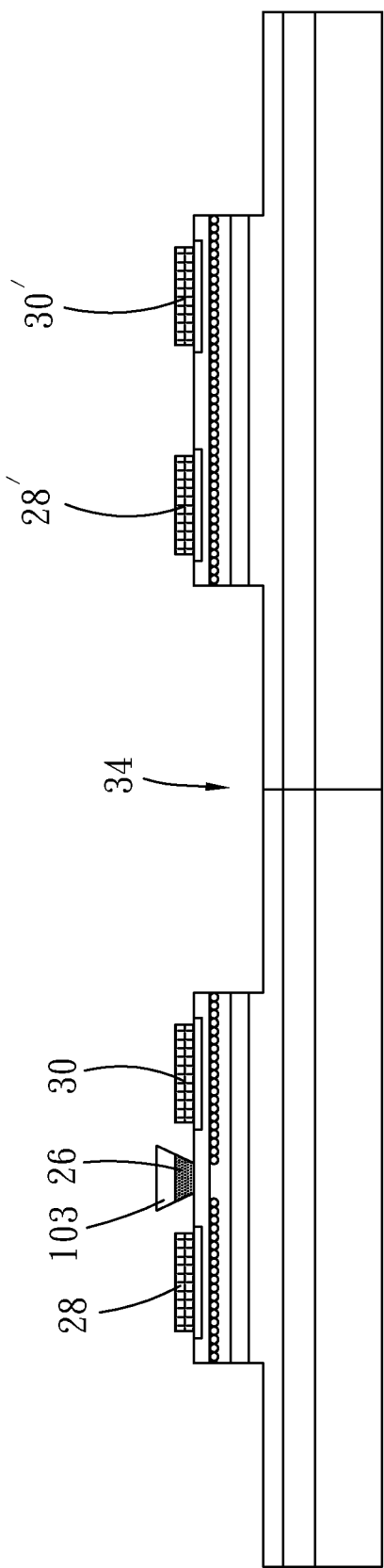
Figures 1, 22F:
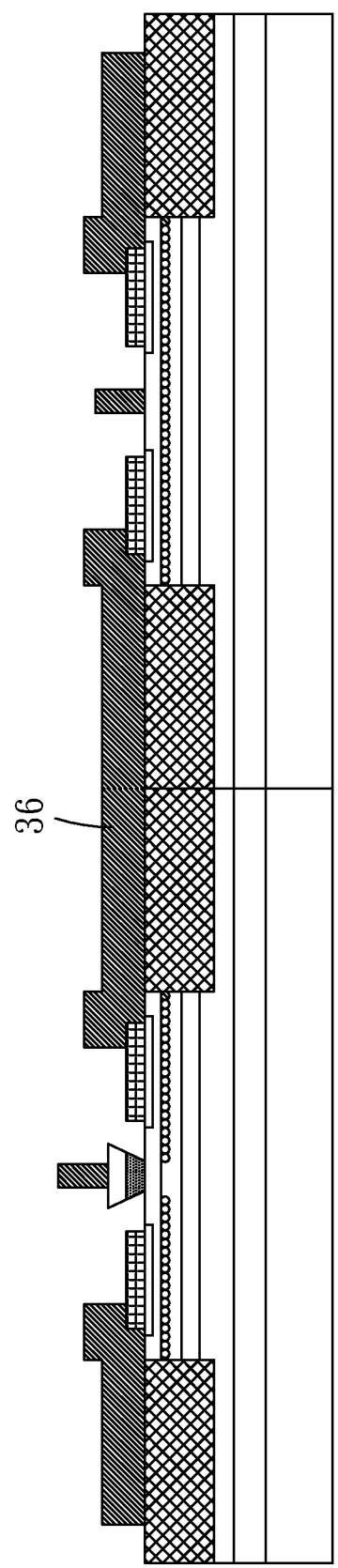
Figures 2, 22F:
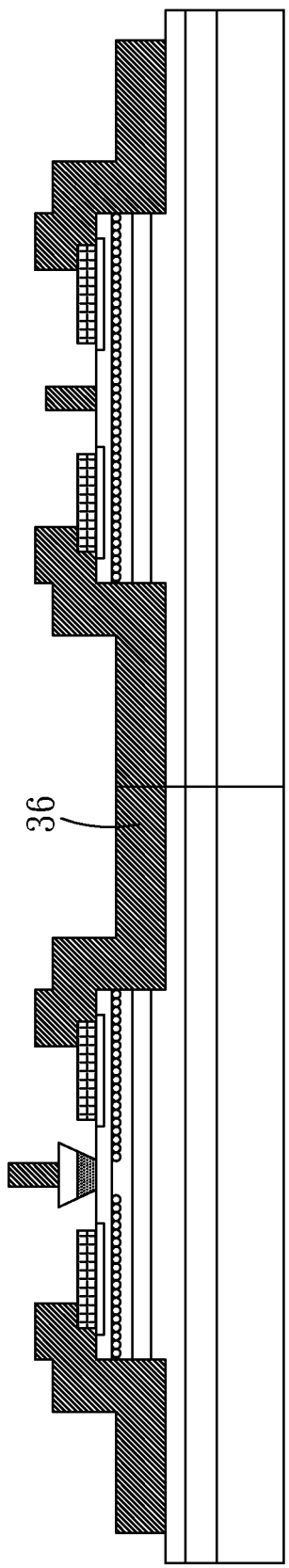

Use the steps S72 and S73 as described above to form a patterned silicon dioxide mask layer 20 having an inverted-trapezoidal-structure opening 24, as shown in FIG. 22B. Then, grow p-GaN in the opening to form an inverted trapezoidal p-GaN gate structure 26. Afterwards, gate electrode is coated using metal coating. Finally, the silicon dioxide mask layer 20 is removed and the metal outside the gate electrode region is lift off, forming the self-aligned gate metal 102 on the p-GaN inverted trapezoidal structure 26 as the first gate metal layer 103, as the structure shown in FIG. 22C.

Then, like the steps S74 to S76, the source and drain electrodes 28, 30, 28', 30' are formed sequentially; device isolation 32, 34 is fabricated; metal vapor deposition and lift-off methods are used to form the metal layer 36, which acts as the D-mode AlGaN/GaN HEMT gate metal and the bonding pad regions for the gate, drain, and source electrodes or as the interconnection metal, as shown in FIGS. 22E-1 to 22F-2.

Figures 1, 22G:
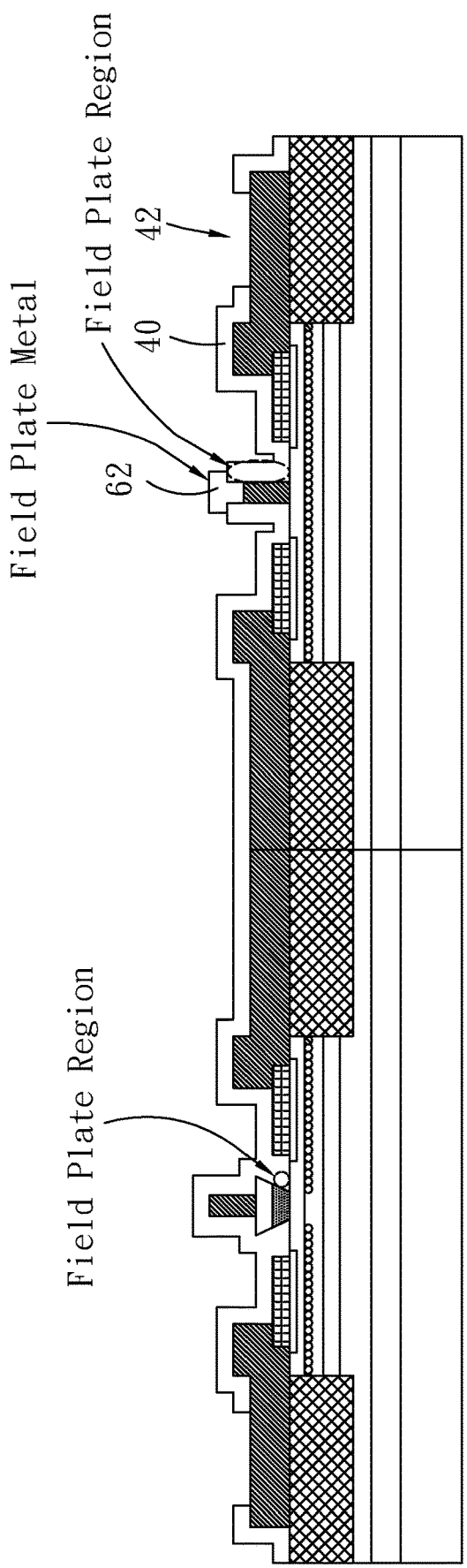
Figures 2, 22G:
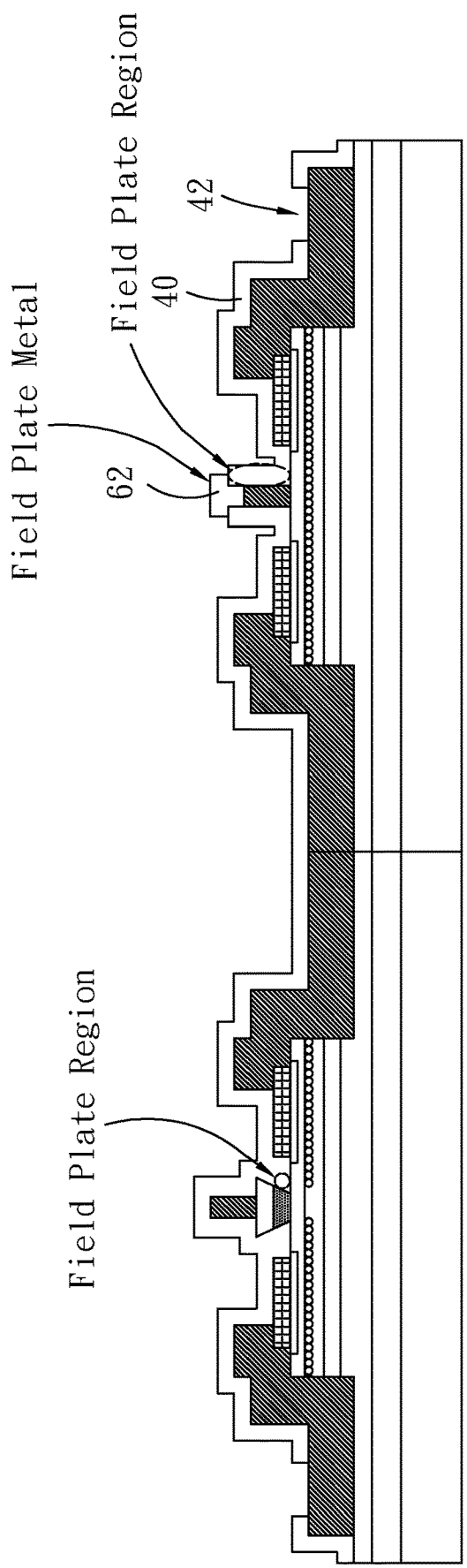
Figures 1, 23A:
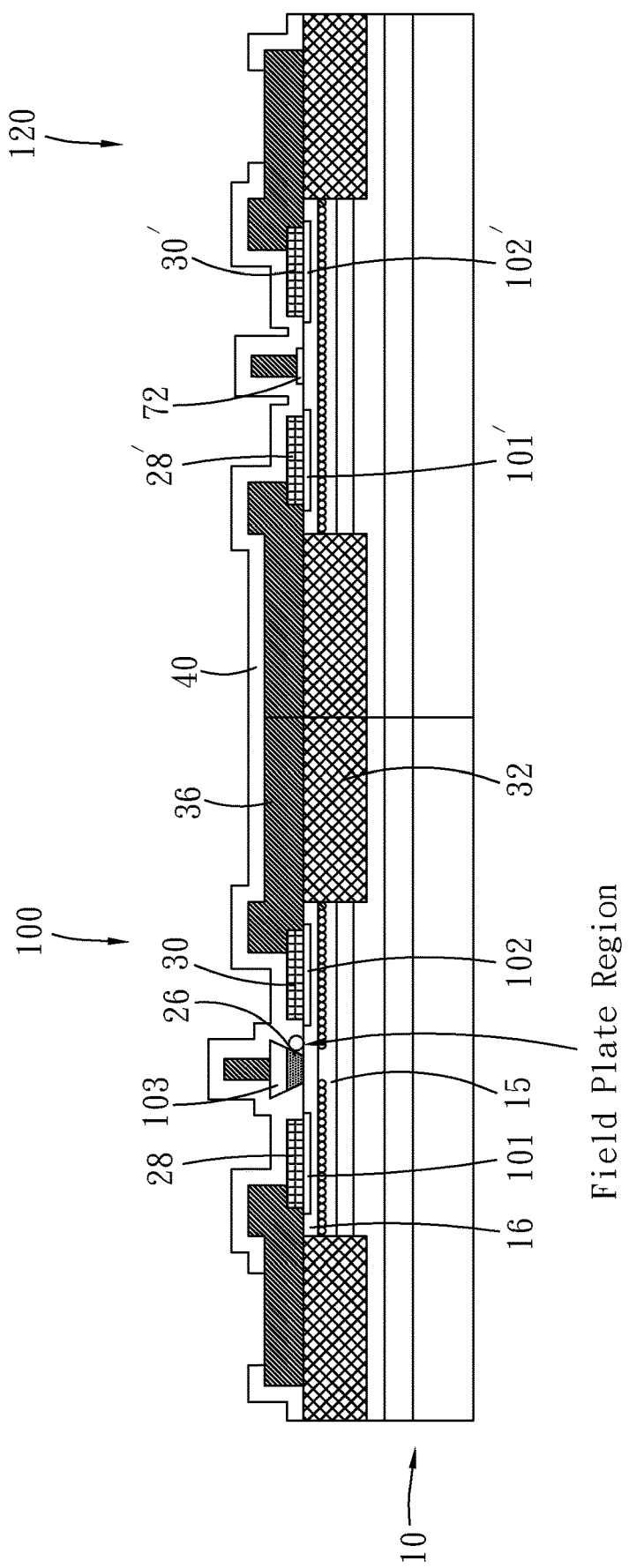
Figures 2, 23A:
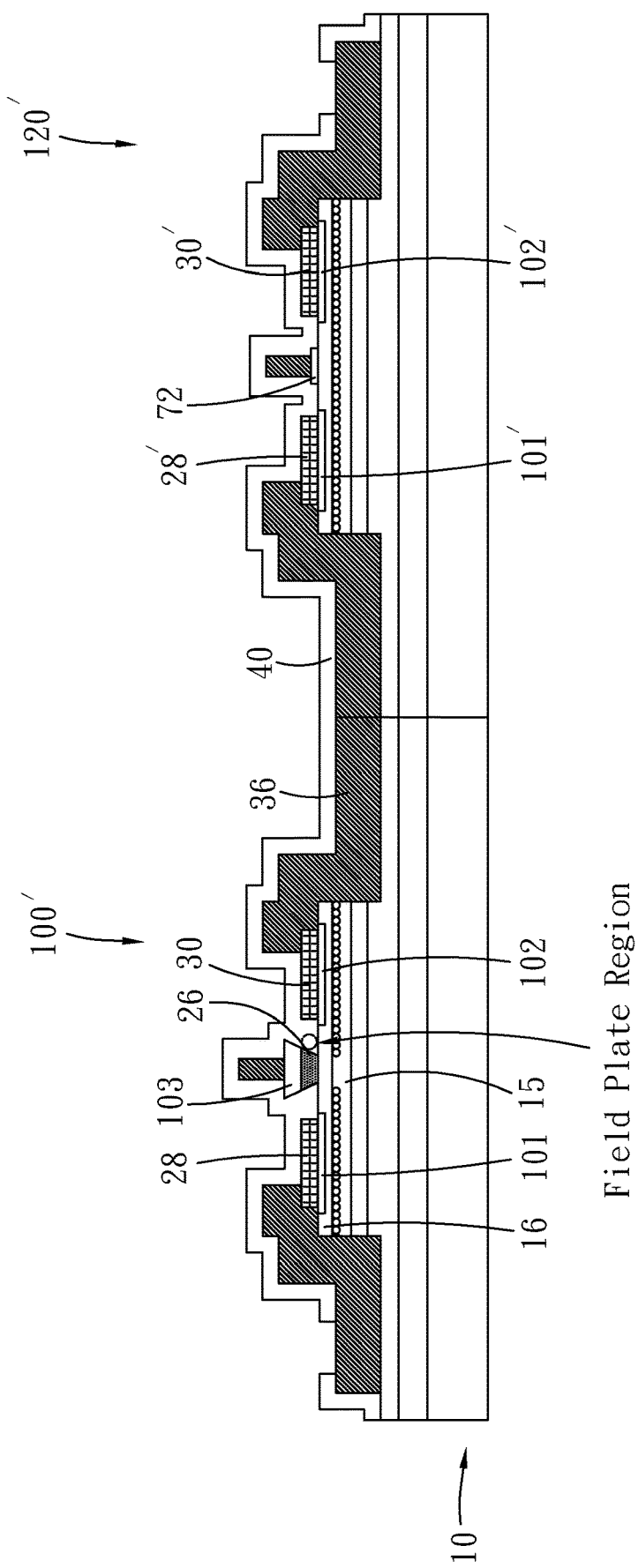
Figure 23B:
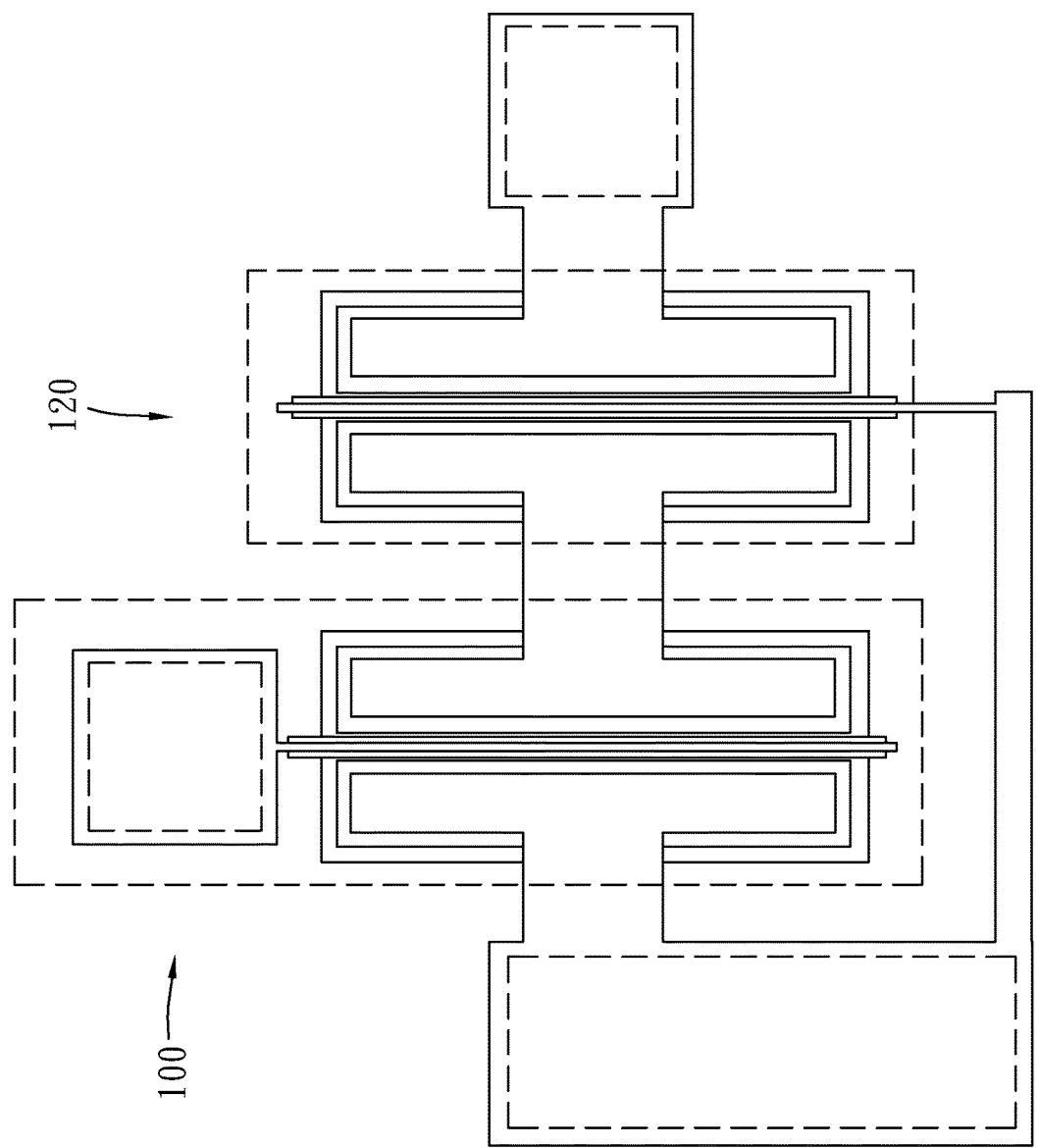
FIG. 23B shows a top view of FIGS. 23A-1 and 23A-2.

Then, as the S77, a patterned passivation layer 40 is grown, as shown in FIG. 22G-1 or FIG. 22G-2. The thickness of this patterned passivation layer 40 is 1000A~2000A. This passivation layer 40 should not be too thick, or stress will be applied to devices and changing the original polarization. Because p-GaN is an inverted trapezoidal structure 26, a sloped capacitor will be formed at the dashed circle. This capacitor will induce the field plate effect having the main function of dispersing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Finally, the metal vapor deposition and metal left-off methods are adopted to form D-mode HEMT field plate metal 62, as the structures shown in FIGS. 21A-1, 21A-2, and 21B.

Embodiment 11: A SEG p-Gan gate and self-aligned gate metal E-mode AlGaN/GaN HEMT connected in series with a D-mode AlGaN/GaN HEMT with gate oxide to form a hybrid E-mode AlGaN/GaN HEMT.

As shown in FIGS. 23A-1, 23A-2, and 23B, the main feature of the hybrid E-mode AlGaN/GaN HEMT according to the present embodiment is the epitaxial structure of AlGaN/GaN, which is divided to a left region and a right region. A SEG p-Gan gate and self-aligned gate metal E-mode AlGaN/GaN HEMT 100 is located in the left region and includes a p-GaN inverted trapezoidal gate structure 26, a first source metal layer 28, a first drain metal layer 30, a first source ion implantation region 101 and a first drain ion implantation region 102, and a self-aligned first gate metal layer 103. The p-GaN inverted trapezoidal gate structure 26, the first source metal layer 28, and the first drain metal layer 30 are located on the i-Al(x)GaN layer 16. In addition, although the 2DEG is formed at the junction i-Al(x)GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer will be depleted. The first source ion implantation region 101 and the first drain ion implantation region 102 are located in the i-Al(x)GaN layer 16. Besides, the first source ion implantation region 101 is located below the first source metal layer 28 while the first drain ion implantation region 102 is located below the first drain metal layer 30. In addition, the self-aligned first gate metal layer 103 is located on the p-GaN inverted trapezoidal gate structure 26.

A D-mode AlGaN/GaN HEMT with gate oxide 110 is disposed in the right region. It includes a second source metal layer 28', a second drain metal layer 30', a gate oxide layer 72, a second source ion implantation region 101', and a second drain ion implantation region 102'. The second source metal layer 28' and the second drain metal layer 30' are located on the i-Al(x)GaN layer 16. The gate oxide layer 72 is located on the i-Al(x)GaN layer 16 and between second source metal layer 28' and the second drain metal layer 30'. The second source ion implantation region 101' is located below the second source metal layer 28' while the second drain ion implantation region 102' is located below the second drain metal layer 30'.

Figures 1, 24A:
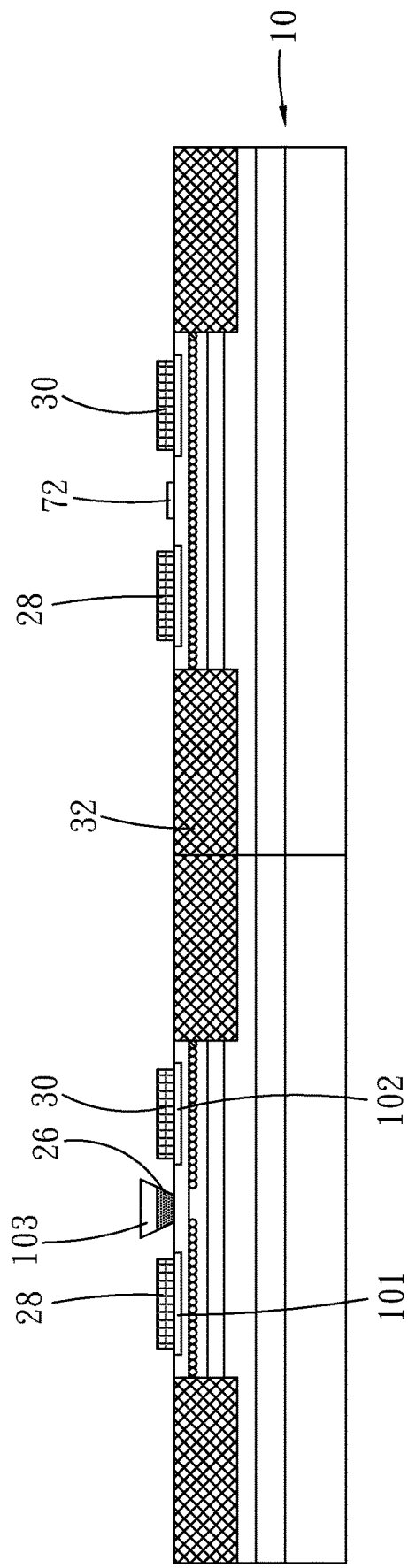
Figures 2, 24A:
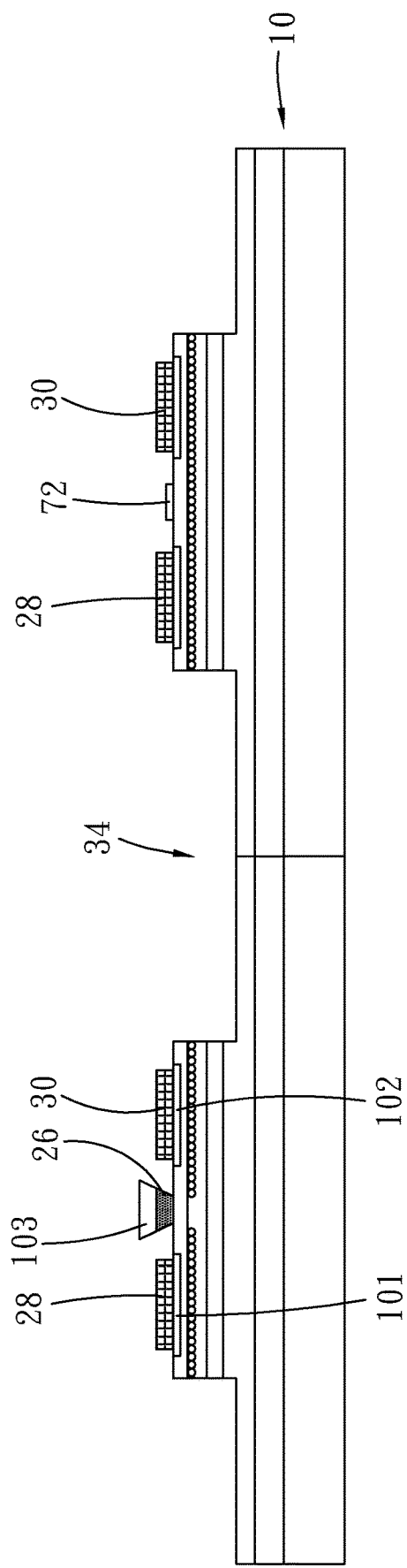
Figures 1, 24B:
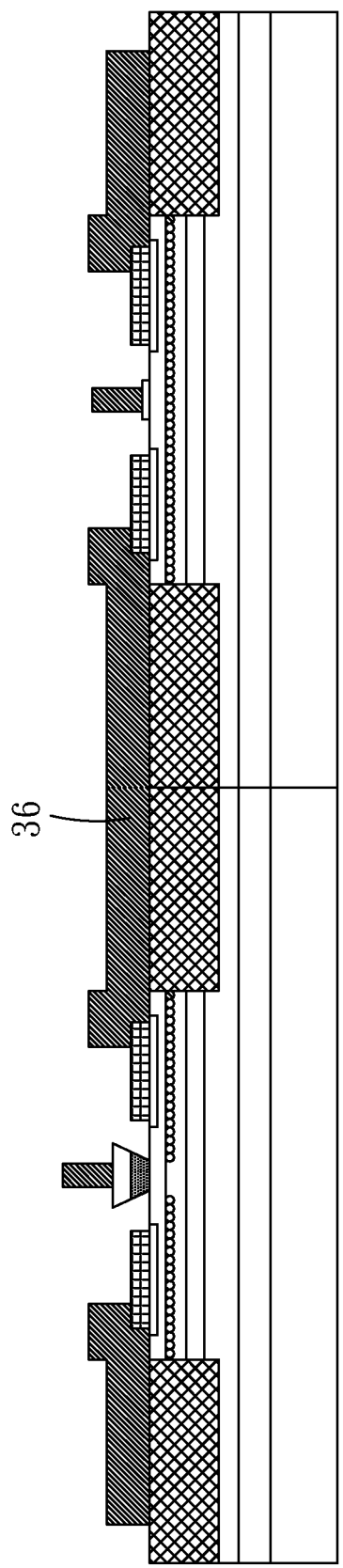
Figures 2, 24B:
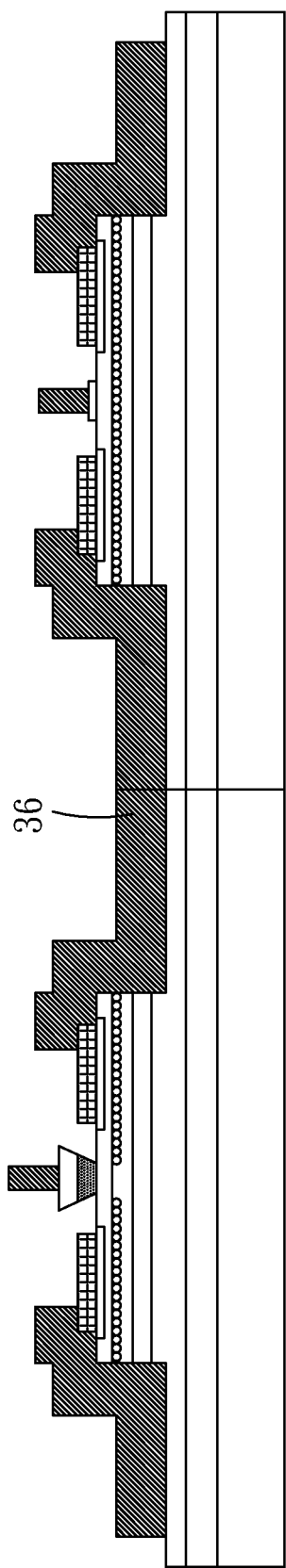
Figures 1, 25A:
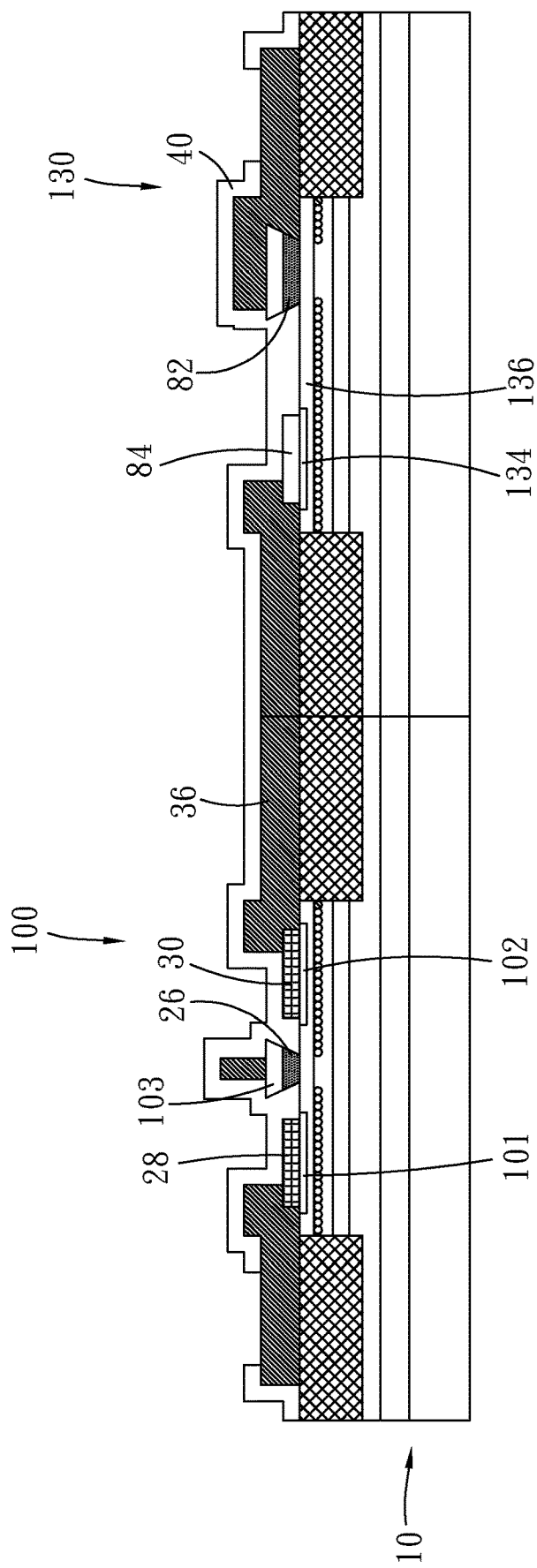
Figures 2, 25A:
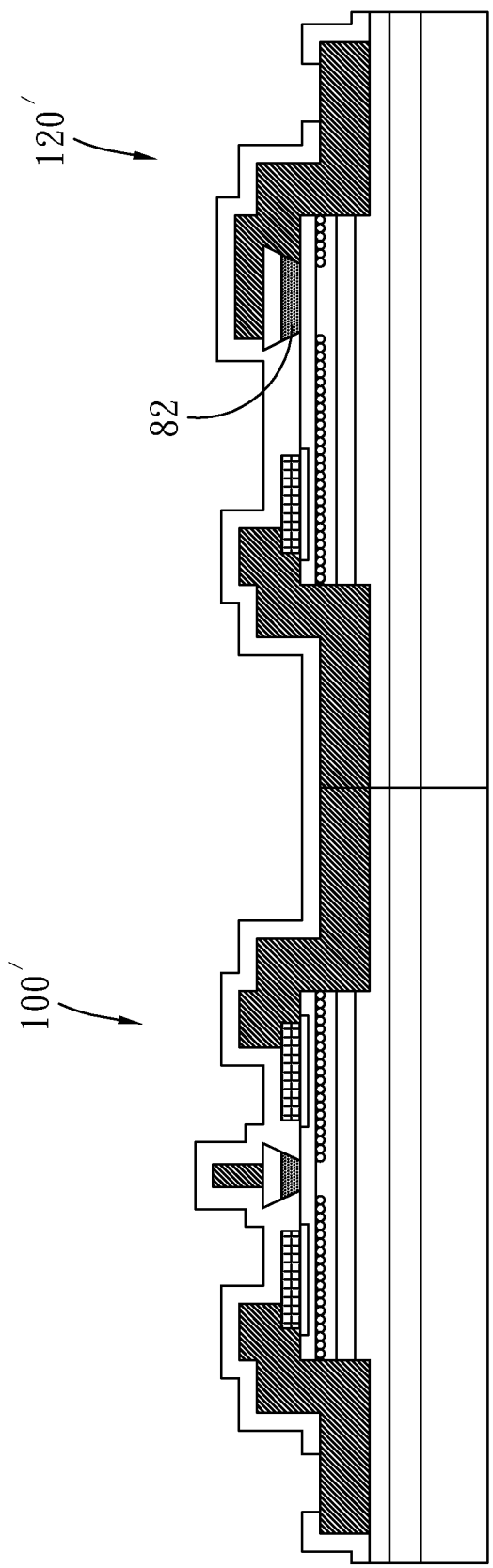
Figure 25B:
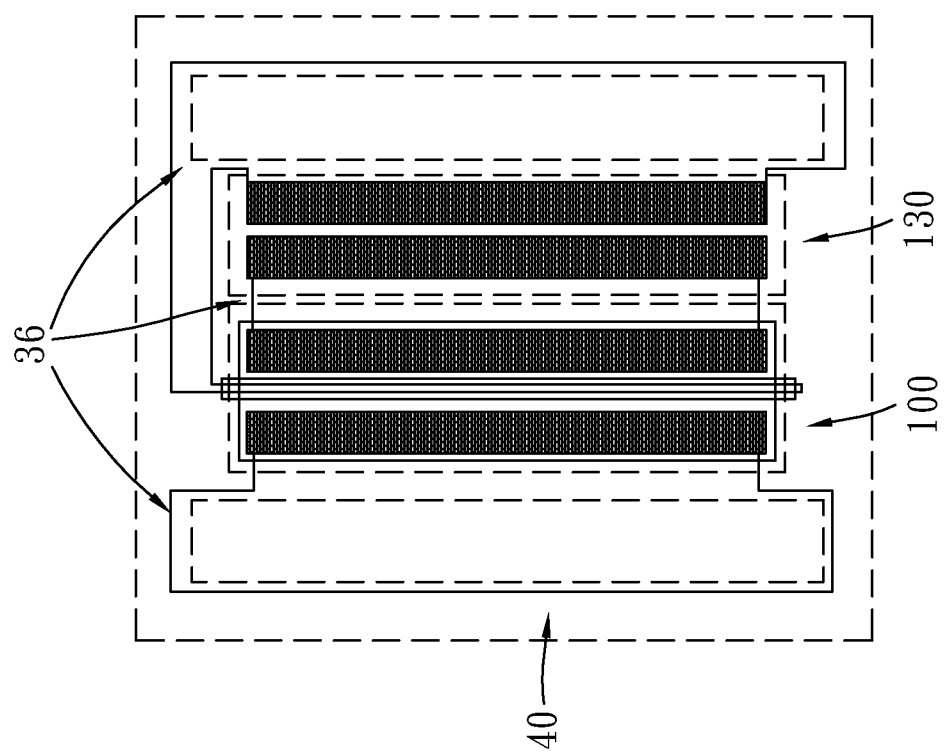
FIG. 25B shows a top view of FIGS. 25A-1 and 25A-2.
Figures 1, 26A:
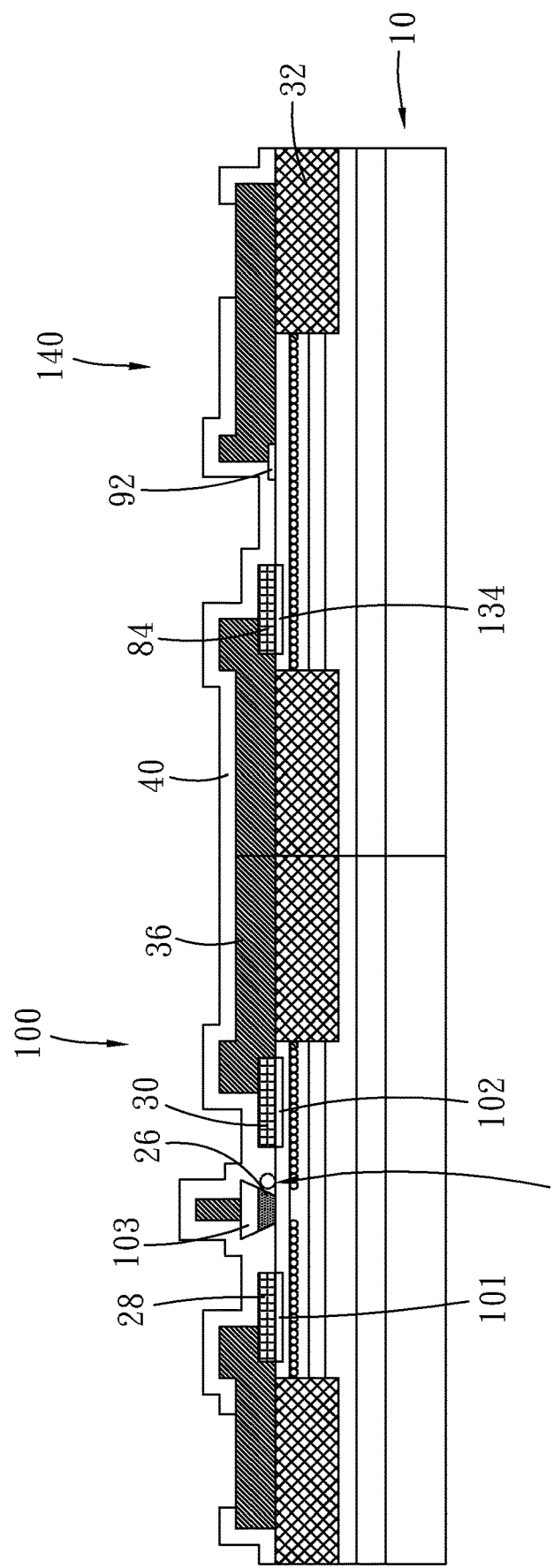
Figures 2, 26A:
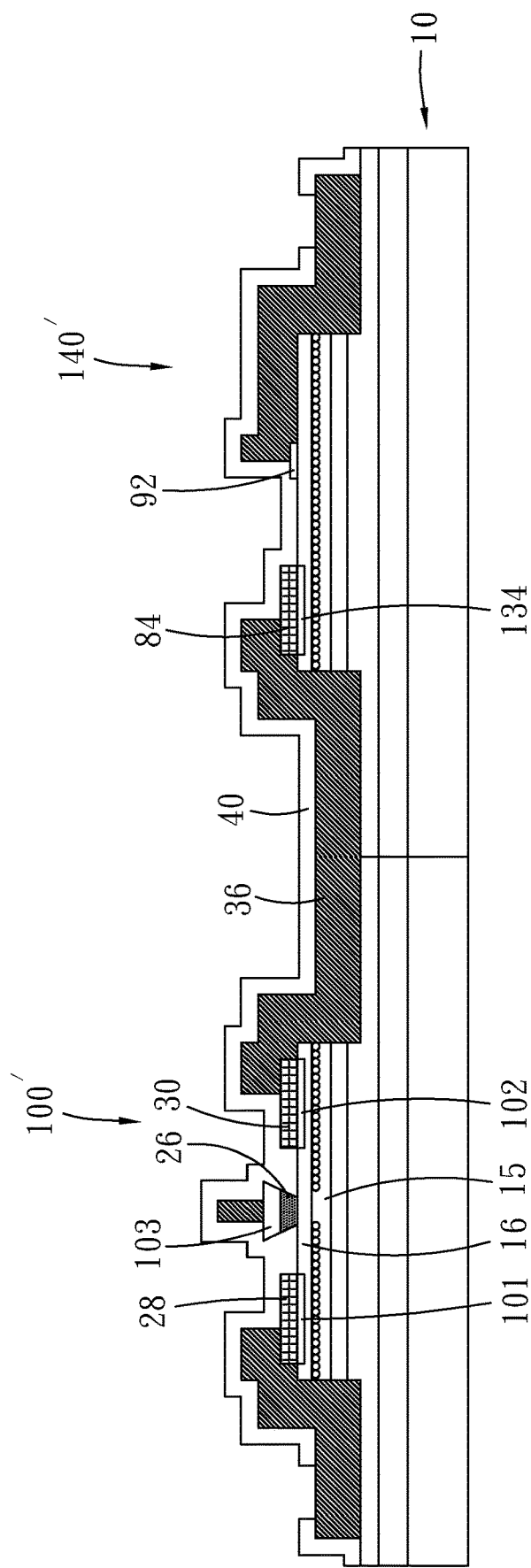
Figure 26B:
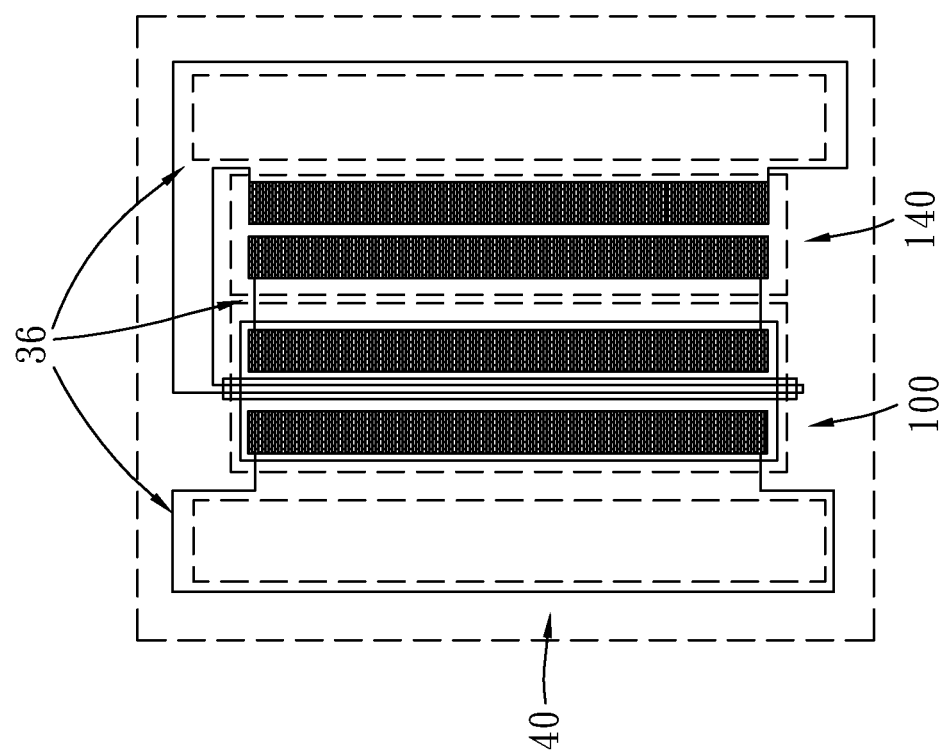
FIG. 26B shows a top view of FIGS. 26A-1 and 26A-2.

The process steps of the present embodiment are roughly identical to those of Embodiment 9. The main difference is the gate oxide layer 72 for the D-mode HEMT in the right region after the step for device isolation, as shown in FIG. 24A-1 or FIG. 24A-2. Afterwards, the metal layer 36 is formed sequentially for the D-mode AlGaN/GaN HEMT gate metal and the gate, drain, and source electrodes bonding pad regions or the interconnection metal, as the structure shown in FIG. 24A-1 and FIG. 24A-2. Next, a patterned passivation layer 40 is formed to cover the above devices and the portions of the metal layer for subsequent bonding and connecting are exposed, as shown in FIGS. 23A-1, 23A-2, and 23B. According to the present embodiment, the thickness of this patterned passivation layer 40 is 1000A~2000A.

Because p-GaN is an inverted trapezoidal structure 26, a sloped capacitor will be formed at the dashed circle. This capacitor will induce the field plate effect having the main function of dispersing the high-density electric field below the gate electrode. In addition to increasing the breakdown voltage Vds between the drain and the source of the HEMT, it also suppresses the electron trapping effect below the gate electrode and hence reducing current collapse during the operation of the HEMT.

Embodiment 11: A SEG p-GaN anode AlGaN/GaN SBD connected in series with a SEG p-GaN gate and self-aligned gate metal E-mode AlGaN/GaN HEMT to form a hybrid SBD.

As shown in FIGS. 25A-1, 25A-2, and 25B, the main feature of the hybrid SBD according to the present embodiment is the epitaxial structure of AlGaN/GaN, which is divided to a left region and a right region. A SEG p-GaN gate and self-aligned gate metal E-mode AlGaN/GaN HEMT 100 is located in the left region and includes a p-GaN inverted trapezoidal gate structure 26, a first source metal layer 28, a first drain metal layer 30, a first source ion implantation region 101 and a first drain ion implantation region 102, and a self-aligned first gate metal layer 103. The p-GaN inverted trapezoidal gate structure 26, the first source metal layer 28, and the first drain metal layer 30 are located on the i-Al(x)GaN layer 16. In addition, although the 2DEG is formed at the junction i-Al(x)GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer will be depleted. The first source ion implantation region 101 and the first drain ion implantation region 102 are located in the i-Al(x)GaN layer 16. Besides, the first source ion implantation region 101 is located below the first source metal layer 28 while the first drain ion implantation region 102 is located below the first drain metal layer 30. In addition, the self-aligned first gate metal layer 103 is located on the p-GaN inverted trapezoidal gate structure 26.

A SEG p-GaN anode AlGaN/GaN SBD 130 is formed in the right region. It includes a first cathode metal layer 84, a p-GaN inverted trapezoidal anode structure 82, and a first cathode ion implantation region 134. The first cathode metal layer 84 and the p-GaN inverted trapezoidal anode structure 82 are located on the i-Al(x)GaN layer 16. Although the 2DEG is formed at the junction i-Al(x)GaN/i-GaN of the i-GaN channel layer, due to the existence of the p-GaN inverted trapezoidal anode structure 82, the 2DEG below the p-GaN inverted trapezoidal anode structure 82 in the i-GaN channel layer will be depleted. Besides, the first cathode ion implantation region 134 is located in the i-Al(x)GaN layer 16 and below the first cathode metal layer 84.

According to the process steps of the present embodiment, first, the left region of the epitaxial structure is set to fabricate the SEG p-GaN gate and self-aligned gate metal E-mode AlGaN/GaN HEMT while the right region is set to fabricate the SEG p-GaN anode AlGaN/GaN SBD.

A source ion implantation region 101 and a drain ion implantation region 102 are formed in the left region and the cathode ion implantation region 134 is formed in the right region concurrently. These ion implantation regions are also activated. A patterned mask layer is formed on the epitaxial structure. An inverted-trapezoidal-gate opening is located on the left region of the epitaxial structure; an inverted-trapezoidal-anode opening is located on the right region of the epitaxial structure. Then p-GaN is grown in the inverted-trapezoidal-gate opening and the inverted-trapezoidal-anode opening for forming a p-GaN inverted trapezoidal gate structure 26 in the left region and a p-GaN inverted anode structure 82 in the right region. By using self-alignment, form a self-aligned gate metal 103 on the p-GaN inverted trapezoidal gate structure 26. Afterwards, the patterned mask layer is removed.

Then, the source and drain electrodes 28, 30 and the cathode metal layer 84 are formed sequentially; device isolation is fabricated; metal vapor deposition (normally Ni/Au) and lift-off methods are used to form the metal layer 36, which acts as the bonding pad regions for the gate, drain, and source electrodes and cathode or as the interconnection metal. Finally, a patterned passivation layer 40 is covered and only the metal region for electrical connection is exposed.

Embodiment 12: An AlGaN/GaN SBD with field-plate anode connected in series with a SEG p-GaN gate and self-aligned gate metal E-mode AlGaN/GaN HEMT to form a hybrid SBD.

As shown in FIGS. 25A-1, 25A-2, and 25B, the main feature of the hybrid SBD according to the present embodiment is the epitaxial structure of AlGaN/GaN, which is divided to a left region and a right region. An E-mode AlGaN/GaN HEMT 100 is located in the left region and includes a p-GaN inverted trapezoidal gate structure 26, a first source metal layer 28, a first drain metal layer 30, a first source ion implantation region 101 and a first drain ion implantation region 102, and a self-aligned first gate metal layer 103. The p-GaN inverted trapezoidal gate structure 26, the first source metal layer 28, and the first drain metal layer 30 are located on the i-Al(x)GaN layer 16. In addition, although the 2DEG is formed at the junction i-Al(x)GaN/i-GaN of the i-GaN channel layer 15, due to the existence of the p-GaN inverted trapezoidal gate structure 26, the 2DEG below the p-GaN inverted trapezoidal gate structure 26 in the i-GaN channel layer will be depleted. The first source ion implantation region 101 and the first drain ion implantation region 102 are located in the i-Al(x)GaN layer 16. Besides, the first source ion implantation region 101 is located below the first source metal layer 28 while the first drain ion implantation region 102 is located below the first drain metal layer 30. In addition, the self-aligned first gate metal layer 103 is located on the p-GaN inverted trapezoidal gate structure 26.

A field-plate anode AlGaN/GaN SBD 130 is formed in the right region. It includes a first cathode metal layer 84, a field-plate anode oxide layer 92, and a first cathode ion implantation region 134. The first cathode metal layer 84 and the field-plate anode oxide layer 92 are located on the i-Al(x)GaN layer 16. Besides, the first cathode ion implantation region 134 is located in the i-Al(x)GaN layer 16 and below the first cathode metal layer 84.

According to the process steps of the present embodiment, first, the left region of the epitaxial structure is set to fabricate the SEG p-GaN gate and self-aligned gate metal E-mode AlGaN/GaN HEMT while the right region is set to fabricate the AlGaN/GaN SBD with field-plate anode.

A source ion implantation region 101 and a drain ion implantation region 102 are formed in the left region and the cathode ion implantation region 134 is formed in the right region concurrently. These ion implantation regions are also activated. Then, form a p-GaN inverted trapezoidal gate structure 26 in the left region. By using self-alignment, form a self-aligned gate metal layer as the first gate metal layer 103 on the p-GaN inverted trapezoidal gate structure 26.

Next, the source and drain electrodes 28, 30 and the cathode metal layer 84 are formed sequentially. Device isolation is also fabricated subsequently.

After device isolation, the field-plate oxide layer 92 is formed in the right region. Afterwards, metal vapor deposition (normally Ni/Au) and lift-off methods are used to form the metal layer 36, which acts as the bonding pad regions for the gate, drain, and source electrodes and cathode or as the interconnection metal. Finally, a patterned passivation layer 40 is covered and only the metal region for electrical connection is exposed. According to the present embodiment, the thickness of the patterned passivation layer 40 is 1000A~2000A.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A SEG p-GaN gate enhancement-mode AlGaN/GaN high electron mobility transistor, comprising:
   an epitaxial structure of AlGaN/GaN, comprising:
   a substrate;
   a buffer layer (C-doped) formed on said substrate in a direct contact therewith;
   an i-GaN (C-doped) layer located on said buffer layer (C-doped);
   an intrinsic i-Al(y)GaN buffer layer located on said i-GaN (C-doped) layer;
   an intrinsic i-GaN channel layer located on said intrinsic i-Al(y)GaN buffer layer; and
   an intrinsic i-Al(x)GaN layer located on said intrinsic i-GaN channel layer; and
   a gate configured with an inverted trapezoidal gate structure formed from p-GaN and located above a top surface of said intrinsic i-Al(x)GaN layer;
   where x=0.1 ~0.3; y=0.05 ~0.75; wherein the two-dimensional electron gas below said p-GaN inverted trapezoidal gate structure is depleted.

2. A SEG p-GaN anode AlGaN/GaN Schottky barrier diode, comprising:
   an epitaxial structure of AlGaN/GaN, comprising:
   a substrate;
   a buffer layer (C-doped) formed on said substrate in a direct contact therewith;
   an i-GaN (C-doped) layer located on said buffer layer (C-doped);
   an intrinsic i-Al(y)GaN buffer layer located on said i-GaN (C-doped) layer;
   an intrinsic i-GaN channel layer located on said intrinsic i-Al(y)GaN buffer layer; and
   an intrinsic i-Al(x)GaN layer located on said intrinsic i-GaN channel layer; and
   a p-GaN inverted trapezoidal anode structure located above a top surface of said intrinsic i-Al(x)GaN layer;

where x=0.1~0.3; y=0.05~0.75; wherein the two-dimensional electron gas below said p-GaN inverted trapezoidal anode structure is depleted.

3. A hybrid enhancement-mode AlGaN/GaN high electron mobility transistor, comprising:
an epitaxial structure of AlGaN/GaN, and divided into a left region and a right region, said epitaxial structure of AlGaN/GaN comprising:
a substrate;
a buffer layer (C-doped) formed on said substrate in a direct contact therewith;
an i-GaN (C-doped) layer located on said buffer layer (C-doped);
an intrinsic i-Al(y)GaN buffer layer located on said i-GaN (C-doped) layer;
an intrinsic i-GaN channel layer located on said intrinsic i-Al(y)GaN buffer layer; and
an intrinsic i-Al(x)GaN layer located on said intrinsic i-GaN channel layer;
a SEG p-GaN enhancement-mode AlGaN/GaN high electron mobility transistor, located in said left region, and comprising a p-GaN inverted trapezoidal gate structure formed above a top surface of said intrinsic i-Al(x)GaN layer, wherein the two-dimensional electron gas below said p-GaN inverted trapezoidal gate structure is depleted; and
a depletion-mode AlGaN/GaN high electron mobility transistor without gate oxide located in said right region;
where x=0.1~0.3; y=0.05~0.75.

4. A hybrid enhancement-mode AlGaN/GaN high electron mobility transistor, comprising:
an epitaxial structure of AlGaN/GaN, and divided into a left region and a right region, said epitaxial structure of AlGaN/GaN comprising:
a substrate;
a buffer layer (C-doped) located on said substrate in a direct contact therewith;
an i-GaN (C-doped) layer located on said buffer layer (C-doped);
an intrinsic i-Al(y)GaN buffer layer, located on said i-GaN (C-doped) layer;
an intrinsic i-GaN channel layer located on said intrinsic i-Al(y)GaN buffer layer; and
an intrinsic i-Al(x)GaN layer located on said intrinsic i-GaN channel layer;
a SEG p-GaN enhancement-mode AlGaN/GaN high electron mobility transistor, located in said left region and comprising a p-GaN inverted trapezoidal gate structure formed above the top surface of said intrinsic i-Al(x)GaN layer, wherein the two-dimensional electron gas below said p-GaN inverted trapezoidal gate structure is depleted; and
a depletion-mode AlGaN/GaN high electron mobility transistor with gate oxide located in said right region
where x=0.1~0.3; y=0.05~0.75.

5. A hybrid Schottky barrier diode, comprising:
an epitaxial structure of AlGaN/GaN, divided into a left region and a right region, said epitaxial structure of AlGaN/GaN comprising:
a substrate;
a buffer layer (C-doped) located on said substrate in a direct contact therewith;
an i-GaN (C-doped) layer located on said buffer layer (C-doped);
an intrinsic i-Al(y)GaN buffer layer located on said intrinsic i-GaN (C-doped) layer;

an intrinsic i-GaN channel layer located on said intrinsic i-Al(y)GaN buffer layer; and
an intrinsic i-Al(x)GaN layer located on said intrinsic i-GaN channel layer;
a SEG p-GaN enhancement-mode AlGaN/GaN high electron mobility transistor located in said left region and comprising a p-GaN inverted trapezoidal gate structure formed above a top surface of said intrinsic i-Al(x)GaN layer, wherein the two-dimensional electron gas below said p-GaN inverted trapezoidal gate structure is depleted; and
a SEG p-GaN anode AlGaN/GaN Schottky barrier diode located in said right region and comprising a p-GaN inverted trapezoidal anode structure formed above a top surface of said i-Al(x)GaN layer, wherein the two-dimensional electron gas below said p-GaN inverted trapezoidal anode structure being depleted;
where x=0.1~0.3; y=0.05~0.75.

6. A hybrid Schottky barrier diode using said epitaxial structure of claim 1, comprising:
an epitaxial structure of AlGaN/GaN, divided into a left region and a right region, said epitaxial structure of AlGaN/GaN comprising:
a substrate;
a buffer layer (C-doped), located on said substrate in a direct contact therewith;
an i-GaN (C-doped) layer located on said buffer layer (C-doped);
an intrinsic i-Al(y)GaN buffer layer located on said i-GaN (C-doped) layer;
an intrinsic i-GaN channel layer located on said intrinsic i-Al(y)GaN buffer layer; and
an intrinsic i-Al(x)GaN layer located on said intrinsic i-GaN channel layer;
a SEG p-GaN enhancement-mode AlGaN/GaN high electron mobility transistor, located in said left region and comprising a p-GaN inverted trapezoidal gate structure configured above a top surface of said intrinsic i-Al(x)GaN layer, wherein the two-dimensional electron gas below said p-GaN inverted trapezoidal gate structure being depleted; and
a Schottky barrier diode located in said right region and comprising a field-plate oxide layer;
where x=0.1~0.3; y=0.05~0.75.

7. An enhancement-mode AlGaN/GaN high electron mobility transistor, comprising:
an epitaxial structure of AlGaN/GaN, comprising:
a substrate;
a buffer layer (C-doped) located on said substrate in a direct contact therewith;
an i-GaN (C-doped) layer located on said buffer layer (C-doped);
an intrinsic i-Al(y)GaN buffer layer located on said intrinsic i-GaN (C-doped) layer;
an intrinsic i-GaN channel layer located on said intrinsic i-Al(y)GaN buffer layer; and
an intrinsic i-Al(x)GaN layer located on said intrinsic i-GaN channel layer;
a p-GaN inverted trapezoidal gate structure, a first source metal layer, and a first drain metal layer located above a top surface of said intrinsic i-Al(x)GaN layer, wherein the two-dimensional electron gas below said p-GaN inverted trapezoidal gate structure being depleted;
a first source ion implantation region and a first drain ion implantation region, located in said intrinsic i-Al(x)GaN layer, said first source ion implantation region being located below said first source metal layer, and said first drain ion implantation region being located below said first drain metal layer; and a first gate metal layer located on said p-GaN inverted trapezoidal gate structure;

where x=0.1~0.3; y=0.05~0.75.

8. An AlGaN/GaN Schottky barrier diode, comprising:
an epitaxial structure of AlGaN/GaN, comprising:
a substrate;
a buffer layer (C-doped) located on said substrate in a direct contact therewith;
an i-GaN (C-doped) layer located on said buffer layer (C-doped);
an intrinsic i-Al(y)GaN buffer layer located on said i-GaN (C-doped) layer;
an intrinsic i-GaN channel layer located on said intrinsic i-Al(y)GaN buffer layer; and
an intrinsic i-Al(x)GaN layer located on said intrinsic i-GaN channel layer;
a p-GaN inverted trapezoidal gate structure, a first cathode metal layer, and a second cathode metal layer, located above a top surface of said intrinsic i-Al(x)GaN layer, and locating the two-dimensional electron gas to the junction of said intrinsic i-Al(x)GaN/i-GaN and depleting the region below said p-GaN inverted trapezoidal gate structure being depleted;
a first cathode ion implantation region and a second cathode ion implantation region, located in said intrinsic i-Al(x)GaN layer, said first cathode ion implantation region located below said first cathode metal layer, and said second cathode ion implantation region located below said second cathode metal layer; and
a first anode metal layer, located on said p-GaN inverted trapezoidal gate structure;

where x=0.1~0.3; y=0.05~0.75.

9. A hybrid enhancement-mode AlGaN/GaN high electron mobility transistor using, comprising:
an epitaxial structure of AlGaN/GaN, divided into a left region and a right region, said epitaxial structure of AlGaN/GaN comprising:
a substrate;
a buffer layer (C-doped) located on said substrate in a direct contact therewith;
an i-GaN (C-doped) layer located on said buffer layer (C-doped);
an intrinsic i-Al(y)GaN buffer layer located on said i-GaN (C-doped) layer;
an intrinsic i-GaN channel layer located on said intrinsic i-Al(y)GaN buffer layer; and
an intrinsic i-Al(x) GaN layer located on said intrinsic i-GaN channel layer;
a SEG p-GaN gate and self-aligned gate metal enhancement-mode AlGaN/GaN high electron mobility transistor located in said left region, comprising:
a p-GaN inverted trapezoidal gate structure, a first source metal layer, and a first drain metal layer, located above a top surface of said intrinsic i-Al(x)GaN layer, the two-dimensional electron gas below said p-GaN inverted trapezoidal gate structure being depleted;
a first source ion implantation region and a first drain ion implantation region located in said intrinsic i-Al(x) GaN layer, said first source ion implantation region being located below said first source metal layer, and said first drain ion implantation region being located below said first drain metal layer; and
a first gate metal layer, located on said p-GaN inverted trapezoidal gate structure; and a depletion-mode AlGaN/GaN high electron mobility transistor without gate oxide, located in said right region, comprising:
a second source metal layer and a second drain metal layer, located on said intrinsic i-Al(x)GaN layer; and
a second source ion implantation region and a second drain ion implantation region, located in said intrinsic i-Al(x)GaN layer, said second source ion implantation region being located below said second source metal layer, and said second drain ion implantation region being located below said second drain metal layer;

where x=0.1~0.3; y=0.05~0.75.

10. A hybrid enhancement-mode AlGaN/GaN high electron mobility transistor, comprising:
an epitaxial structure of AlGaN/GaN, divided into a left region and a right region, said epitaxial structure of AlGaN/GaN comprising:
a substrate;
a buffer layer (C-doped) located on said substrate in a direct contact therewith;
an i-GaN (C-doped) layer located on said buffer layer (C-doped);
an intrinsic i-Al(y)GaN buffer layer located on said i-GaN (C-doped) layer;
an intrinsic i-GaN channel layer located on said intrinsic i-Al(y)GaN buffer layer; and
an intrinsic i-Al(x) GaN layer located on said intrinsic i-GaN channel layer;
a SEG p-GaN gate and self-aligned gate metal enhancement-mode AlGaN/GaN high electron mobility transistor, located in said left region, comprising:
a p-GaN inverted trapezoidal gate structure, a first source metal layer, and a first drain metal layer, located above a top surface of said intrinsic i-Al(x)GaN layer, and the two-dimensional electron gas below said p-GaN inverted trapezoidal gate structure being depleted;
a first source ion implantation region and a first drain ion implantation region, located in said intrinsic i-Al(x) GaN layer, said first source ion implantation region located below said first source metal layer, and said first drain ion implantation region located below said first drain metal layer; and
a first gate metal layer, located on said p-GaN inverted trapezoidal gate structure; and
a depletion-mode AlGaN/GaN high electron mobility transistor with gate oxide, located in said right region, comprising:
a second source metal layer and a second drain metal layer, located on said intrinsic i-Al(x)GaN layer;
a gate oxide layer, located on said i-Al(x)GaN layer and between said second source metal layer and said second drain metal layer; and
a second source ion implantation region and a second drain ion implantation region, located in said intrinsic i-Al(x)GaN layer, said second source ion implantation region being located below said second source metal layer, and said second drain ion implantation region being located below said second drain metal layer;

where x=0.1~0.3; y=0.05~0.75.

11. A hybrid Schottky barrier diode, comprising:
an epitaxial structure of AlGaN/GaN, divided into a left region and a right region, said epitaxial structure of AlGaN/GaN comprising:
a substrate;
a buffer layer (C-doped) located on said substrate in a direct contact therewith;

an i-GaN (C-doped) layer located on said buffer layer (C-doped);

an intrinsic i-Al(y)GaN buffer layer, located on said i-GaN (C-doped) layer;

an intrinsic i-GaN channel layer located on said intrinsic i-Al(y)GaN buffer layer; and an intrinsic i-Al(x) GaN layer located on said intrinsic i-GaN channel layer;

a SEG p-GaN gate and self-aligned gate metal enhancement-mode AlGaN/GaN high electron mobility transistor located in said left region, comprising:

a p-GaN inverted trapezoidal gate structure, a first source metal layer, and a first drain metal layer, located above a top surface of said intrinsic i-Al(x)GaN layer, the two-dimensional electron gas below said p-GaN inverted trapezoidal gate structure being depleted;

a first source ion implantation region and a first drain ion implantation region located in said intrinsic i-Al(x) GaN layer, said first source ion implantation region being located below said first source metal layer, and said first drain ion implantation region being located below said first drain metal layer; and a first gate metal layer located on said p-GaN inverted trapezoidal gate structure; and a SEG p-GaN anode AlGaN/GaN Schottky barrier diode, located in said right region, comprising:

a first cathode metal layer and a p-GaN inverted trapezoidal anode structure, located on said intrinsic i-Al(x) GaN layer, and said p-GaN inverted trapezoidal anode structure enabling the two-dimensional electron gas below said p-GaN inverted trapezoidal gate structure being depleted; and a first cathode ion implantation region, located in said intrinsic i-Al(x)GaN layer and below said first cathode metal layer;

where x=0.1~0.3; y=0.05~0.75.

12. A hybrid Schottky barrier diode, comprising:

an epitaxial structure of AlGaN/GaN, divided into a left region and a right region, said epitaxial structure of AlGaN/GaN comprising:

a substrate;

a buffer layer (C-doped) located on said substrate in a direct contact therewith;

an i-GaN (C-doped) layer located on said buffer layer (C-doped);

an intrinsic i-Al(y)GaN buffer layer located on said i-GaN (C-doped) layer;

an intrinsic i-GaN channel layer located on said intrinsic i-Al(y)GaN buffer layer; and an intrinsic i-Al(x) GaN layer located on said intrinsic i-GaN channel layer;

a SEG p-GaN gate and self-aligned gate metal enhancement-mode AlGaN/GaN high electron mobility transistor, located in said left region, comprising:

a p-GaN inverted trapezoidal gate structure, a first source metal layer, and a first drain metal layer, located above a top surface of said intrinsic i-Al(x)GaN layer, the two-dimensional electron gas below said p-GaN inverted trapezoidal gate structure being depleted;

a first source ion implantation region and a first drain ion implantation region, located in said intrinsic i-Al(x) GaN layer, said first source ion implantation region being located below said first source metal layer, and said first drain ion implantation region being located below said first drain metal layer; and a first gate metal layer located on said p-GaN inverted trapezoidal gate structure; and an AlGaN/GaN Schottky barrier diode, located in said right region, comprising:

a first cathode metal layer and a field-plate anode oxide layer, located on said i-Al(x)GaN layer; and a first cathode ion implantation region, located in said intrinsic i-Al(x)GaN layer and below said first cathode metal layer;

where x=0.1~0.3; y=0.05~0.75.

* * * * *